(12) United States Patent
Shen et al.

(10) Patent No.: US 7,216,283 B2
(45) Date of Patent: May 8, 2007

(54) ITERATIVE METRIC UPDATING WHEN DECODING LDPC (LOW DENSITY PARITY CHECK) CODED SIGNALS AND LDPC CODED MODULATION SIGNALS

(75) Inventors: Ba-Zhong Shen, Irvine, CA (US); Hau Thien Tran, Irvine, CA (US); Kelly Brian Cameron, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 529 days.

(21) Appl. No.: 10/669,177

(22) Filed: Sep. 23, 2003

(65) Prior Publication Data

US 2004/0255229 A1 Dec. 16, 2004

Related U.S. Application Data

(60) Provisional application No. 60/478,690, filed on Jun. 13, 2003.

(51) Int. Cl.
*H03M 13/11* (2006.01)
*H03M 13/39* (2006.01)

(52) U.S. Cl. .................. 714/752; 714/791; 714/794

(58) Field of Classification Search ............... 714/752, 714/791, 794; H03M 13/11, 13/13, 13/39
See application file for complete search history.

(56) References Cited

U.S. PATENT DOCUMENTS

| | | | |
|---|---|---|---|
| 3,542,756 | A | 11/1970 | Gallager |
| 3,665,396 | A | 5/1972 | Forney, Jr. |
| 4,295,218 | A | 10/1981 | Tanner |
| 6,430,233 | B1 | 8/2002 | Dillon et al. |
| 6,473,010 | B1 | 10/2002 | Vityaev et al. |
| 6,567,465 | B2 | 5/2003 | Goldstein et al. |
| 6,633,856 | B2 | 10/2003 | Richardson et al. |
| 2003/0104788 | A1 | 6/2003 | Kim |
| 2004/0086059 | A1* | 5/2004 | Eroz et al. .................. 375/298 |
| 2005/0246606 | A1* | 11/2005 | Cameron et al. ........... 714/752 |

OTHER PUBLICATIONS

Wheatly, Moe, WinPSK Technical Reference Manual; pp. 1-47; URL: http://www.ise.canberra.edu.au/un5354/modern/winpsktech10.pdf.*
R. Gallager, Low-Density Parity-Check Codes, Cambridge, MA: MIT Press, 1963.
M. Luby, M. Mitzenmacher, A. Shokrollahi, D. Spielman, and V. Stemann, "Practical loss-resilient codes," 1997.
T. J. Richardson and R. L. Urbanke, "The capacity of low-density parity-check code under message-passing decoding," IEEE Trans. Inform. Theory, vol. 47, pp. 599-618, Feb. 2001.
E. Eleftheriou and S. Olcer, "Low-Density Parity-Check Codes for Digital Subscriber Lines," 0-7803-7400-2/02, IEEE, 2002, pp. 1752-1757.

* cited by examiner

*Primary Examiner*—R. Stephen Dildine
(74) *Attorney, Agent, or Firm*—Garlick Harrison & Markison; Shayne X. Short

(57) ABSTRACT

Iterative metric updating when decoding LDPC (Low Density Parity Check) coded signals and LDPC coded modulation signals. A novel approach is presented for updating the bit metrics employed when performing iterative decoding of LDPC coded signals. This bit metric updating is also applicable to decoding of signals that have been generated using combined LDPC coding and modulation encoding to generate LDPC coded modulation signals. In addition, the bit metric updating is also extendible to decoding of LDPC variable code rate and/or variable modulation signals whose code rate and/or modulation may vary as frequently as on a symbol by symbol basis. By ensuring that the bit metrics are updated during the various iterations of the iterative decoding processing, a higher performance can be achieved than when the bit metrics remain as fixed values during the iterative decoding processing.

31 Claims, 36 Drawing Sheets

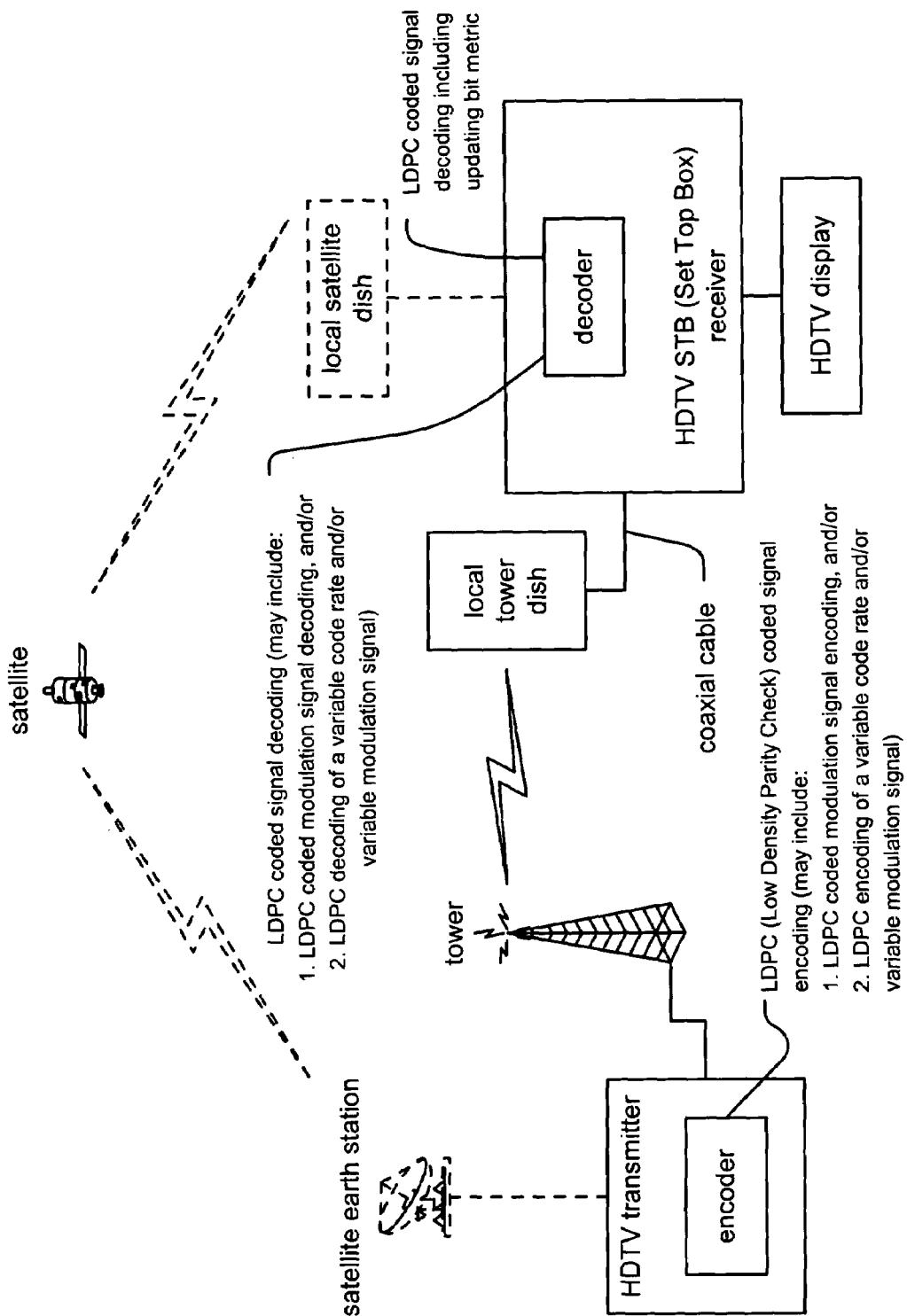

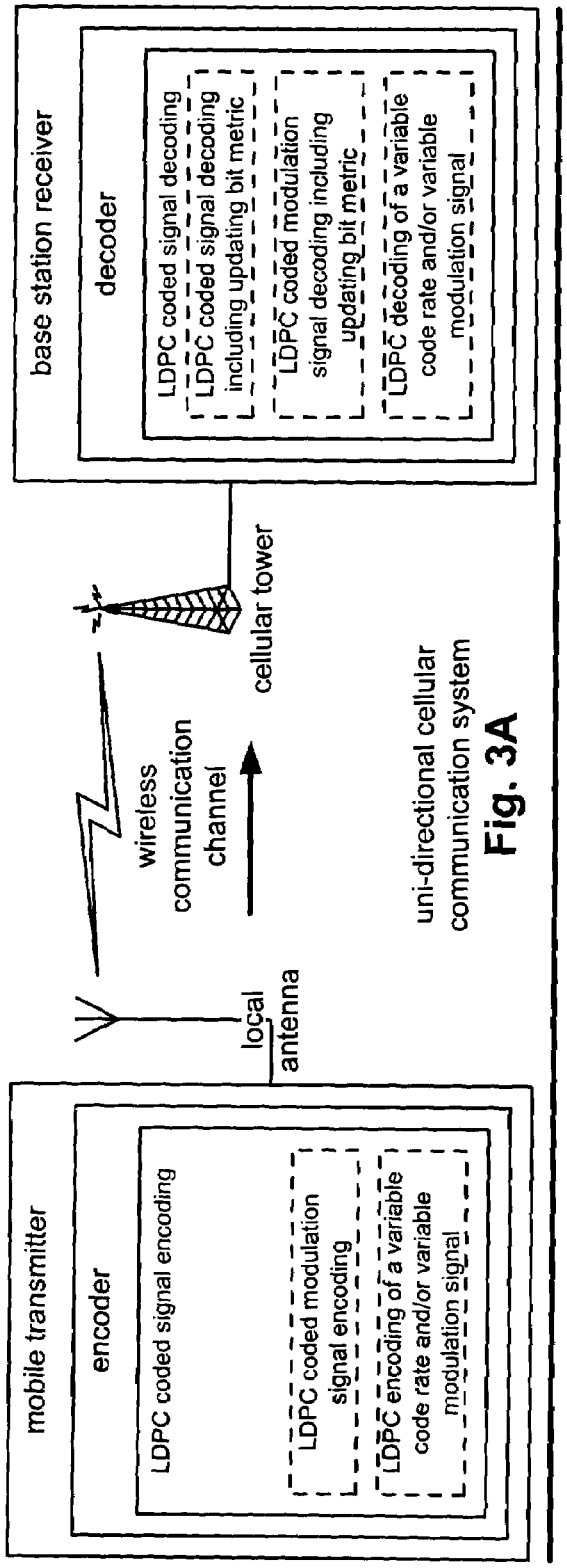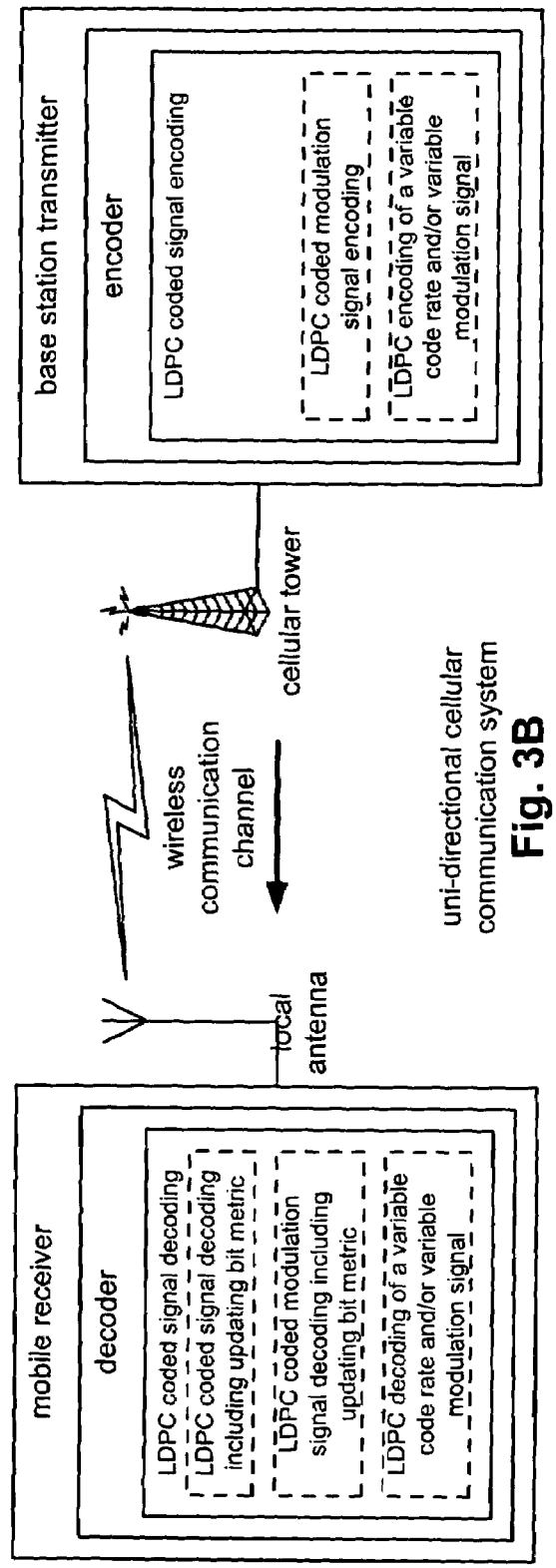

bi-directional cellular communication system uni-directional microwave communication system bi-directional microwave communication system uni-directional point-to-point radio communication system bi-directional point-to-point radio communication system uni-directional communication system bi-directional communication system one to many communication system WLAN (Wireless Local Area Network) communication system fiber-optic communication system satellite receiver STB (Set Top Box) system LDPC (Low Density Parity Check) code bipartite graph direct combining of LDPC (Low Density Parity Check) coding and modulation BICM (Bit Interleaved Coded Modulation)

multilevel coded modulation

Map(000)=0; Map(001)=1; Map(101)=2; Map(100)=3;
Map(110)=4; Map(111)=5; Map(011)=6; Map(010)=7    (EQ 1)

HNS (Hughes Network System) proposal to DVB (Digital Video Broadcasting Project) standard LDPC (Low Density Parity Check) coded modulation signal encoding

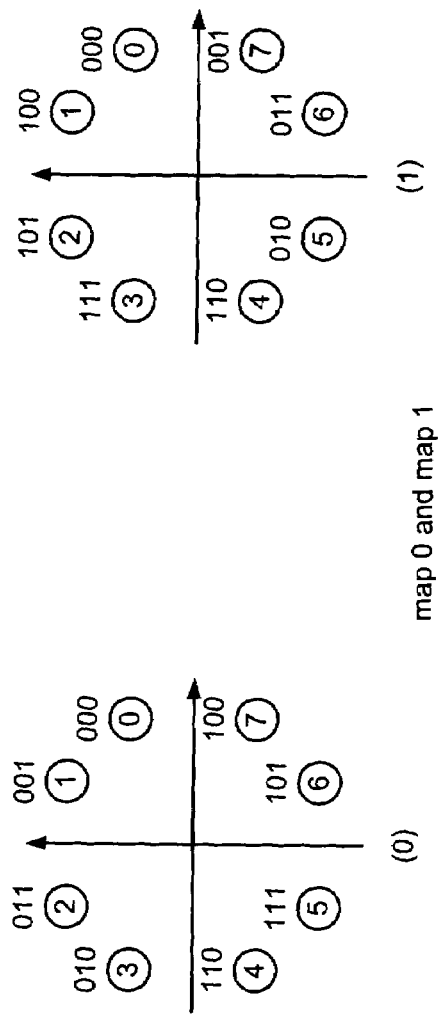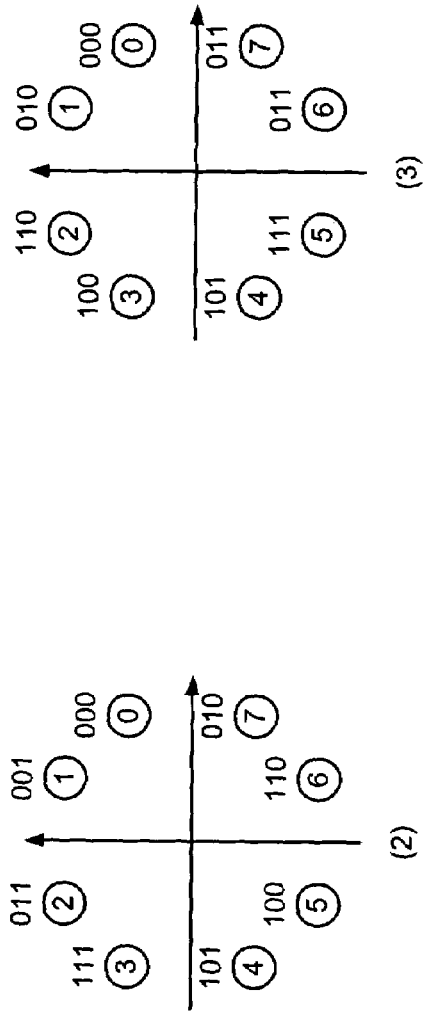
map 0 and map 1
Fig. 19A
map 2 and map 3
Fig. 19B

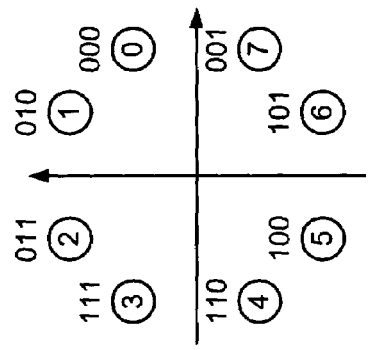
map 4 and map 5
Fig. 20A
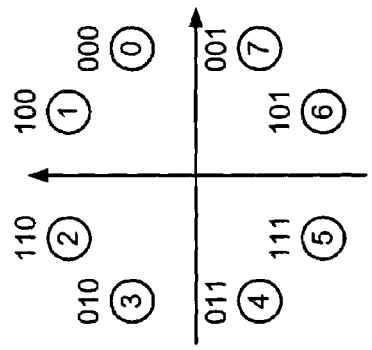
map 6 and map 7
Fig. 20B
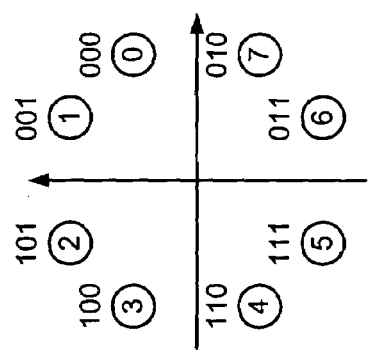
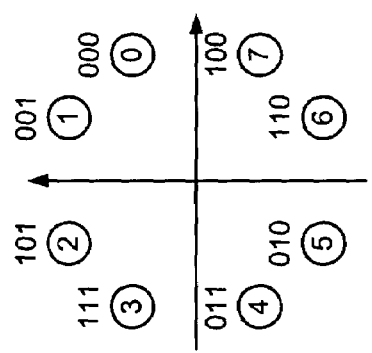

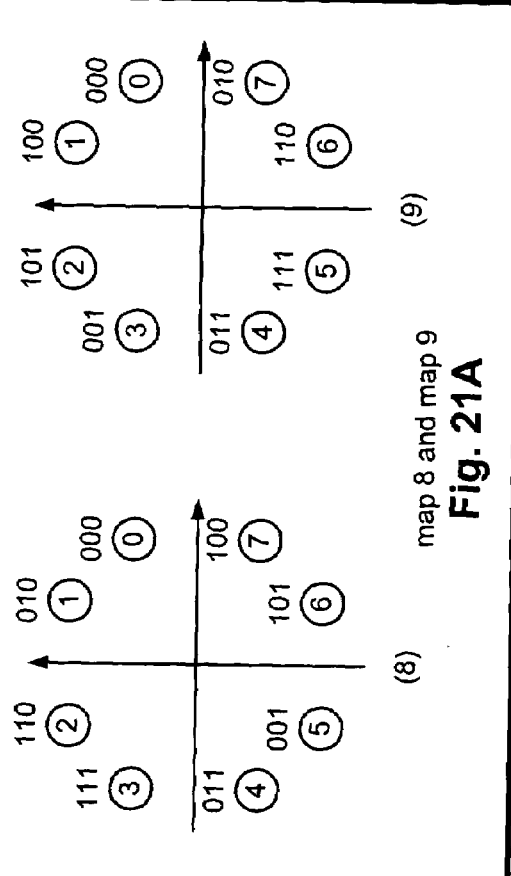
Fig. 21A map 8 and map 9
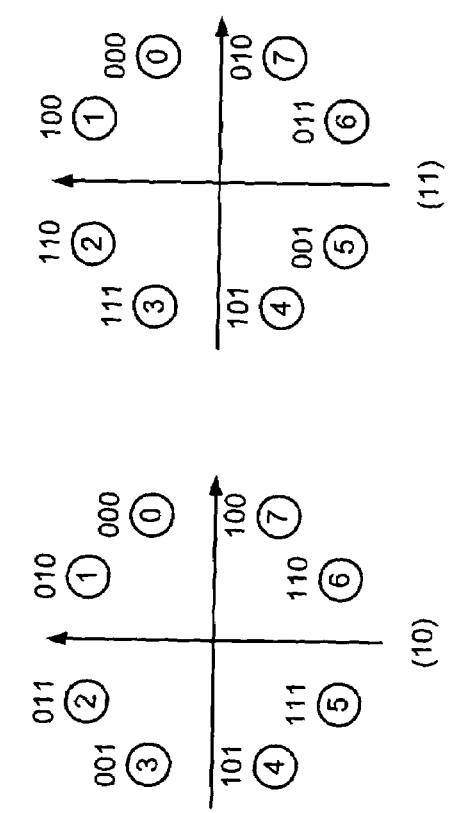
Fig. 21B map 10 and map 11
| map number | # weak points at MSB | # weak points at ISB | # weak points at LSB |
|---|---|---|---|
| 0 | 2 | 2 | 4 |
| 1 | 2 | 2 | 4 |
| 2 | 2 | 4 | 2 |
| 3 | 2 | 4 | 2 |
| 4 | 2 | 2 | 4 |
| 5 | 2 | 2 | 4 |
| 6 | 4 | 2 | 2 |
| 7 | 4 | 2 | 2 |
| 8 | 4 | 2 | 2 |
| 9 | 4 | 2 | 2 |
| 10 | 2 | 4 | 2 |
| 11 | 2 | 4 | 2 |
Table I
Fig. 21C variable signal mapping LDPC (Low Density Parity Check) coded modulation system

Fig. 23 variable signal mapping LDPC (Low Density Parity Check) coded modulation system with code C_2 performance comparison of single map vs. multiple maps (1 map vs. 3 maps)

LDPC (Low Density Parity Check) coded modulation decoding functionality using bit metric LDPC (Low Density Parity Check) coded modulation decoding functionality using bit metric (with bit metric updating)

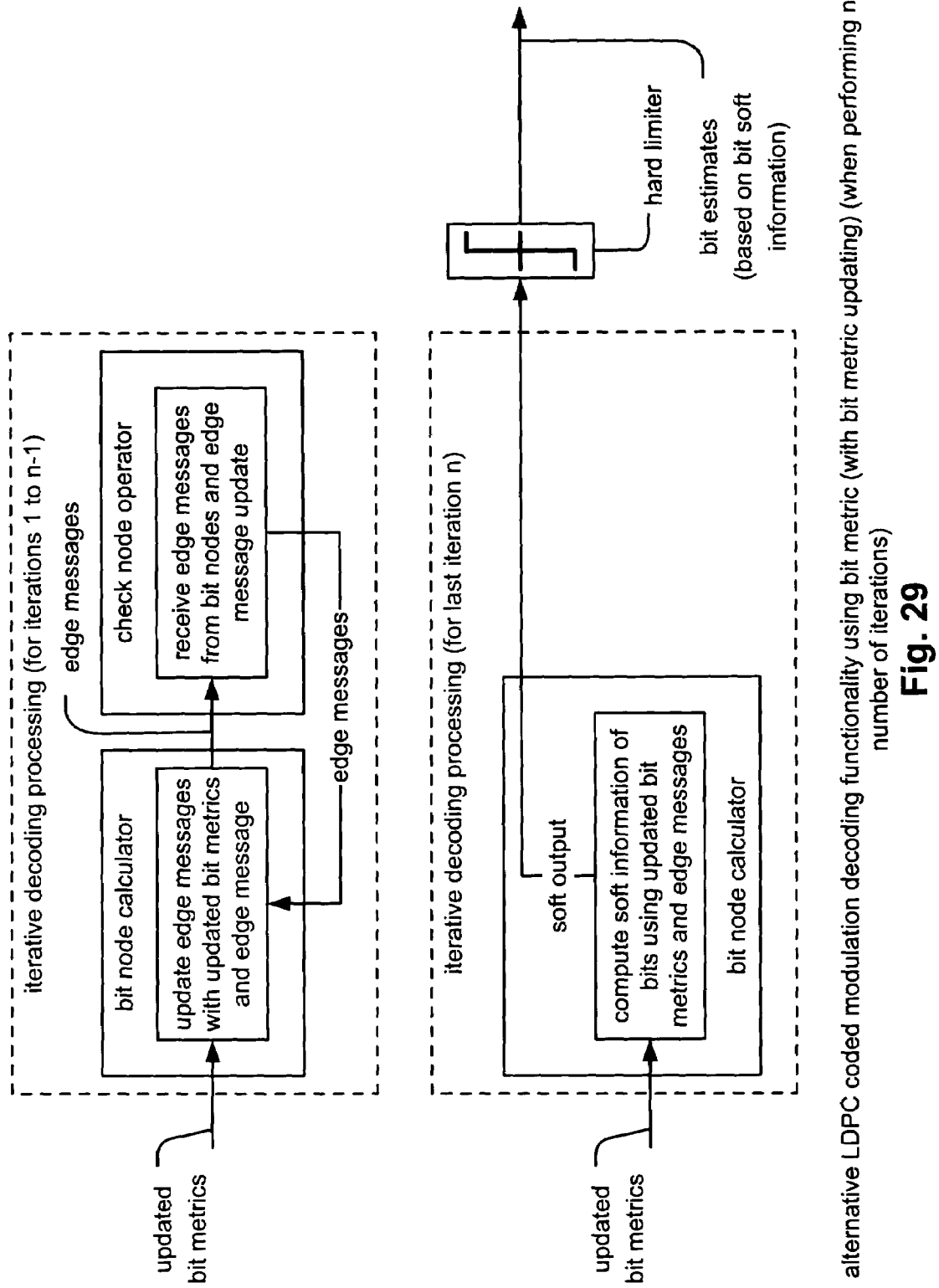

bit decoding using bit metric (shown with respect to LDPC (Low Density Parity Check) code bipartite graph)

bit decoding using bit metric updating (shown with respect to LDPC (Low Density Parity Check) code bipartite graph)

flowchart of decoding LDPC (Low Density Parity Check) coded modulation signal with metric updating method for decoding LDPC (Low Density Parity Check) coded modulation signal with update metric method for decoding LDPC coded modulation signal with update metric (see LDPC code bipartite graph of Fig. 26B)

performance comparison of LDPC (Low Density Parity Check) coded modulation decoding processing for differently mapped signals (1 of which performs metric updating) (shown as using code C_2)

performance of LDPC coded modulation decoding of different symbol size
(1. block with 21600 symbols, 3 bits per symbol and 2. block with 14400 symbols, 3 bits per symbol)

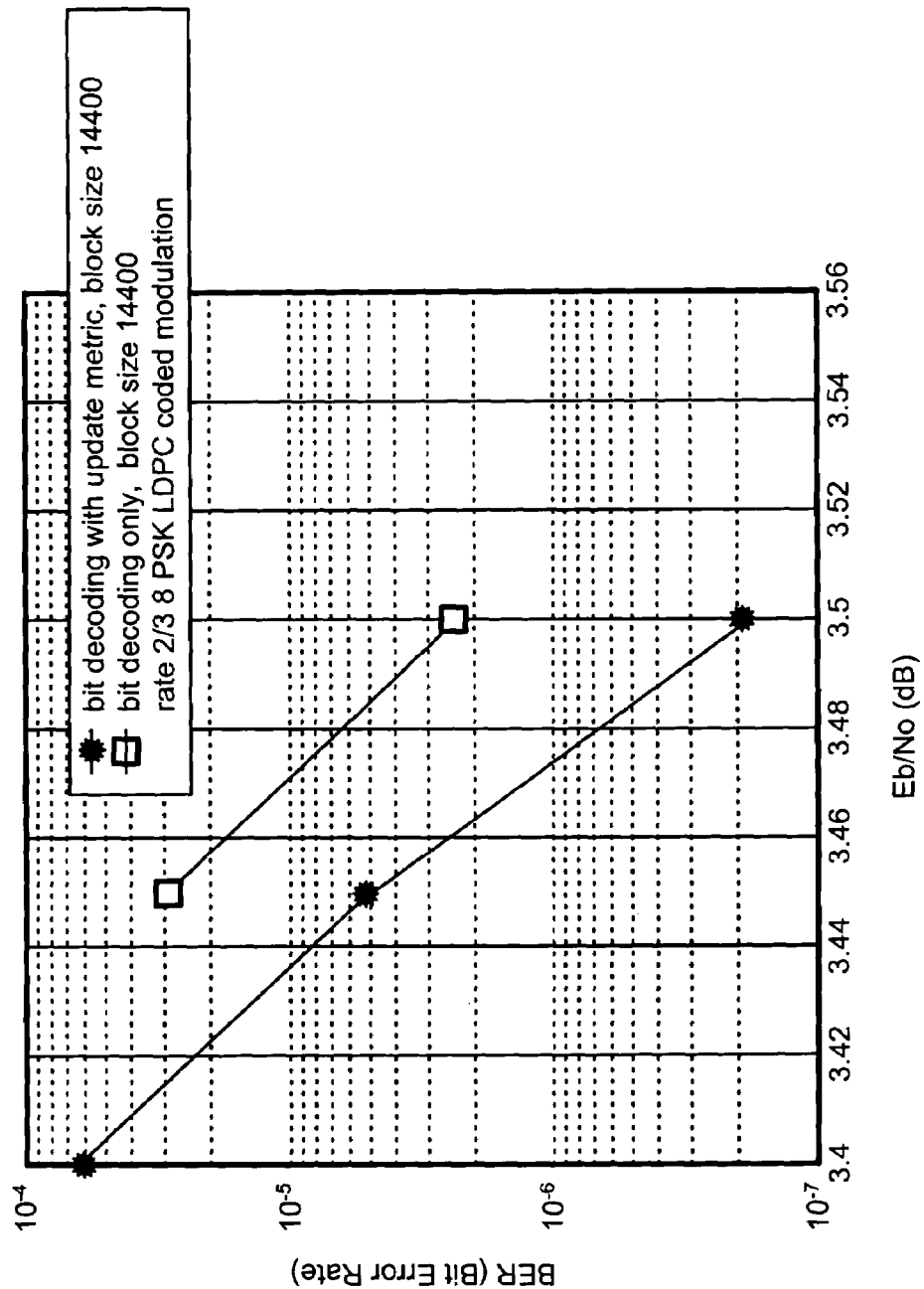

ITERATIVE METRIC UPDATING WHEN DECODING LDPC (LOW DENSITY PARITY CHECK) CODED SIGNALS AND LDPC CODED MODULATION SIGNALS

CROSS REFERENCE TO RELATED PATENTS/PATENT APPLICATIONS

The present U.S. Utility Patent Application claims priority pursuant to 35 U.S.C. § 119(e) to the following U.S. Provisional Patent Application which is hereby incorporated herein by reference in its entirety and made part of the present U.S. Utility Patent Application for all purposes:

1. U.S. Provisional Application Ser. No. 60/478,690, "Coded modulation with LDPC (Low Density Parity Check) code using variable maps and metric updating," filed Jun. 13, 2003, now abandoned.

The following U.S. Utility Patent Application is hereby incorporated herein by reference in its entirety and made part of the present U.S. Utility Patent Application for all purposes:

1. U.S. Utility application Ser. No. 10/264,486, entitled "Variable code rate and signal constellation turbo trellis coded modulation codec," filed Oct. 4, 2002, pending, which claims priority pursuant to 35 U.S.C. § 119(e) to U.S. Provisional Patent Application Ser. No. 60/384,698, entitled "Variable code rate and signal constellation turbo trellis coded modulation codec," filed May 31, 2002, now abandoned.

The following U.S. Utility patent application, being filed concurrently, is hereby incorporated herein by reference in its entirety and made part of the present U.S. Utility Patent Application for all purposes:

1. U.S. Utility patent application Ser. No. 10/669,066, entitled "Variable modulation within combined LDPC (Low Density Parity Check) coding and modulation coding systems," filed Sep. 23, 2003, pending.

BACKGROUND OF THE INVENTION

1. Technical Field of the Invention

The invention relates generally to communication systems; and, more particularly, it relates to decoding of signals within such communication systems.

2. Description of Related Art

Data communication systems have been under continual development for many years. One such type of communication system that has been of significant interest lately is a communication system that employs turbo codes. Another type of communication system that has also received interest is a communication system that employs LDPC (Low Density Parity Check) code. A primary directive in these areas of development has been to try continually to lower the error floor within a communication system. The ideal goal has been to try to reach Shannon's limit in a communication channel. Shannon's limit may be viewed as being the data rate to be used in a communication channel, having a particular SNR (Signal to Noise Ratio), that achieves error free transmission through the communication channel. In other words, the Shannon limit is the theoretical bound for channel capacity for a given modulation and code rate.

LDPC code has been shown to provide for excellent decoding performance that can approach the Shannon limit in some cases. For example, some LDPC decoders have been shown to come within 0.3 dB (decibels) from the theoretical Shannon limit. While this example was achieved using an irregular LDPC code of a length of one million, it nevertheless demonstrates the very promising application of LDPC codes within communication systems.

Typical encoding of LDPC coded modulation signals is performed by generating a signal that includes symbols each having a common code rate and being mapped to a singular modulation. That is to say, all of the symbols of such an LDPC coded modulation signal have the same code rate and the same modulation (the same constellation having a singular mapping). Oftentimes, such prior art encoding designs are implemented as to maximize the hardware and processing efficiencies of the particular design employed to generate the LDPC coded modulation signal having the single code rate and single modulation for all of the symbols generated therein.

With respect to decoding of such LDPC coded modulation signals, decoding is most commonly performed based on a bipartite graph of a given LDPC code such that the graph includes both bit nodes and check nodes. The I, Q (In-phase, Quadrature) values associated with received symbols are associated with a symbol node, and that symbol node is associated with corresponding bit nodes. Bit metrics are then calculated for the individual bits of the corresponding symbols, and those bit metrics are provided to the bit nodes of the bipartite graph of the given LDPC code. Edge information corresponding to the edges that interconnect the bit nodes and the check nodes is calculated, and appropriately updated, and communicated back and forth between the bit nodes and the check nodes during iterative decoding of the LDPC coded signal. Within such typical decoding systems, the bit metric values that are employed are fixed values and used repeatedly in the iterative decoding processing. As such, the performance of such prior art, bit only decoding approaches is inherently limited and may require more iterations to converge on a best estimate/hard decision of information contained within an LDPC coded modulation signal.

BRIEF SUMMARY OF THE INVENTION

Various aspects of the invention can be found in any number of devices that perform decoding of LDPC (Low Density Parity Check) coded signals. This decoding of LDPC coded signals may involve decoding of LDPC coded modulation signals as well. Moreover, this decoding may also involve LDPC decoding of a variable code rate and/or a variable modulation signal. The LDPC decoding is performed in such a manner that employs updating of a bit metric during the iterative decoding processing. In some instances, a single device (e.g., in a transceiver in some instances) is operable to perform both encoding and decoding in accordance with invention. Moreover, various aspects of the invention may be found in devices that perform decoding of LDPC coded signals that do not necessarily include combined LDPC coding and modulation encoding.

A decoder embodiment of the invention may be implemented to perform updating of a bit metric when decoding an LDPC coded signal. The decoder includes an m-bit symbol metric computer functional block that calculates a plurality of m-bit symbol metrics that correspond to a symbol of the LDPC coded signal wherein the symbol has m-bits. The decoder also includes a symbol node calculator functional block that calculates a plurality of bit metrics using the plurality of m-bit symbol metrics. A bit node calculator functional block computes soft messages corresponding to the m-bits of the symbol using the plurality of bit metrics. A check node operator functional block provides a plurality of edge messages to the bit node calculator functional block.

The plurality of edge messages corresponds to a plurality of edges that communicatively couple a plurality of bit nodes to a plurality of check nodes within an LDPC bipartite graph that corresponds to an LDPC code by which the LDPC coded signal is generated. The bit node calculator functional block updates the plurality of edge messages provided from the check node operator functional block using the plurality of bit metrics calculated by the symbol node calculator functional block. The bit node calculator functional block provides the updated plurality of edge messages to the check node operator functional block while the bit node calculator functional block updates the soft messages corresponding to the m-bits of the symbol using the updated plurality of edge messages. The symbol node calculator functional block updates the plurality of bit metrics using the updated soft messages corresponding to the m-bits of the symbol. The bit node calculator functional block and the check node operator functional block operate cooperatively to perform iterative decoding by employing updated versions of the plurality of bit metrics. After the iterations of the iterative decoding processing have been completed, the decoder outputs best estimates/hard decisions of the m-bits of the symbol of the LDPC coded signal using the latest updated soft messages corresponding to the m-bits of the symbol of the LDPC coded signal.

In some embodiments, the LDPC coded signal is an LDPC variable modulation signal that includes a first LDPC coded modulation symbol and a second LDPC coded modulation symbol. The first LDPC coded modulation symbol is modulation encoded according to a first modulation that includes a first constellation and a corresponding first mapping, and the second LDPC coded modulation symbol is modulation encoded according to a second modulation that includes a second constellation and a corresponding second mapping. In addition, in even other embodiments, the first and second modulation both include a common constellation shape, yet each of them has a unique corresponding mapping (e.g., different mappings for different symbols that are modulation encoded using a similarly shaped constellation). For example, the first constellation and the second constellation are both 8 PSK (8 Phase Shift Key) shaped constellations. The first modulation includes the 8 PSK shaped constellation whose constellation points are mapped according to the corresponding first mapping, and the second modulation includes the 8 PSK shaped constellation whose constellation points are mapped according to the corresponding second mapping.

The LDPC coded signal that is decoded may also be an LDPC variable code rate signal that includes a first LDPC coded symbol and a second LDPC coded symbol. In such instances, the first LDPC coded symbol is LDPC encoded according to a first code rate, and the second LDPC coded symbol is LDPC encoded according to a second code rate.

Such a decoder built according to the invention may be implemented within a variety of types of communication devices that may be implemented within any number of types of communication systems. Some examples of such communication systems includes any one of a satellite communication system, an HDTV (High Definition Television) communication system, a cellular communication system, a microwave communication system, a point-to-point communication system, a uni-directional communication system, a bi-directional communication system, a one to many communication system, and a fiber-optic communication system. Moreover, various types of methods may be performed to support the functionality described herein without departing from the scope and spirit of the invention as well.

BRIEF DESCRIPTION OF THE SEVERAL VIEWS OF THE DRAWINGS

FIG. 2 is a system diagram illustrating an embodiment of an HDTV (High Definition Television) communication system that is built according to the invention.

FIG. 3A and FIG. 3B are system diagrams illustrating embodiment of uni-directional cellular communication systems that are built according to the invention.

FIG. 19A, FIG. 19B, FIG. 20A, FIG. 20B, FIG. 21A, and FIG. 21B are diagrams illustrating various embodiments of mappings that may be employed according to the invention.

FIG. 21C is a diagram illustrating a table indicating the relationship between the variable map number and the number of weak points for the MSB (Most Significant Bit), ISB (Inside Significant Bit), and LSB (Least Significant Bit), respectively, according to one embodiment of the invention.

FIG. 29 is a diagram illustrating an alternative embodiment of LDPC coded modulation decoding functionality using bit metric (with bit metric updating) according to the invention (when performing n number of iterations).

FIG. 36 is a diagram illustrating an embodiment of performance comparison of bit decoding vs. bit decoding with metric updating of LDPC (Low Density Parity Check) coded modulation signals according to the invention.

DETAILED DESCRIPTION OF THE INVENTION

Various aspects of the invention may be found in any number of devices that perform decoding of LDPC (Low Density Parity Check) coded signals. Moreover, in some embodiments, the decoding may be performed on signals that have been generated using combined LDPC coding and modulation coding to generate an LDPC coded modulation signal. The decoding aspects of the invention may also be applied to decoding of signals that have been generated using LDPC encoding combined with modulation encoding to generate a variable modulation signal whose modulation may vary as frequently as on a symbol by symbol basis. That is to say, the constellation and/or mapping of the symbols of an LDPC coded variable modulation signal may vary as frequently as on a symbol by symbol basis. In addition, the code rate of the symbols of the LDPC coded signal may also vary as frequently as on a symbol by symbol basis. In general, any LDPC signal generated according to a variety of LDPC encoding approaches may benefit from the updating bit metric approach presented according to the invention.

Therefore, various decoding aspects of the invention may also be found in devices that perform decoding of LDPC coded variable modulation signals. However, it is again noted that the decoding aspects of the invention are also applicable to decode LDPC signals that have a single code rate and/or single modulation for all of the symbols of the LDPC signal. For example, for an LDPC signal whose symbols all have a common code rate and a common modulation (constellation and mapping), the decoding aspects of the invention may also be employed. Also, various decoding aspects of the invention may be found in devices that perform decoding of LDPC coded signals that do not necessarily include combined LDPC coding and modulation encoding. For example, the decoding aspects of the invention are also operable to decode signal that are generated using only LDPC coding (e.g., not be using combined LDPC coding and modulation coding). The LDPC decoding may be implemented to perform updating of a bit metric that is employed.

Various system embodiments are described below where any of the various aspects of the invention may be implemented. In general, any device that performs encoding and/or decoding of LDPC coded signals may benefit from the invention. Again, this also includes those LDPC coded signals that have variable code rate and/or modulation as well as those that include combined LDPC coding and modulation coding.

Figure 1:
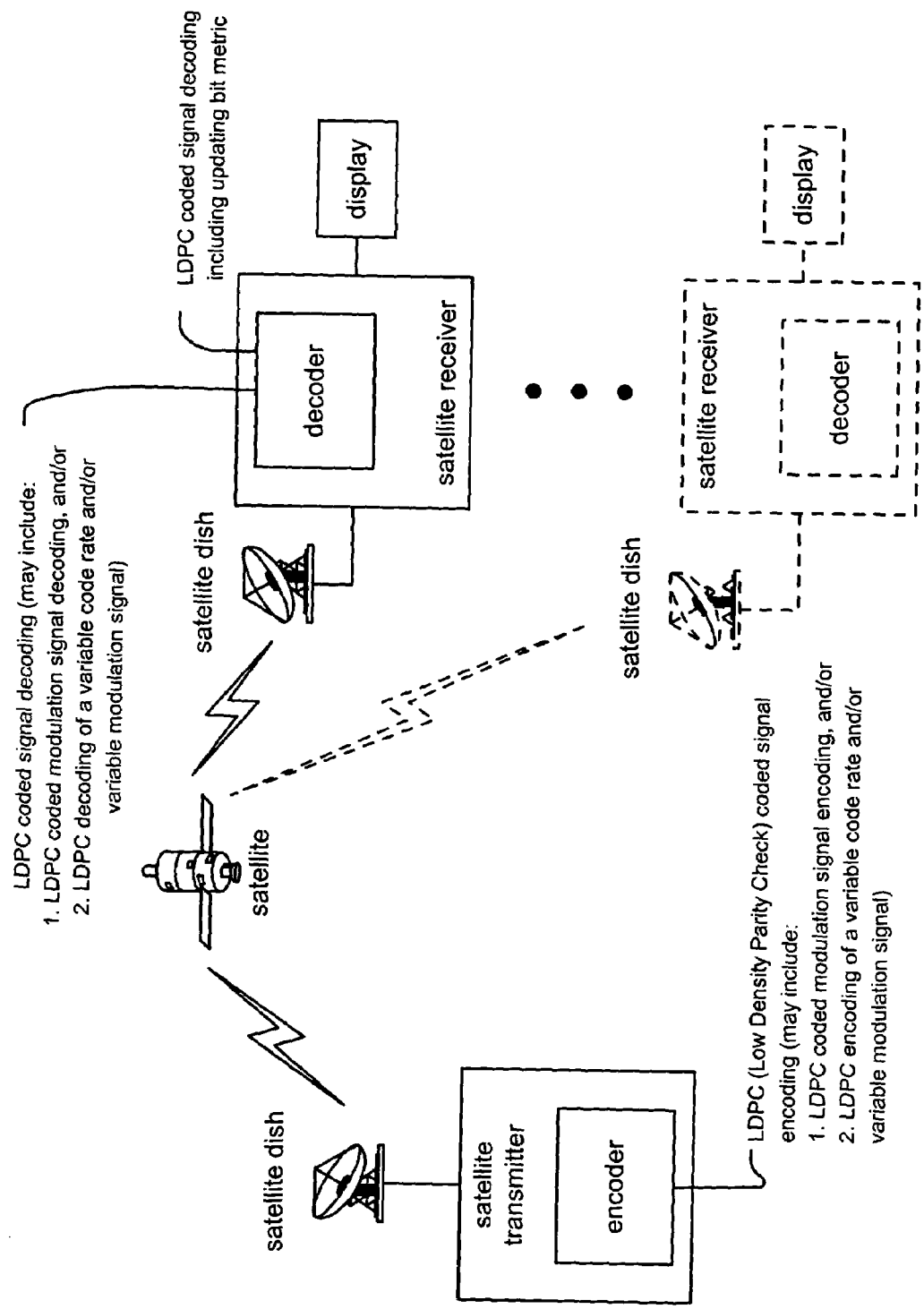
FIG. 1 is a system diagram illustrating an embodiment of a satellite communication system that is built according to the invention.

FIG. 1 is a system diagram illustrating an embodiment of a satellite communication system that is built according to the invention. A satellite transmitter is communicatively coupled to a satellite dish that is operable to communicate with a satellite. The satellite transmitter may also be communicatively coupled to a wired network. This wired network may include any number of networks including the Internet, proprietary networks, and/or other wired networks and/or WANs (Wide Area Networks). The satellite transmitter employs the satellite dish to communicate to the satellite via a wireless communication channel. The satellite is able to communicate with one or more satellite receivers (each having a satellite dish). Each of the satellite receivers may also be communicatively coupled to a display.

Here, the communication to and from the satellite may cooperatively be viewed as being a wireless communication channel, or each of the communication links to and from the satellite may be viewed as being two distinct wireless communication channels.

For example, the wireless communication "channel" may be viewed as not including multiple wireless hops in one embodiment. In other multi-hop embodiments, the satellite receives a signal received from the satellite transmitter (via its satellite dish), amplifies it, and relays it to satellite receiver (via its satellite dish); the satellite receiver may also be implemented using terrestrial receivers such as satellite receivers, satellite based telephones, and/or satellite based Internet receivers, among other receiver types. In the case where the satellite receives a signal received from the satellite transmitter (via its satellite dish), amplifies it, and relays it, the satellite may be viewed as being a "transponder;" this is a multi-hop embodiment. In addition, other satellites may exist that perform both receiver and transmitter operations in cooperation with the satellite. In this case, each leg of an up-down transmission via the wireless communication channel would be considered separately.

In whichever embodiment, the satellite communicates with the satellite receiver. The satellite receiver may be viewed as being a mobile unit in certain embodiments (employing a local antenna); alternatively, the satellite receiver may be viewed as being a satellite earth station that may be communicatively coupled to a wired network in a similar manner in which the satellite transmitter may also be communicatively coupled to a wired network.

The satellite transmitter is operable to encode information (using an encoder) that is to be transmitted to the satellite receiver; the satellite receiver is operable to decode the transmitted signal (using a decoder). The encoder may be implemented to perform LDPC coded signal encoding. The LDPC coded signal encoding may involve LDPC coded modulation signal encoding. In addition, the LDPC coded signal encoding may involve LDPC encoding of a variable code rate and/or variable modulation signal whose code rate and/or modulation may vary as frequently as on a symbol by symbol basis without departing from the scope and spirit of the invention. Any one or both of the code rate and modulation (including constellation and mapping) of the symbols may vary as frequently as on a symbol by symbol basis. The encoding may be performed using combined LDPC encoding and modulation encoding to generate the LDPC signal sequence to be transmitted.

The decoders within the satellite receivers may be implemented to perform decoding of LDPC coded signals. This LDPC decoding may be implemented to perform updating of the bit metric employed within the iterative decoding processing. This decoding processing is also operable to decode an LDPC coded modulation signal. Moreover, the decoding processing is also operable to decode an LDPC variable code rate and/or variable modulation signal whose code rate and/or modulation (including constellation and mapping) may vary as frequently as on a symbol by symbol basis. In addition, the decoding processing may operate to decode an LDPC coded signal having a common code rate and modulation for all of the symbols contained therein. This diagram shows just one of the many embodiments where one or more of the various aspects of the invention may be found.

FIG. 2 is a system diagram illustrating an embodiment of an HDTV (High Definition Television) communication system that is built according to the invention. An HDTV transmitter is communicatively coupled to a tower. The HDTV transmitter, using its tower, transmits a signal to a local tower dish via a wireless communication channel. The local tower dish may communicatively couple to an HDTV STB (Set Top Box) receiver via a coaxial cable. The HDTV STB receiver includes the functionality to receive the wireless transmitted signal that has been received by the local tower dish; this may include any transformation and/or down-converting that may be needed to accommodate any up-converting that may have been performed before and during transmission of the signal from the HDTV transmitter and its tower to transform the signal into a format that is compatible with the communication channel across which it is transmitted.

The HDTV STB receiver is also communicatively coupled to an HDTV display that is able to display the demodulated and decoded wireless transmitted signals received by the HDTV STB receiver and its local tower dish. The HDTV transmitter (via its tower) transmits a signal directly to the local tower dish via the wireless communication channel in this embodiment. In alternative embodiments, the HDTV transmitter may first receive a signal from a satellite, using a satellite earth station that is communicatively coupled to the HDTV transmitter, and then transmit this received signal to the local tower dish via the wireless communication channel. In this situation, the HDTV transmitter operates as a relaying element to transfer a signal originally provided by the satellite that is destined for the HDTV STB receiver. For example, another satellite earth station may first transmit a signal to the satellite from another location, and the satellite may relay this signal to the satellite earth station that is communicatively coupled to the HDTV transmitter. The HDTV transmitter performs receiver functionality and then transmits its received signal to the local tower dish.

In even other embodiments, the HDTV transmitter employs its satellite earth station to communicate to the satellite via a wireless communication channel. The satellite is able to communicate with a local satellite dish; the local satellite dish communicatively couples to the HDTV STB receiver via a coaxial cable. This path of transmission shows yet another communication path where the HDTV STB receiver may communicate with the HDTV transmitter.

In whichever embodiment and whichever signal path the HDTV transmitter employs to communicate with the HDTV STB receiver, the HDTV STB receiver is operable to receive communication transmissions from the HDTV transmitter.

The HDTV transmitter is operable to encode information (using an encoder) that is to be transmitted to the HDTV STB receiver; the HDTV STB receiver is operable to decode the transmitted signal (using a decoder).

As within other embodiments that employ an encoder, the encoder may be implemented to perform LDPC coded signal encoding. The LDPC coded signal encoding may involve LDPC coded modulation signal encoding. In addition, the LDPC coded signal encoding may involve LDPC encoding of a variable code rate and/or variable modulation signal whose code rate and/or modulation may vary as frequently as on a symbol by symbol basis without departing from the scope and spirit of the invention. Any one or both of the code rate and modulation (including constellation and mapping) of the symbols may vary as frequently as on a symbol by symbol basis. The encoding may be performed using combined LDPC encoding and modulation encoding to generate the LDPC signal sequence to be transmitted.

As within other embodiments that employ a decoder, the decoder may be implemented to perform decoding of LDPC coded signals. This LDPC decoding may be implemented to perform updating of the bit metric employed within the iterative decoding processing. This decoding processing is also operable to decode an LDPC coded modulation signal. Moreover, the decoding processing is also operable to decode an LDPC variable code rate and/or variable modulation signal whose code rate and/or modulation (including constellation and mapping) may vary as frequently as on a symbol by symbol basis. In addition, the decoding processing may operate to decode an LDPC coded signal having a common code rate and modulation for all of the symbols contained therein. This diagram shows yet another embodiment where one or more of the various aspects of the invention may be found.

FIG. 3A and FIG. 3B are system diagrams illustrating embodiments of uni-directional cellular communication systems that are built according to the invention.

Referring to the FIG. 3A, a mobile transmitter includes a local antenna communicatively coupled thereto. The mobile transmitter may be any number of types of transmitters including a one way cellular telephone, a wireless pager unit, a mobile computer having transmit functionality, or any other type of mobile transmitter. The mobile transmitter transmits a signal, using its local antenna, to a cellular tower via a wireless communication channel. The cellular tower is communicatively coupled to a base station receiver; the receiving tower is operable to receive data transmission from the local antenna of the mobile transmitter that has been communicated via the wireless communication channel. The cellular tower communicatively couples the received signal to the base station receiver.

The mobile transmitter is operable to encode information (using an encoder) that is to be transmitted to the base station receiver; the base station receiver is operable to decode the transmitted signal (using a decoder).

As within other embodiments that employ an encoder, the encoder may be implemented to perform LDPC coded signal encoding. The LDPC coded signal encoding may involve LDPC coded modulation signal encoding. In addition, the LDPC coded signal encoding may involve LDPC encoding of a variable code rate and/or variable modulation signal whose code rate and/or modulation may vary as frequently as on a symbol by symbol basis without departing from the scope and spirit of the invention. Any one or both of the code rate and modulation (including constellation and mapping) of the symbols may vary as frequently as on a symbol by symbol basis. The encoding may be performed using combined LDPC encoding and modulation encoding to generate the LDPC signal sequence to be transmitted.

As within other embodiments that employ a decoder, the decoder may be implemented to perform decoding of LDPC coded signals. This LDPC decoding may be implemented to perform updating of the bit metric employed within the iterative decoding processing. This decoding processing is also operable to decode an LDPC coded modulation signal. Moreover, the decoding processing is also operable to decode an LDPC variable code rate and/or variable modulation signal whose code rate and/or modulation (including constellation and mapping) may vary as frequently as on a symbol by symbol basis. In addition, the decoding processing may operate to decode an LDPC coded signal having a common code rate and modulation for all of the symbols contained therein. This diagram shows yet another embodiment where one or more of the various aspects of the invention may be found.

Referring to the FIG. 3B, a base station transmitter includes a cellular tower communicatively coupled thereto. The base station transmitter, using its cellular tower, transmits a signal to a mobile receiver via a communication channel. The mobile receiver may be any number of types of receivers including a one-way cellular telephone, a wireless pager unit, a mobile computer having receiver functionality, or any other type of mobile receiver. The mobile receiver is communicatively coupled to a local antenna; the local antenna is operable to receive data transmission from the cellular tower of the base station transmitter that has been communicated via the wireless communication channel. The local antenna communicatively couples the received signal to the mobile receiver.

The base station transmitter is operable to encode information (using an encoder) that is to be transmitted to the mobile receiver; the mobile receiver is operable to decode the transmitted signal (using a decoder).

As within other embodiments that employ an encoder, the encoder may be implemented to perform LDPC coded signal encoding. The LDPC coded signal encoding may involve LDPC coded modulation signal encoding. In addition, the LDPC coded signal encoding may involve LDPC encoding of a variable code rate and/or variable modulation signal whose code rate and/or modulation may vary as frequently as on a symbol by symbol basis without departing from the scope and spirit of the invention. Any one or both of the code rate and modulation (including constellation and mapping) of the symbols may vary as frequently as on a symbol by symbol basis. The encoding may be performed using combined LDPC encoding and modulation encoding to generate the LDPC signal sequence to be transmitted.

As within other embodiments that employ a decoder, the decoder may be implemented to perform decoding of LDPC coded signals. This LDPC decoding may be implemented to perform updating of the bit metric employed within the iterative decoding processing. This decoding processing is also operable to decode an LDPC coded modulation signal. Moreover, the decoding processing is also operable to decode an LDPC variable code rate and/or variable modulation signal whose code rate and/or modulation (including constellation and mapping) may vary as frequently as on a symbol by symbol basis. In addition, the decoding processing may operate to decode an LDPC coded signal having a common code rate and modulation for all of the symbols contained therein. This diagram shows yet another embodiment where one or more of the various aspects of the invention may be found.

Figure 4:
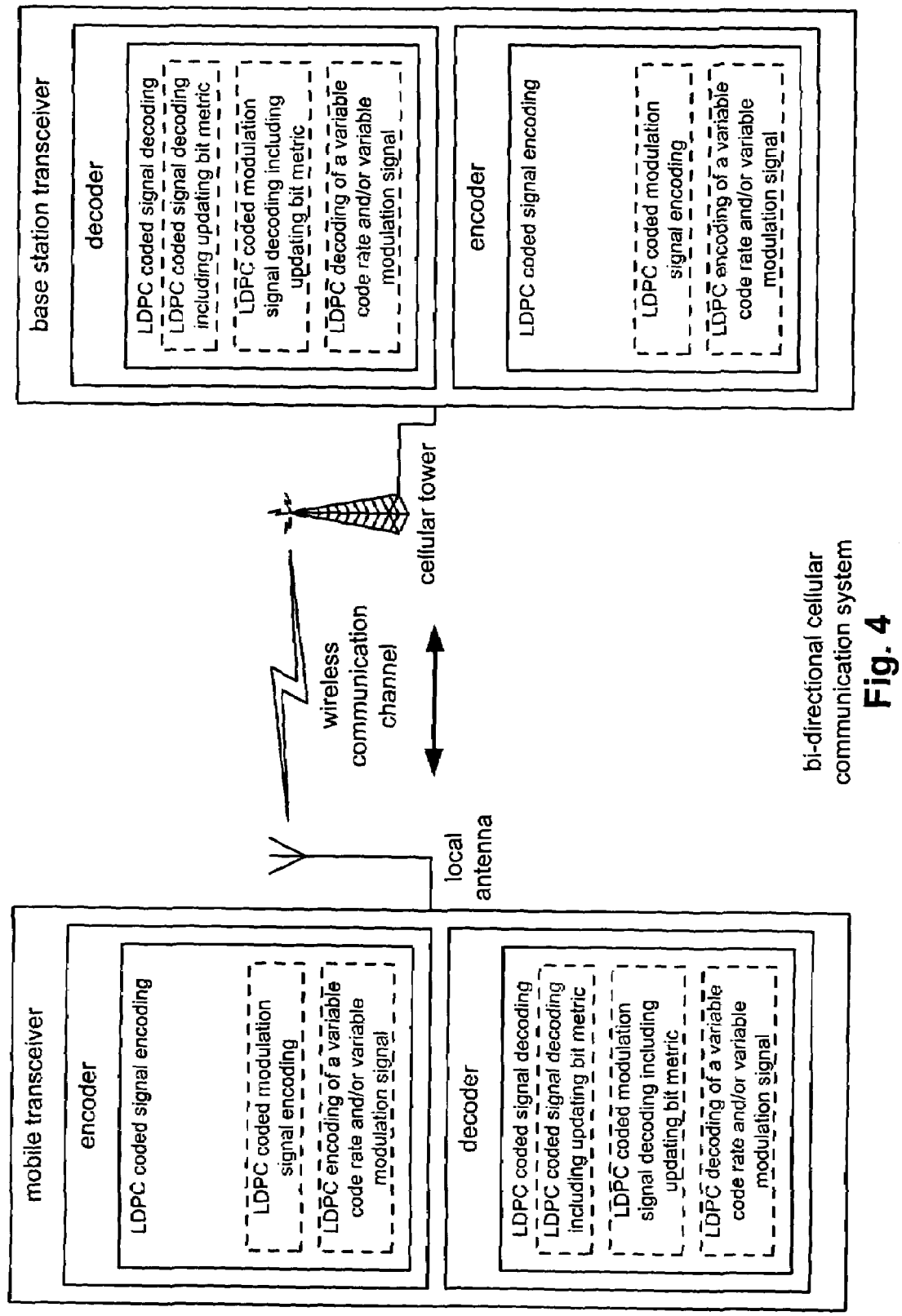
FIG. 4 is a system diagram illustrating an embodiment of a bi-directional cellular communication system that is built according to the invention.

FIG. 4 is a system diagram illustrating an embodiment of a bi-directional cellular communication system, that is built according to the invention, where the communication can go to and from the base station transceiver and to and from the mobile transceiver via the wireless communication channel.

Referring to the FIG. 4, a base station transceiver includes a cellular tower communicatively coupled thereto. The base station transceiver, using its cellular tower, transmits a signal to a mobile transceiver via a communication channel. The reverse communication operation may also be performed. The mobile transceiver is able to transmit a signal to the base station transceiver as well. The mobile transceiver may be any number of types of transceiver including a cellular telephone, a wireless pager unit, a mobile computer having transceiver functionality, or any other type of mobile transceiver. The mobile transceiver is communicatively coupled to a local antenna; the local antenna is operable to receive data transmission from the cellular tower of the base station transceiver that has been communicated via the wireless communication channel. The local antenna communicatively couples the received signal to the mobile transceiver.

The base station transceiver is operable to encode information (using its corresponding encoder) that is to be transmitted to the mobile transceiver; the mobile transceiver is operable to decode the transmitted signal (using its corresponding decoder). Similarly, mobile transceiver is operable to encode information (using its corresponding encoder) that is to be transmitted to the base station transceiver; the base station transceiver is operable to decode the transmitted signal (using its corresponding decoder).

As within other embodiments that employ an encoder, the encoder of either of the base station transceiver or the mobile transceiver may be implemented to perform LDPC coded signal encoding. The LDPC coded signal encoding may involve LDPC coded modulation signal encoding. In addition, the LDPC coded signal encoding may involve LDPC encoding of a variable code rate and/or variable modulation signal whose code rate and/or modulation may vary as frequently as on a symbol by symbol basis without departing from the scope and spirit of the invention. Any one or both of the code rate and modulation (including constellation and mapping) of the symbols may vary as frequently as on a symbol by symbol basis. The encoding may be performed using combined LDPC encoding and modulation encoding to generate the LDPC signal sequence to be transmitted.

As within other embodiments that employ a decoder, the decoder of either of the base station transceiver or the mobile transceiver may be implemented to perform decoding of LDPC coded signals. This LDPC decoding may be implemented to perform updating of the bit metric employed within the iterative decoding processing. This decoding processing is also operable to decode an LDPC coded modulation signal. Moreover, the decoding processing is also operable to decode an LDPC variable code rate and/or variable modulation signal whose code rate and/or modulation (including constellation and mapping) may vary as frequently as on a symbol by symbol basis. In addition, the decoding processing may operate to decode an LDPC coded signal having a common code rate and modulation for all of the symbols contained therein. This diagram shows yet another embodiment where one or more of the various aspects of the invention may be found.

Figure 5:
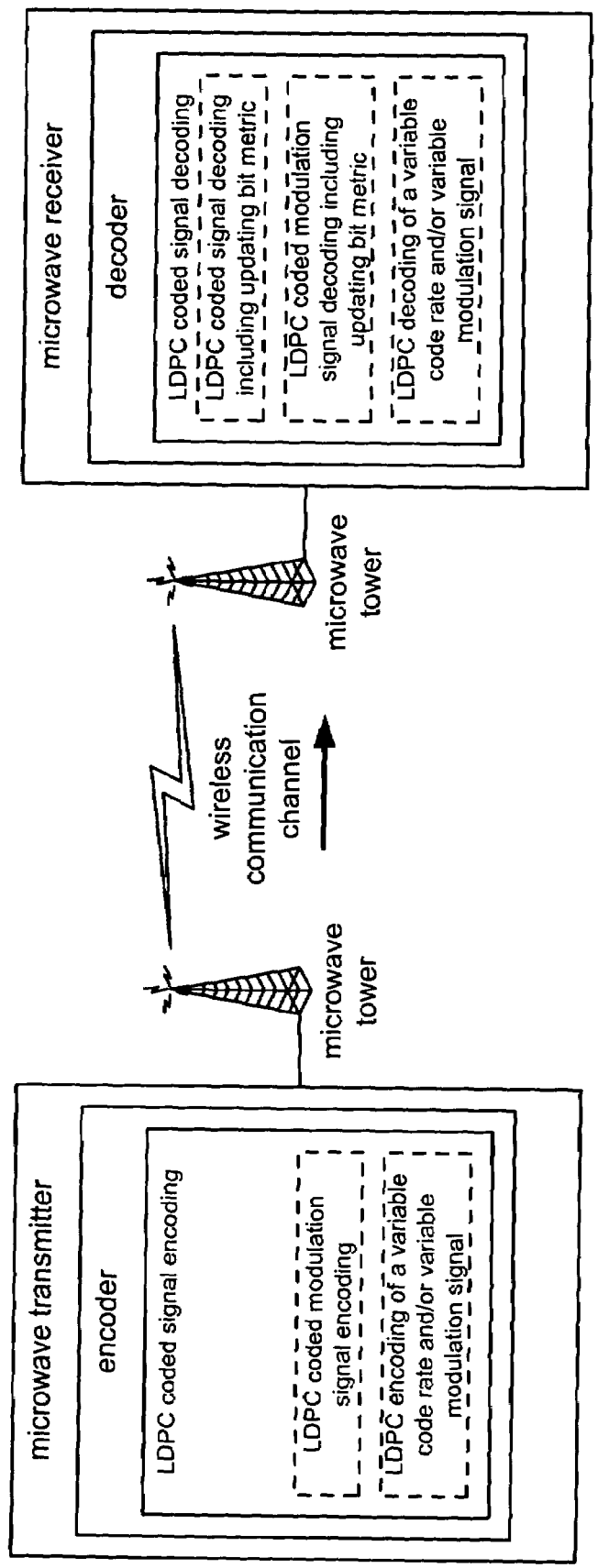
FIG. 5 is a system diagram illustrating an embodiment of a uni-directional microwave communication system that is built according to the invention.

FIG. 5 is a system diagram illustrating an embodiment of a unidirectional microwave communication system that is built according to the invention. A microwave transmitter is communicatively coupled to a microwave tower. The microwave transmitter, using its microwave tower, transmits a signal to a microwave tower via a wireless communication channel. A microwave receiver is communicatively coupled to the microwave tower. The microwave tower is able to receive transmissions from the microwave tower that have been communicated via the wireless communication channel.

The microwave transmitter is operable to encode information (using an encoder) that is to be transmitted to the microwave receiver; the microwave receiver is operable to decode the transmitted signal (using a decoder).

As within other embodiments that employ an encoder, the encoder may be implemented to perform LDPC coded signal encoding. The LDPC coded signal encoding may involve LDPC coded modulation signal encoding. In addition, the LDPC coded signal encoding may involve LDPC encoding of a variable code rate and/or variable modulation signal whose code rate and/or modulation may vary as frequently as on a symbol by symbol basis without departing from the scope and spirit of the invention. Any one or both of the code rate and modulation (including constellation and mapping) of the symbols may vary as frequently as on a symbol by symbol basis. The encoding may be performed using combined LDPC encoding and modulation encoding to generate the LDPC signal sequence to be transmitted.

As within other embodiments that employ a decoder, the decoder may be implemented to perform decoding of LDPC coded signals. This LDPC decoding may be implemented to perform updating of the bit metric employed within the iterative decoding processing. This decoding processing is also operable to decode an LDPC coded modulation signal. Moreover, the decoding processing is also operable to decode an LDPC variable code rate and/or variable modulation signal whose code rate and/or modulation (including constellation and mapping) may vary as frequently as on a symbol by symbol basis. In addition, the decoding processing may operate to decode an LDPC coded signal having a common code rate and modulation for all of the symbols contained therein. This diagram shows yet another embodiment where one or more of the various aspects of the invention may be found.

Figure 6:
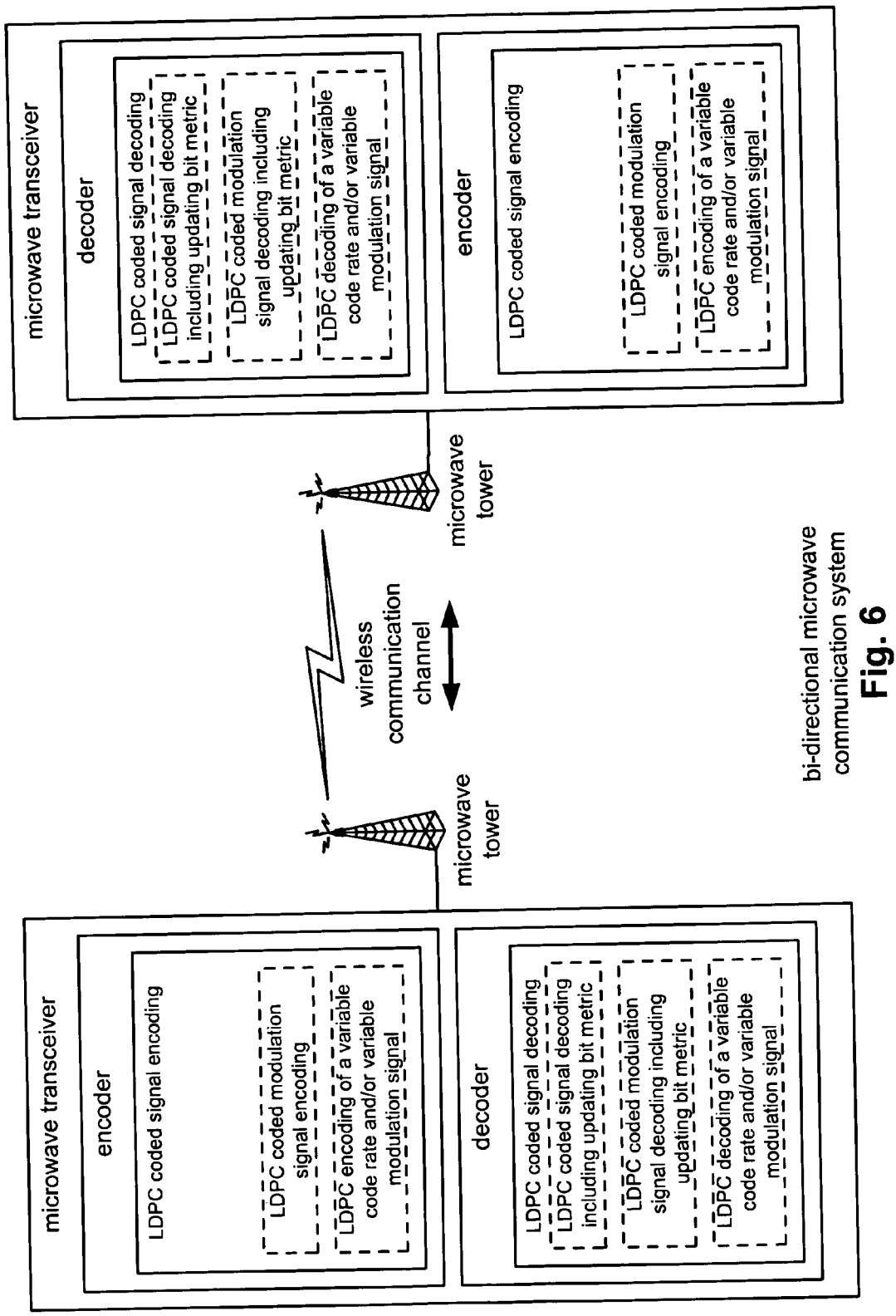
FIG. 6 is a system diagram illustrating an embodiment of a bi-directional microwave communication system that is built according to the invention.

FIG. 6 is a system diagram illustrating an embodiment of a bi-directional microwave communication system that is built according to the invention. Within this diagram, a first microwave transceiver is communicatively coupled to a first microwave tower. The first microwave transceiver, using the first microwave tower (the first microwave transceiver's microwave tower), transmits a signal to a second microwave tower of a second microwave transceiver via a wireless communication channel. The second microwave transceiver is communicatively coupled to the second microwave tower (the second microwave transceiver's microwave tower). The second microwave tower is able to receive transmissions from the first microwave tower that have been communicated via the wireless communication channel. The reverse communication operation may also be performed using the first and second microwave transceivers.

Each of the microwave transceivers is operable to encode information (using an encoder) that is to be transmitted to the other microwave transceiver; each microwave transceiver is operable to decode the transmitted signal (using a decoder) that it receives. Each of the microwave transceivers includes an encoder and a decoder.

As within other embodiments that employ an encoder, the encoder of either of the microwave transceivers may be implemented to perform LDPC coded signal encoding. The LDPC coded signal encoding may involve LDPC coded modulation signal encoding. In addition, the LDPC coded signal encoding may involve LDPC encoding of a variable code rate and/or variable modulation signal whose code rate and/or modulation may vary as frequently as on a symbol by symbol basis without departing from the scope and spirit of the invention. Any one or both of the code rate and modulation (including constellation and mapping) of the symbols may vary as frequently as on a symbol by symbol basis. The encoding may be performed using combined LDPC encoding and modulation encoding to generate the LDPC signal sequence to be transmitted.

As within other embodiments that employ a decoder, the decoder of either of the microwave transceivers may be implemented to perform decoding of LDPC coded signals.

This LDPC decoding may be implemented to perform updating of the bit metric employed within the iterative decoding processing. This decoding processing is also operable to decode an LDPC coded modulation signal. Moreover, the decoding processing is also operable to decode an LDPC variable code rate and/or variable modulation signal whose code rate and/or modulation (including constellation and mapping) may vary as frequently as on a symbol by symbol basis. In addition, the decoding processing may operate to decode an LDPC coded signal having a common code rate and modulation for all of the symbols contained therein. This diagram shows yet another embodiment where one or more of the various aspects of the invention may be found.

Figure 7:
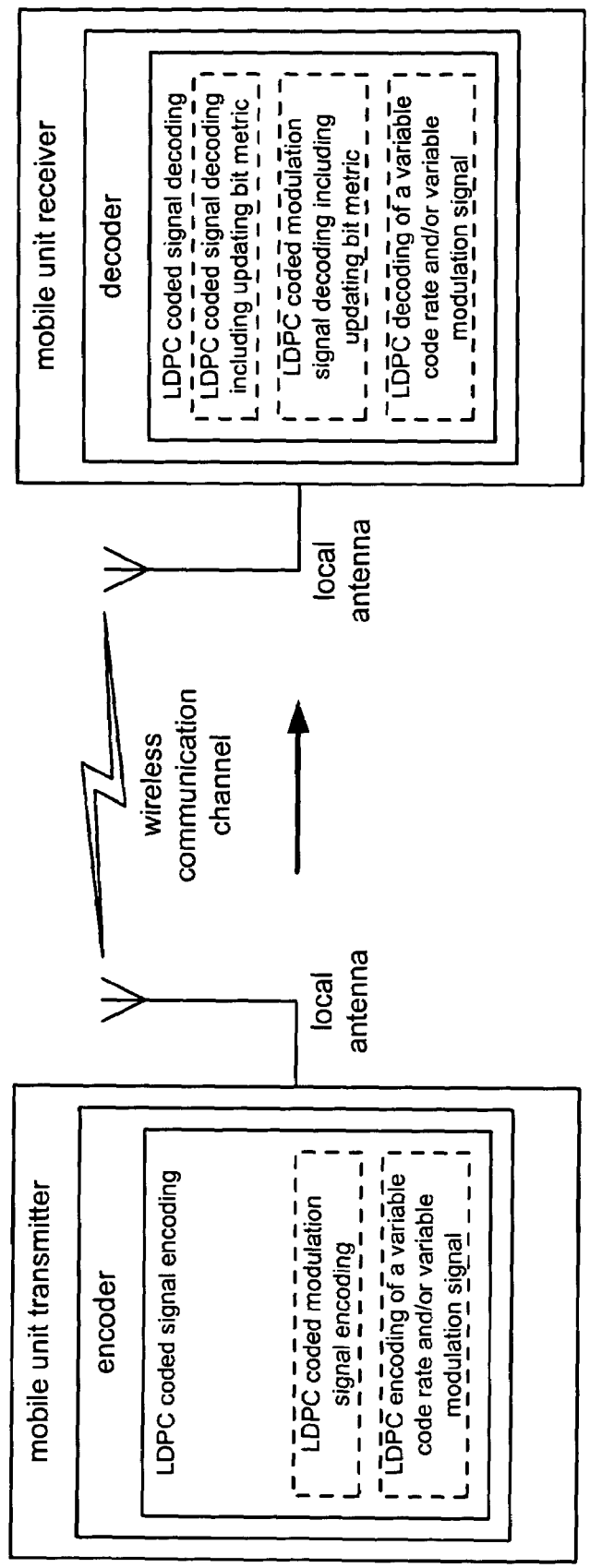
FIG. 7 is a system diagram illustrating an embodiment of a uni-directional point-to-point radio communication system that is built according to the invention.

FIG. 7 is a system diagram illustrating an embodiment of a uni-directional point-to-point radio communication system, that is built according to the invention, where the communication goes from a mobile unit transmitter to a mobile unit receiver via the wireless communication channel.

A mobile unit transmitter includes a local antenna communicatively coupled thereto. The mobile unit transmitter, using its local antenna, transmits a signal to a local antenna of a mobile unit receiver via a wireless communication channel.

The mobile unit transmitter is operable to encode information (using an encoder) that is to be transmitted to the mobile unit receiver; the mobile unit receiver is operable to decode the transmitted signal (using a decoder).

As within other embodiments that employ an encoder, the encoder may be implemented to perform LDPC coded signal encoding. The LDPC coded signal encoding may involve LDPC coded modulation signal encoding. In addition, the LDPC coded signal encoding may involve LDPC encoding of a variable code rate and/or variable modulation signal whose code rate and/or modulation may vary as frequently as on a symbol by symbol basis without departing from the scope and spirit of the invention. Any one or both of the code rate and modulation (including constellation and mapping) of the symbols may vary as frequently as on a symbol by symbol basis. The encoding may be performed using combined LDPC encoding and modulation encoding to generate the LDPC signal sequence to be transmitted.

As within other embodiments that employ a decoder, the decoder may be implemented to perform decoding of LDPC coded signals. This LDPC decoding may be implemented to perform updating of the bit metric employed within the iterative decoding processing. This decoding processing is also operable to decode an LDPC coded modulation signal. Moreover, the decoding processing is also operable to decode an LDPC variable code rate and/or variable modulation signal whose code rate and/or modulation (including constellation and mapping) may vary as frequently as on a symbol by symbol basis. In addition, the decoding processing may operate to decode an LDPC coded signal having a common code rate and modulation for all of the symbols contained therein. This diagram shows yet another embodiment where one or more of the various aspects of the invention may be found.

Figure 8:
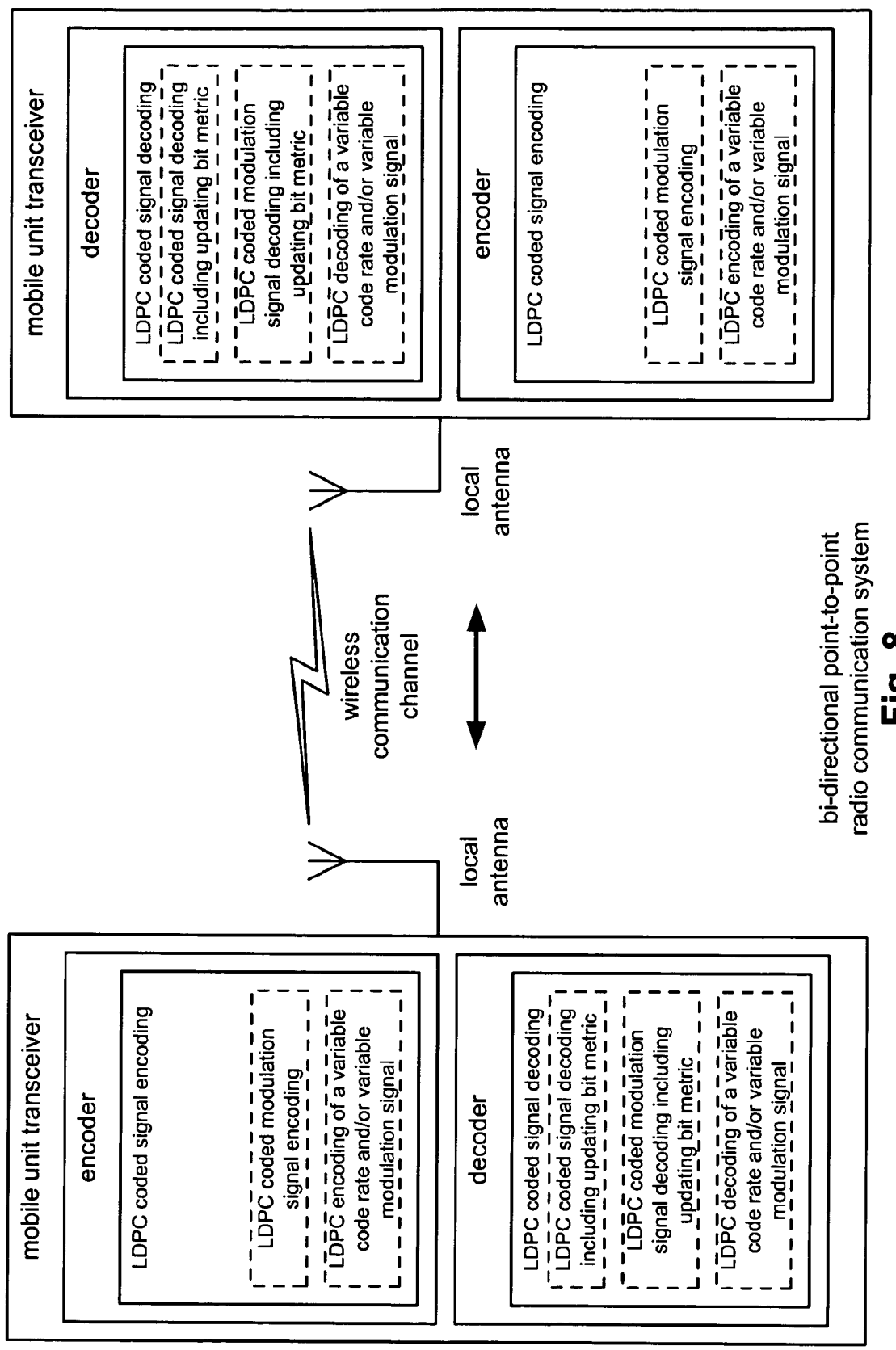
FIG. 8 is a system diagram illustrating an embodiment of a bi-directional point-to-point radio communication system that is built according to the invention.

FIG. 8 is a system diagram illustrating an embodiment of a bi-directional point-to-point radio communication system that is built according to the invention. Within this diagram, a first mobile unit transceiver is communicatively coupled to a first local antenna. The first mobile unit transceiver, using the first local antenna (the first mobile unit transceiver's local antenna), transmits a signal to a second local antenna of a second mobile unit transceiver via a wireless communication channel. The second mobile unit transceiver is communicatively coupled to the second local antenna (the second mobile unit transceiver's local antenna). The second local antenna is able to receive transmissions from the first local antenna that have been communicated via the communication channel. The reverse communication operation may also be performed using the first and second mobile unit transceivers.

Each mobile unit transceiver is operable to encode information (using its corresponding encoder) that is to be transmitted to the other mobile unit transceiver; each mobile unit transceiver is operable to decode the transmitted signal (using its corresponding decoder) that it receives.

As within other embodiments that employ an encoder, the encoder of either of the mobile unit transceivers may be implemented to perform LDPC coded signal encoding. The LDPC coded signal encoding may involve LDPC coded modulation signal encoding. In addition, the LDPC coded signal encoding may involve LDPC encoding of a variable code rate and/or variable modulation signal whose code rate and/or modulation may vary as frequently as on a symbol by symbol basis without departing from the scope and spirit of the invention. Any one or both of the code rate and modulation (including constellation and mapping) of the symbols may vary as frequently as on a symbol by symbol basis. The encoding may be performed using combined LDPC encoding and modulation encoding to generate the LDPC signal sequence to be transmitted.

As within other embodiments that employ a decoder, the decoder of either of the mobile unit transceivers may be implemented to perform decoding of LDPC coded signals. This LDPC decoding may be implemented to perform updating of the bit metric employed within the iterative decoding processing. This decoding processing is also operable to decode an LDPC coded modulation signal. Moreover, the decoding processing is also operable to decode an LDPC variable code rate and/or variable modulation signal whose code rate and/or modulation (including constellation and mapping) may vary as frequently as on a symbol by symbol basis. In addition, the decoding processing may operate to decode an LDPC coded signal having a common code rate and modulation for all of the symbols contained therein. This diagram shows yet another embodiment where one or more of the various aspects of the invention may be found.

Figure 9:
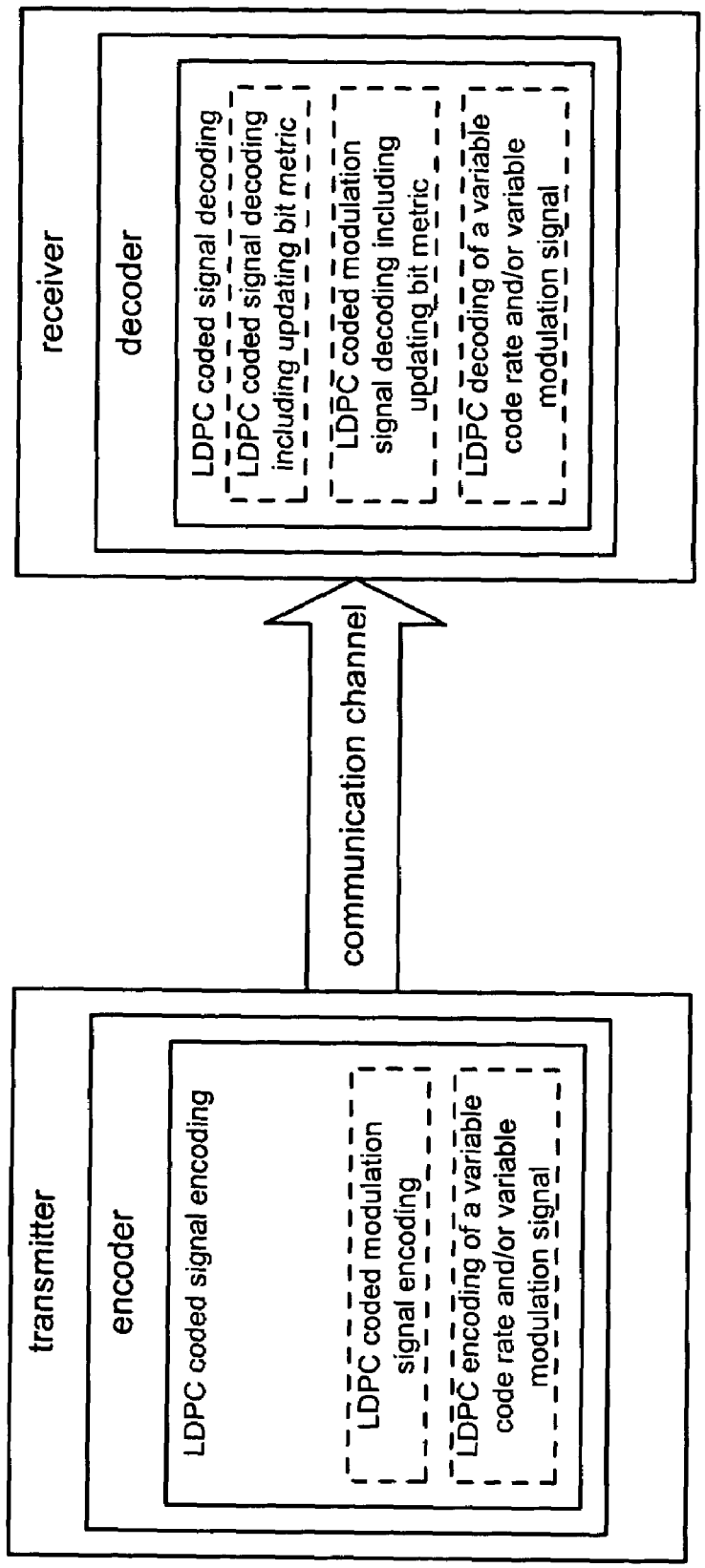
FIG. 9 is a system diagram illustrating an embodiment of a uni-directional communication system that is built according to the invention.

FIG. 9 is a system diagram illustrating an embodiment of a uni-directional communication system that is built according to the invention. A transmitter communicates to a receiver via a uni-directional communication channel. The uni-directional communication channel may be a wireline (or wired) communication channel or a wireless communication channel without departing from the scope and spirit of the invention. The wired media by which the uni-directional communication channel may be implemented are varied, including coaxial cable, fiber-optic cabling, and copper cabling, among other types of "wiring." Similarly, the wireless manners in which the uni-directional communication channel may be implemented are varied, including satellite communication, cellular communication, microwave communication, and radio communication, among other types of wireless communication.

The transmitter is operable to encode information (using an encoder) that is to be transmitted to the receiver; the receiver is operable to decode the transmitted signal (using a decoder).

As within other embodiments that employ an encoder, the encoder may be implemented to perform LDPC coded signal encoding. The LDPC coded signal encoding may involve LDPC coded modulation signal encoding. In addition, the LDPC coded signal encoding may involve LDPC encoding of a variable code rate and/or variable modulation signal whose code rate and/or modulation may vary as frequently as on a symbol by symbol basis without departing from the scope and spirit of the invention. Any one or both of the code rate and modulation (including constellation and mapping) of the symbols may vary as frequently as on a symbol by symbol basis. The encoding may be performed using combined LDPC encoding and modulation encoding to generate the LDPC signal sequence to be transmitted.

As within other embodiments that employ a decoder, the decoder may be implemented to perform decoding of LDPC coded signals. This LDPC decoding may be implemented to perform updating of the bit metric employed within the iterative decoding processing. This decoding processing is also operable to decode an LDPC coded modulation signal. Moreover, the decoding processing is also operable to decode an LDPC variable code rate and/or variable modulation signal whose code rate and/or modulation (including constellation and mapping) may vary as frequently as on a symbol by symbol basis. In addition, the decoding processing may operate to decode an LDPC coded signal having a common code rate and modulation for all of the symbols contained therein. This diagram shows yet another embodiment where one or more of the various aspects of the invention may be found.

Figure 10:
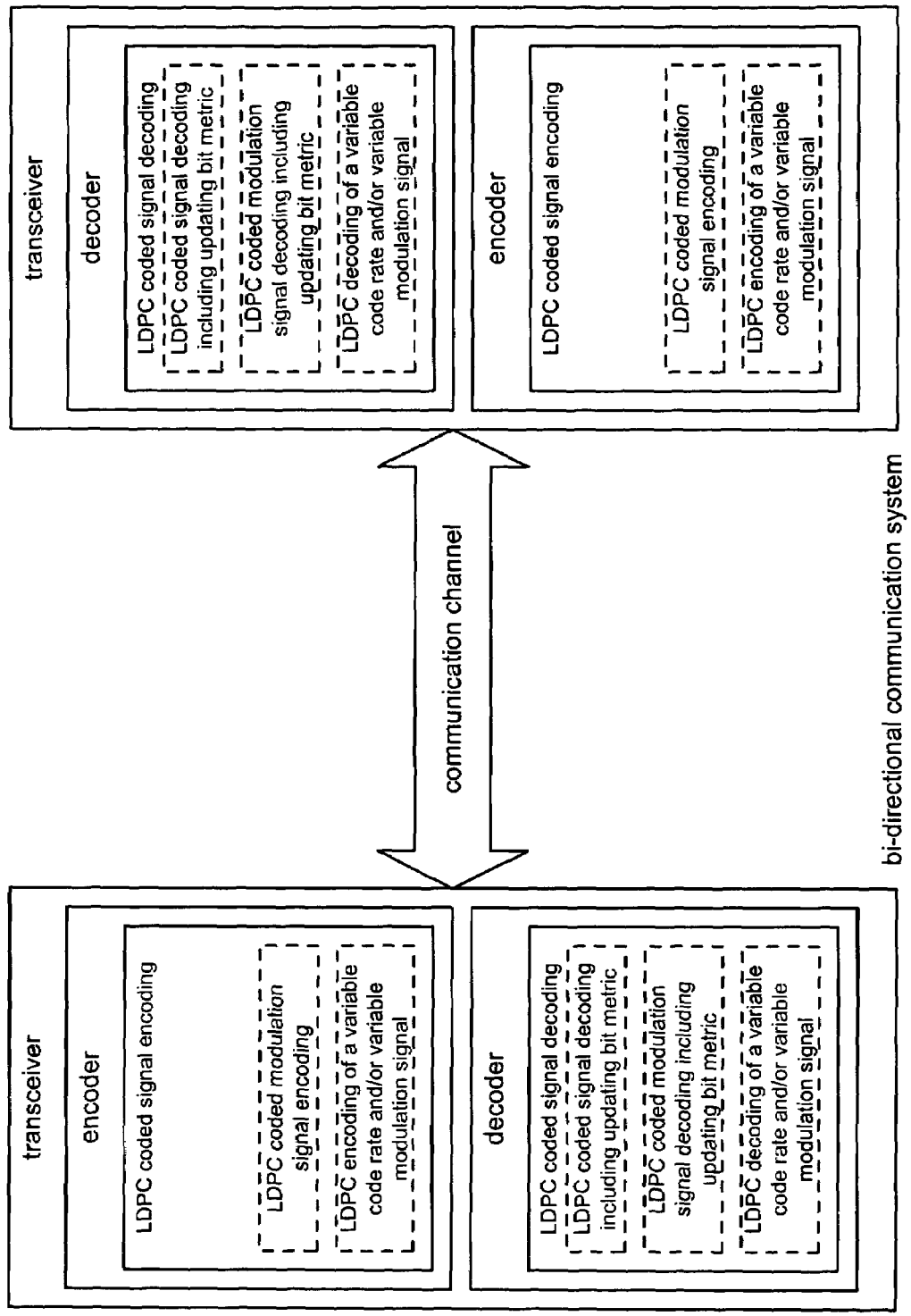
FIG. 10 is a system diagram illustrating an embodiment of a bi-directional communication system that is built according to the invention.

FIG. 10 is a system diagram illustrating an embodiment of a bi-directional communication system that is built according to the invention. Within this diagram, a first transceiver is communicatively coupled to a second transceiver via a bi-directional communication channel. The bi-directional communication channel may be a wireline (or wired) communication channel or a wireless communication channel without departing from the scope and spirit of the invention. The wired media by which the bi-directional communication channel may be implemented are varied, including coaxial cable, fiber-optic cabling, and-copper cabling, among other types of "wiring." Similarly, the wireless manners in which the bi-directional communication channel may be implemented are varied, including satellite communication, cellular communication, microwave communication, and radio communication, among other types of wireless communication.

Each of the transceivers is operable to encode information (using its corresponding encoder) that is to be transmitted to the other transceiver; each transceiver is operable to decode the transmitted signal (using its corresponding decoder) that it receives.

As within other embodiments that employ an encoder, the encoder of either of the transceivers may be implemented to perform LDPC coded signal encoding. The LDPC coded signal encoding may involve LDPC coded modulation signal encoding. In addition, the LDPC coded signal encoding may involve LDPC encoding of a variable code rate and/or variable modulation signal whose code rate and/or modulation may vary as frequently as on a symbol by symbol basis without departing from the scope and spirit of the invention. Any one or both of the code rate and modulation (including constellation and mapping) of the symbols may vary as frequently as on a symbol by symbol basis. The encoding may be performed using combined LDPC encoding and modulation encoding to generate the LDPC signal sequence to be transmitted.

As within other embodiments that employ a decoder, the decoder of either of the transceivers may be implemented to perform decoding of LDPC coded signals. This LDPC decoding may be implemented to perform updating of the bit metric employed within the iterative decoding processing. This decoding processing is also operable to decode an LDPC coded modulation signal. Moreover, the decoding processing is also operable to decode an LDPC variable code rate and/or variable modulation signal whose code rate and/or modulation (including constellation and mapping) may vary as frequently as on a symbol by symbol basis. In addition, the decoding processing may operate to decode an LDPC coded signal having a common code rate and modulation for all of the symbols contained therein. This diagram shows yet another embodiment where one or more of the various aspects of the invention may be found.

Figure 11:
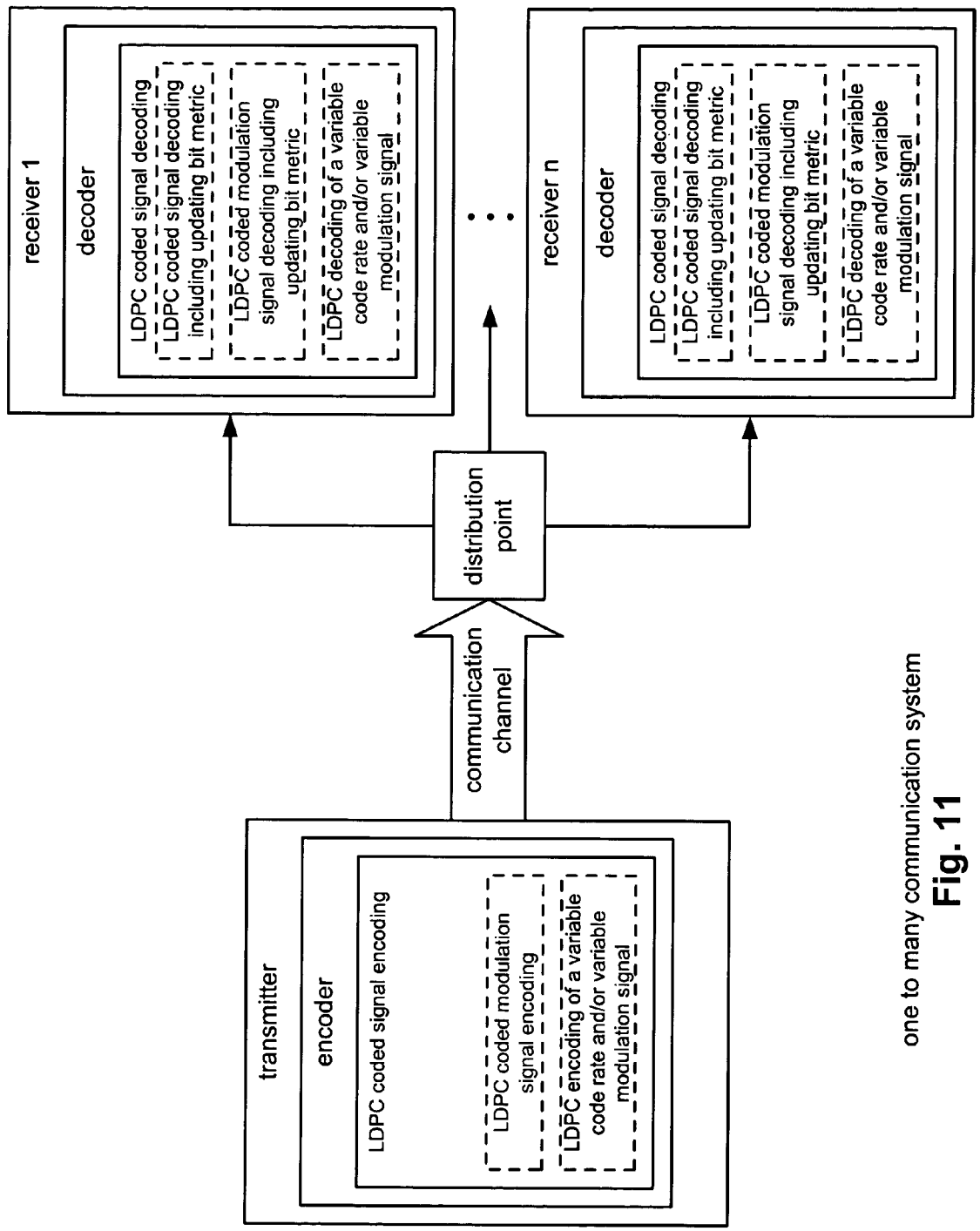
FIG. 11 is a system diagram illustrating an embodiment of a one to many communication system that is built according to the invention.

FIG. 11 is a system diagram illustrating an embodiment of a one to many communication system that is built according to the invention. A transmitter is able to communicate, via broadcast in certain embodiments, with a number of receivers, shown as receivers 1, . . . , n via a uni-directional communication channel. The uni-directional communication channel may be a wireline (or wired) communication channel or a wireless communication channel without departing from the scope and spirit of the invention. The wired media by which the bi-directional communication channel may be implemented are varied, including coaxial cable, fiber-optic cabling, and copper cabling, among other types of "wiring." Similarly, the wireless manners in which the bi-directional communication channel may be implemented are varied, including satellite communication, cellular communication, microwave communication, and radio communication, among other types of wireless communication.

A distribution point is employed within the one to many communication system to provide the appropriate communication to the receivers 1, . . . , and n. In certain embodiments, the receivers 1, . . . , and n each receive the same communication and individually discern which portion of the total communication is intended for them.

The transmitter is operable to encode information (using an encoder) that is to be transmitted to the receivers 1, . . . , and n; each of the receivers 1, . . . , and n is operable to decode the transmitted signal (using a decoder).

As within other embodiments that employ an encoder, the encoder may be implemented to perform LDPC coded signal encoding. The LDPC coded signal encoding may involve LDPC coded modulation signal encoding. In addition, the LDPC coded signal encoding may involve LDPC encoding of a variable code rate and/or variable modulation signal whose code rate and/or modulation may vary as frequently as on a symbol by symbol basis without departing from the scope and spirit of the invention. Any one or both of the code rate and modulation (including constellation and mapping) of the symbols may vary as frequently as on a symbol by symbol basis. The encoding may be performed using combined LDPC encoding and modulation encoding to generate the LDPC signal sequence to be transmitted.

As within other embodiments that employ a decoder, the decoder of any of the receivers 1, . . . , and n may be implemented to perform decoding of LDPC coded signals. This LDPC decoding may be implemented to perform updating of the bit metric employed within the iterative decoding processing. This decoding processing is also operable to decode an LDPC coded modulation signal. Moreover, the decoding processing is also operable to decode an LDPC variable code rate and/or variable modulation signal whose code rate and/or modulation (including constellation and mapping) may vary as frequently as on a symbol by symbol basis. In addition, the decoding processing may operate to decode an LDPC coded signal having a common code rate and modulation for all of the symbols contained therein. This diagram shows yet another embodiment where one or more of the various aspects of the invention may be found.

Figure 12:
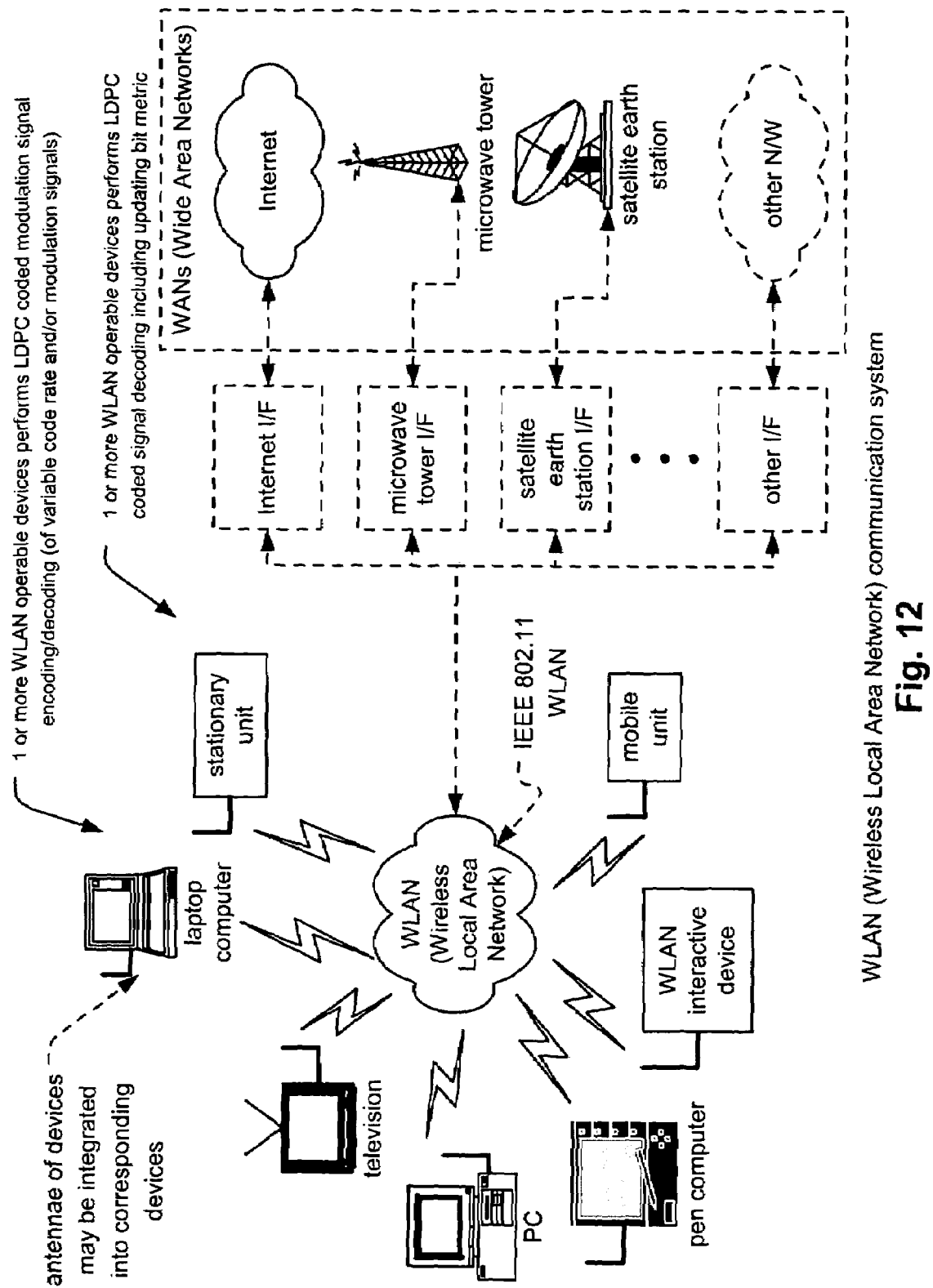
FIG. 12 is a diagram illustrating an embodiment of a WLAN (Wireless Local Area Network) that may be implemented according to the invention.

FIG. 12 is a diagram illustrating an embodiment of a WLAN (Wireless Local Area Network) that may be implemented according to the invention. The WLAN communication system may be implemented to include a number of devices that are all operable to communicate with one another via the WLAN. For example, the various devices that each include the functionality to interface with the WLAN may include any 1 or more of a laptop computer, a television, a PC (Personal Computer), a pen computer (that may be viewed as being a PDA (Personal Digital Assistant) in some instances, a personal electronic planner, or similar device), a mobile unit (that may be viewed as being a telephone, a pager, or some other mobile WLAN operable device), and/or a stationary unit (that may be viewed as a device that typically resides in a single location within the WLAN). The antennae of the various WLAN interactive devices may be integrated into the corresponding devices without departing from the scope and spirit of the invention as well.

This illustrated group of devices that may interact with the WLAN is not intended to be an exhaustive list of device that may interact with a WLAN, and a generic device shown as a WLAN interactive device represents a generic device that includes the functionality in order to interactive with the WLAN itself and/or the other devices that are associated with the WLAN. Any one of these devices that associate with the WLAN may be viewed generically as being a WLAN interactive device without departing from the scope and spirit of the invention. Each of the devices and the WLAN interactive device may be viewed as being located at nodes of the WLAN.

It is also noted that the WLAN itself may also include functionality to allow interfacing with other networks as well. These external networks may generically be referred to as WANs (Wide Area Networks). For example, the WLAN may include an Internet I/F (interface) that allows for interfacing to the Internet itself. This Internet I/F may be viewed as being a base station device for the WLAN that allows any one of the WLAN interactive devices to access the Internet.

It is also noted that the WLAN may also include functionality to allow interfacing with other networks (e.g., other WANs) besides simply the Internet. For example, the WLAN may include a microwave tower I/F that allows for interfacing to a microwave tower thereby allowing communication with one or more microwave networks. Similar to the Internet I/F described above, the microwave tower I/F may be viewed as being a base station device for the WLAN that allows any one of the WLAN interactive devices to access the one or more microwave networks via the microwave tower.

Moreover, the WLAN may include a satellite earth station I/F that allows for interfacing to a satellite earth station thereby allowing communication with one or more satellite networks. The satellite earth station I/F may be viewed as being a base station device for the WLAN that allows any one of the WLAN interactive devices to access the one or more satellite networks via the satellite earth station I/F.

This finite listing of various network types that may interface to the WLAN is also not intended to be exhaustive. For example, any other network may communicatively couple to the WLAN via an appropriate I/F that includes the functionality for any one of the WLAN interactive devices to access the other network.

Any of the various WLAN interactive devices described within this embodiment may include an encoder and a decoder to allow bi-directional communication with the other WLAN interactive device and/or the WANs.

Again, as within other embodiments described herein that employ an encoder, the encoder of any of the WLAN interactive devices may be implemented to perform encoding using LDPC coded modulation. The LDPC encoding may be performed to generate an LDPC variable code rate and/or modulation signal whose code rate and/or modulation may vary as frequently as on a symbol by symbol basis. Any one or both of the code rate and modulation (including constellation and/or mapping) of the symbols may vary as frequently as on a symbol by symbol basis. The encoding may be performed using combined LDPC encoding and modulation encoding to generate the LDPC signal sequence to be transmitted.

As within other embodiments that employ a decoder, the decoder of any of the WLAN interactive devices may be implemented to perform decoding of LDPC coded signals. This LDPC decoding may be implemented to perform updating of the bit metric employed within the iterative decoding processing. This decoding processing is also operable to decode an LDPC variable code rate and/or modulation signal whose code rate and/or modulation (including constellation and/or mapping) may vary as frequently as on a symbol by symbol basis. In addition, the decoding processing may operate to decode an LDPC coded signal having a common code rate and modulation for all of the symbols contained therein. This diagram shows yet another embodiment where one or more of the various aspects of the invention may be found.

In general, any one of the WLAN interactive devices may be characterized as being an IEEE (Institute of Electrical & Electronics Engineers) 802.11 operable device. For example, such an 802.11 operable device may be an 802.11a operable device, an 802.11b operable device, or an 802.11g operable device. The IEEE 802.11g specification extends the rates for packet transmission in the 2.4 GHz frequency band. This is achieved by allowing packets, also known as frames, of two distinct types to coexist in this band. Frames utilizing DSSS/CCK (Direct Sequence Spread Spectrum with Complementary Code Keying) have been specified for transmission in the 2.4 GHz band at rates up to 11 Mbps (Mega-bits per second) as part of the 802.11b standard. The 802.11a standard uses a different frame format with OFDM (Orthogonal Frequency Division Multiplexing) to transmit at rates up to 54 Mbps with carrier frequencies in the 5 GHz range. The 802.11g specification allows for such OFDM frames to coexist with DSSS/CCK frames at 2.4 GHz.

Figure 13:
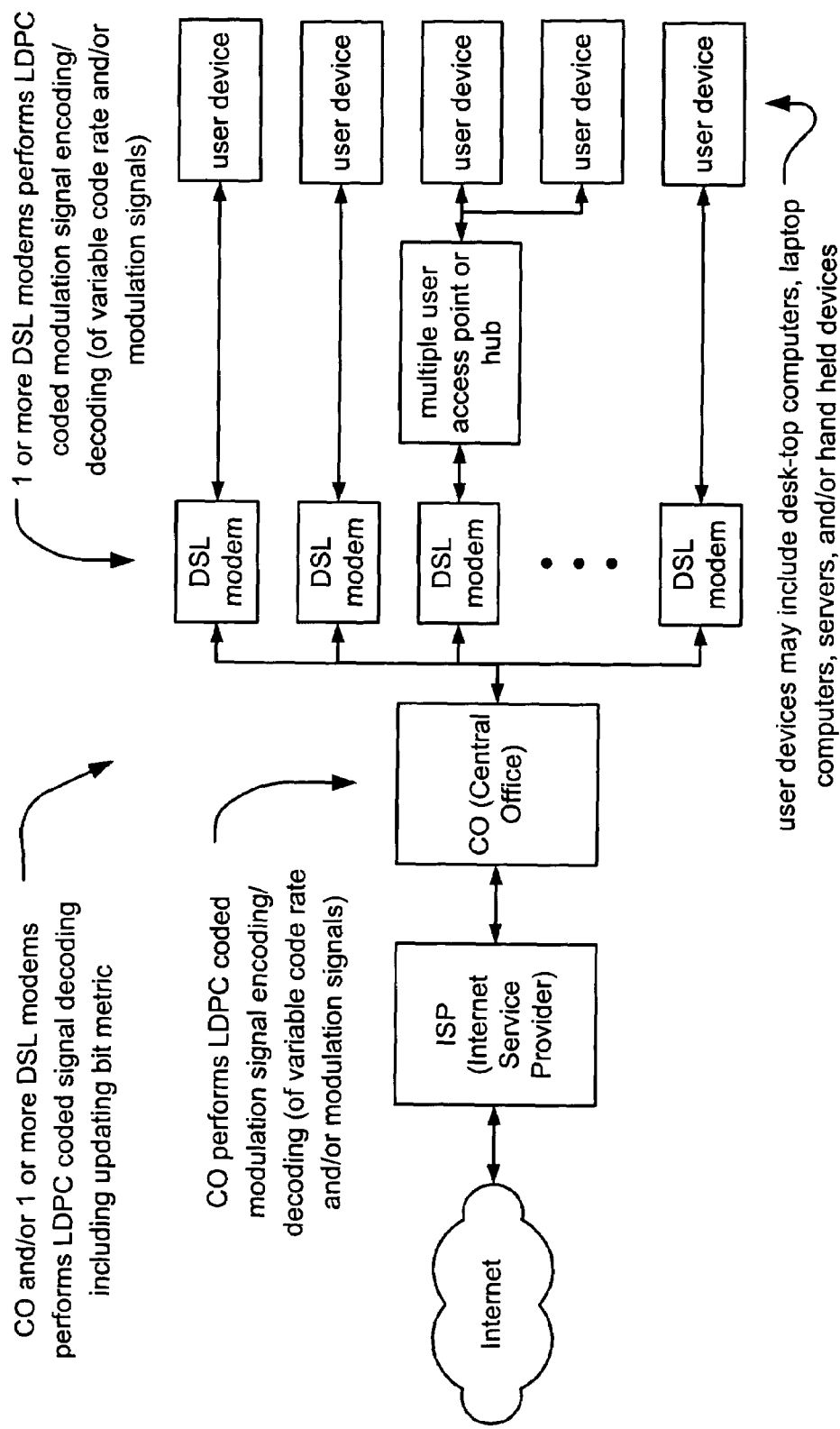
FIG. 13 is a diagram illustrating an embodiment of a DSL (Digital Subscriber Line) communication system that may be implemented according to the invention.

FIG. 13 is a diagram illustrating an embodiment of a DSL (Digital Subscriber Line) communication system that may be implemented according to the invention. The DSL communication system includes an interfacing to the Internet (or some other WAN). In this diagram, the Internet itself is shown, but other WANs may also be employed without departing from the scope and spirit of the invention. An ISP (Internet Service Provider) is operable to communicate data to and from the Internet. The ISP communicatively couples to a CO (Central Office) that is typically operated by a telephones service company. The CO may also allow provide telephone services to one or more subscribers. However, the CO may also be implemented to allow interfacing of Internet traffic to and from one or more users (whose interactive devices are shown as user devices). These user devices may be a wide variety of devices including desk-top computers, laptop computers, servers, and/or hand held devices without departing from the scope and spirit of the invention. Any of these user devices may be wired or wireless typed devices as well. Each of the user devices is operably coupled to the CO via a DSL modem. The DSL modem may also be communicatively coupled to a multiple user access point or hub to allow more than one user device to access the Internet.

The CO and the various DSL modems may also be implemented to include an encoder and a decoder to allow bi-directional communication therein. For example, the CO is operable to encode and decode data when communicating to and from the various DSL modems and the ISP. Similarly, each of the various DSL modems is operable to encode and decode data when communicating to and from the CO and its respective one or more user devices.

Again, as within other embodiments described herein that employ an encoder, the encoder of any of the CO and the various DSL modems may be implemented to perform encoding using LDPC coded modulation. The LDPC encoding may be performed to generate an LDPC variable code rate and/or modulation signal whose code rate and/or modulation may vary as frequently as on a symbol by symbol basis. Any one or both of the code rate and modulation (including constellation and/or mapping) of the symbols may vary as frequently as on a symbol by symbol basis. The encoding may be performed using combined LDPC encoding and modulation encoding to generate the LDPC signal sequence to be transmitted.

As within other embodiments that employ a decoder, the decoder of any of the CO and the various DSL modems may be implemented to perform decoding of LDPC coded signals. This LDPC decoding may be implemented to perform updating of the bit metric employed within the iterative decoding processing. This decoding processing is also operable to decode an LDPC variable code rate and/or modulation signal whose code rate and/or modulation (including constellation and/or mapping) may vary as frequently as on a symbol by symbol basis. In addition, the decoding processing may operate to decode an LDPC coded signal having a common code rate and modulation for all of the symbols contained therein. This diagram shows yet another embodiment where one or more of the various aspects of the invention may be found.

Figure 14:
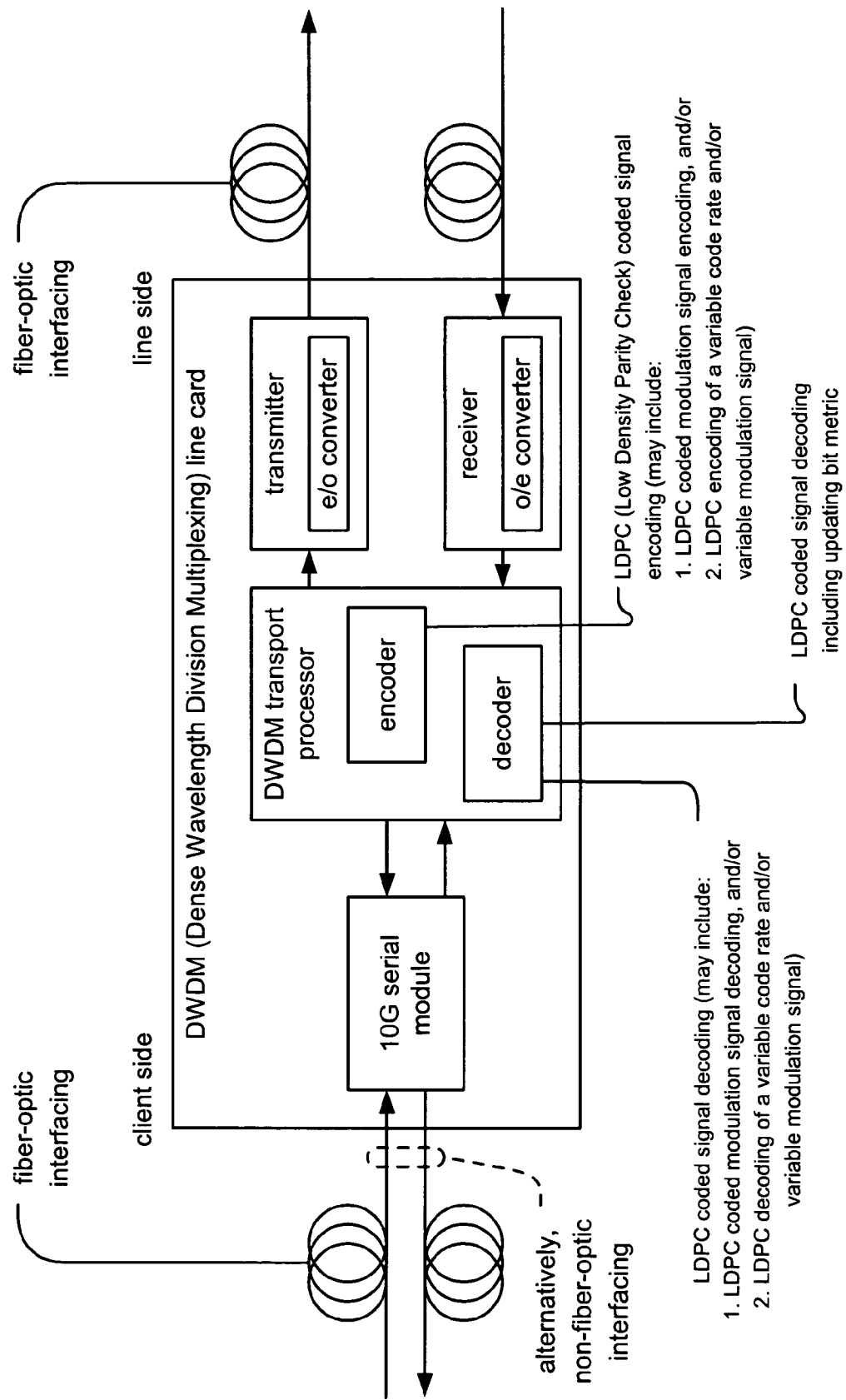
FIG. 14 is a system diagram illustrating an embodiment of a fiber-optic communication system that is built according to the invention.

FIG. 14 is a system diagram illustrating an embodiment of a fiber-optic communication system that is built according to the invention. The fiber-optic communication system may be implemented to support LDPC encoding. In addition, the fiber-optic communication system may be implemented to support LDPC decoding.

The fiber-optic communication system includes a DWDM (Dense Wavelength Division Multiplexing (within the context of fiber optic communications)) line card that is interposed between a line side and a client side. DWDM is a technology that has gained increasing interest recently. From both technical and economic perspectives, the ability to provide potentially unlimited transmission capacity is the most obvious advantage of DWDM technology. The current investment already made within fiber-optic infrastructure can not only be preserved when using DWDM, but it may even be optimized by a factor of at least 32. As demands change, more capacity can be added, either by simple equipment upgrades or by increasing the number of wavelengths (lambdas) on the fiber-optic cabling itself, without expensive upgrades. Capacity can be obtained for the cost of the equipment, and existing fiber plant investment is retained. From the bandwidth perspective, some of the most compelling technical advantage of DWDM can be summarized as follows:

The transparency of DWDM: Because DWDM is a physical layer architecture (PHY), it can transparently support both TDM (Time Division Multiplexing) and data formats such as ATM (asynchronous transfer mode), Gigabit Ethernet, ESCON, and Fibre Channel with open interfaces over a common physical layer.

The scalability of DWDM: DWDM can leverage the abundance of dark fiber in many metropolitan area and enterprise networks to quickly meet demand for capacity on point-to-point links and on spans of existing SONET/SDH rings.

The dynamic provisioning capabilities of DWDM: the fast, simple, and dynamic provisioning of network connections give providers the ability to provide high-bandwidth services in days rather than months.

Fiber-optic interfacing is employed at each of the client and line sides of the DWDM line card. The DWDM line card includes a transport processor that includes functionality to support DWDM long haul transport, DWDM metro transport, next-generation SONET/SDH multiplexers, digital cross-connects, and fiber-optic terminators and test equipment. On the line side, the DWDM line card includes a transmitter, that is operable to perform electrical to optical conversion for interfacing to an optical medium, and a receiver, that is operable to perform optical to electrical conversion for interfacing from the optical medium. On the client side, the DWDM line card includes a 10G serial module that is operable to communicate with any other devices on the client side of the fiber-optic communication system using a fiber-optic interface. Alternatively, the interface may be implemented using non-fiber-optic media, including copper cabling and/or some other type of interface medium.

The DWDM transport processor of the DWDM line card includes a decoder that is used to decode received signals from either one or both of the line and client sides and an encoder that is used to encode signals to be transmitted to either one or both of the line and client sides.

As within other embodiments that employ an encoder, the encoder may be implemented to perform LDPC coded signal encoding. The LDPC coded signal encoding may involve LDPC coded modulation signal encoding. In addition, the LDPC coded signal encoding may involve LDPC encoding of a variable code rate and/or variable modulation signal whose code rate and/or modulation may vary as frequently as on a symbol by symbol basis without departing from the scope and spirit of the invention. Any one or both of the code rate and modulation (including constellation and mapping) of the symbols may vary as frequently as on a symbol by symbol basis. The encoding may be performed using combined LDPC encoding and modulation encoding to generate the LDPC signal sequence to be transmitted.

As within other embodiments that employ a decoder, the decoder may be implemented to perform decoding of LDPC coded signals. This LDPC decoding may be implemented to perform updating of the bit metric employed within the iterative decoding processing. This decoding processing is also operable to decode an LDPC coded modulation signal. Moreover, the decoding processing is also operable to decode an LDPC variable code rate and/or variable modulation signal whose code rate and/or modulation (including constellation and mapping) may vary as frequently as on a symbol by symbol basis. In addition, the decoding processing may operate to decode an LDPC coded signal having a common code rate and modulation for all of the symbols contained therein. This diagram shows yet another embodiment where one or more of the various aspects of the invention may be found.

Figure 15:
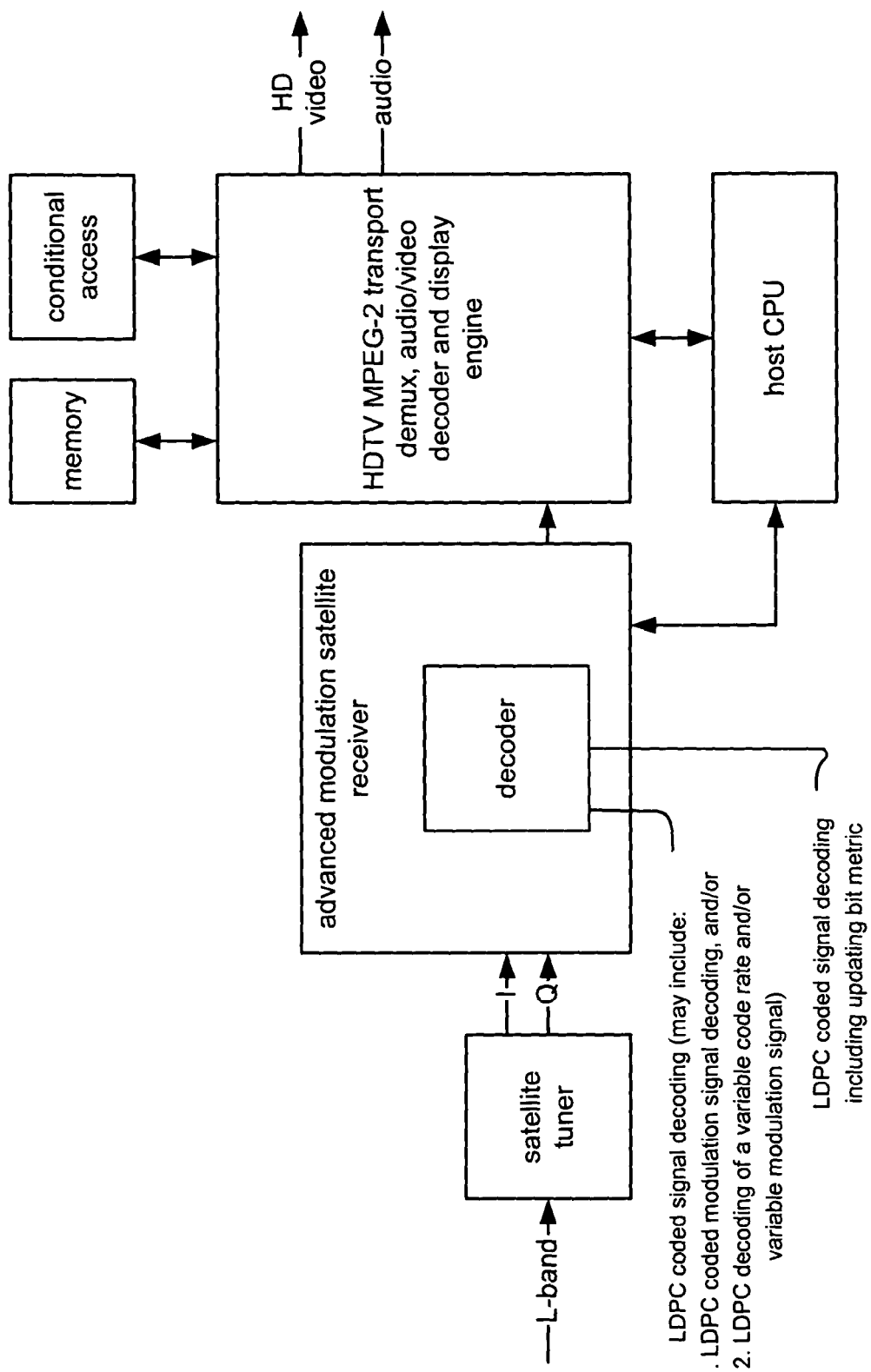
FIG. 15 is a system diagram illustrating an embodiment of a satellite receiver STB (Set Top Box) system that is built according to the invention.

FIG. 15 is a system diagram illustrating an embodiment of a satellite receiver STB (Set Top Box) system that is built according to the invention. The satellite receiver STB system includes an advanced modulation satellite receiver that is implemented in an all digital architecture. Moreover, the advanced modulation satellite receiver may be implemented within a single integrated circuit in some embodiments. The satellite receiver STB system includes a satellite tuner that receives a signal via the L-band. The satellite tuner extracts I,Q (in-phase and quadrature) components from a signal received from the L-band and provides them to the advanced modulation satellite receiver. The advanced modulation satellite receiver includes a decoder.

As within other embodiments that employ a decoder, the decoder may be implemented to perform decoding of LDPC coded signals. This LDPC decoding may be implemented to perform updating of the bit metric employed within the iterative decoding processing. This decoding processing is also operable to decode an LDPC coded modulation signal. Moreover, the decoding processing is also operable to decode an LDPC variable code rate and/or variable modulation signal whose code rate and/or modulation (including constellation and mapping) may vary as frequently as on a symbol by symbol basis. In addition, the decoding processing may operate to decode an LDPC coded signal having a common code rate and modulation for all of the symbols contained therein.

The advanced modulation satellite receiver may be implemented to communicatively couple to an HDTV MPEG-2 (Motion Picture Expert Group) transport de-mux, audio/video decoder and display engine. The advanced modulation satellite receiver and the HDTV MPEG-2 transport de-mux, audio/video decoder and display engine communicatively couple to a host CPU (Central Processing Unit). The HDTV MPEG-2 transport de-mux, audio/video decoder and display engine also communicatively couples to a memory module and a conditional access functional block. The HDTV MPEG-2 transport de-mux, audio/video decoder and display engine provides HD (High Definition) video and audio output that may be provided to an HDTV display.

The advanced modulation satellite receiver may be implemented as a single-chip digital satellite receiver supporting the decoder that performs decoding of LDPC coded signals according to the invention. The advanced modulation satellite receiver is operable to receive communication provided to it from a transmitter device that includes an encoder as well.

In the following, several of the following Figures describe particular embodiments that may be used to implement some of the various aspects of the LDPC encoding and/or LDPC decoding according to the invention. Again, this may involve processing LDPC variable code rate and/or modulation signals whose code rate and/or modulation (including constellation and mapping) may vary as frequently as on a symbol by symbol basis. Further details of these various aspects of the invention are provided below.

Figure 16:
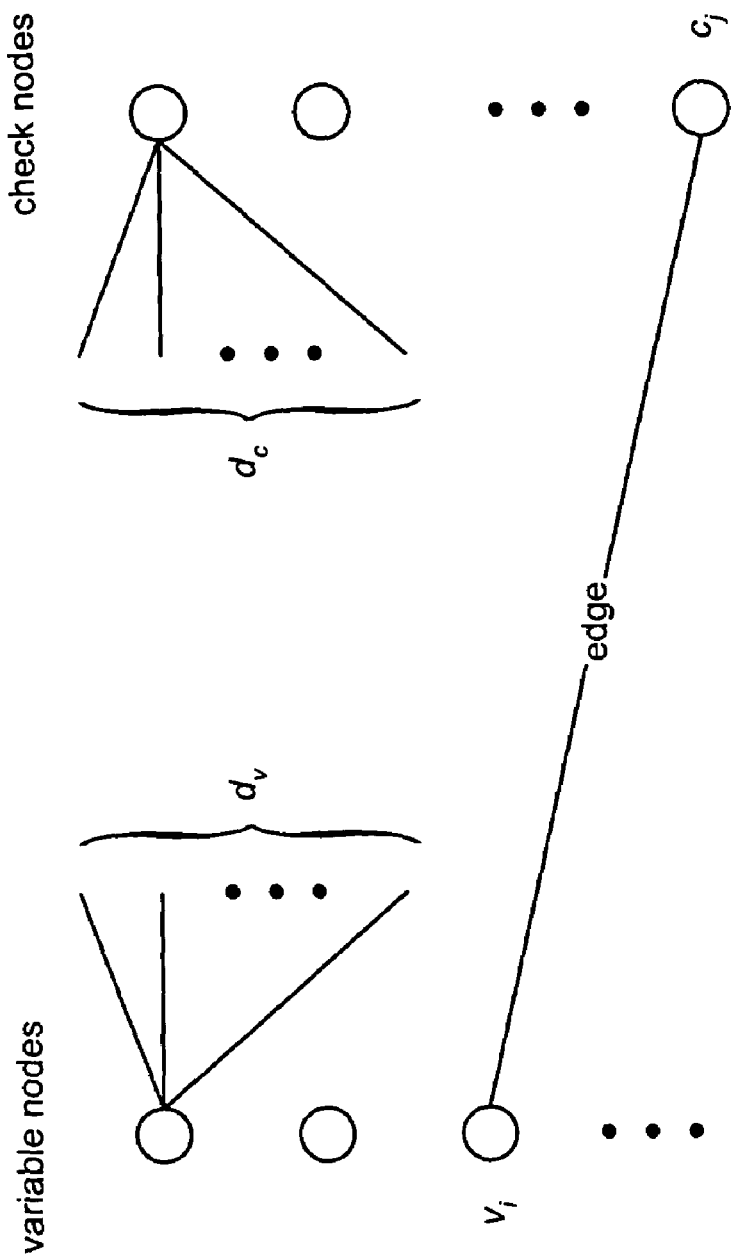
FIG. 16 is a diagram illustrating an embodiment of an LDPC (Low Density Parity Check) code bipartite graph that may be employed according to the invention.

FIG. 16 is a diagram illustrating an embodiment of an LDPC (Low Density Parity Check) code bipartite graph that may be employed according to the invention. An LDPC code may be viewed as being a code having a binary parity check matrix such that nearly all of the elements of the matrix have values of zero. For example, $H=(h_{i,j})_{M \times N}$ may be viewed as being a parity check matrix of an LDPC code with block length N. If every column of the matrix has $d_v$ 1's, and every row of the matrix has $d_c$ 1's, then this code is referred to as a $(d_v, d_c)$ regular LDPC code. For example, a regular (4,72) LDPC code would be viewed as being a code whose binary parity check matrix would have 4 1's in every column and 72 1's in every row. These regular LDPC codes were introduced in R. Gallager, *Low-Density Parity-Check Codes*, Cambridge, Mass.: MIT Press, 1963.

A regular LDPC code can be defined as a bipartite graph by its parity check matrix with left side nodes representing variable of the code bits, and the right side nodes representing check equations. The bipartite graph of the code defined by H may be defined by N variable nodes and M check nodes. Every variable node of the N variable nodes has exactly $d_v$ edges connecting this node to one or more of the check nodes (within the check M nodes). This number of $d_v$ edges may be referred to as the degree of a variable node. Analogously, every check node of the M check nodes has exactly $d_c$ edges connecting this node to one or more of the variable nodes. This number of $d_c$ edges may be referred to as the degree of a check node.

An edge between a variable node $v_i$ and check node $c_j$ may be defined by $e=(i, j)$. However, on the other hand, given an edge $e=(i, j)$, the nodes of the edge may alternatively be denoted as by $e=(v(e),c(e))$. Given a variable node $v_i$, one may define the set of edges emitting from the node $v_i$ by $E_v(i)=\{e|v(e)=i\}$. Given a check node $c_j$, one may define the set of edges emitting from the node $c_j$ by $E_c(j)=\{e|c(e)=j\}$. Continuing on, the derivative result will be $|E_v(i)|=d_v$ and $|E_c(j)|=d_c$.

An irregular LDPC code may also described using a bipartite graph. However, the degree of each set of nodes within an irregular LDPC code may be chosen according to some distribution. Therefore, for two different variable nodes, $v_{i_1}$ and $v_{i_2}$, of an irregular LDPC code, $|E_v(i_1)|$ may not equal to $|E_v(i_2)|$. This relationship may also hold true for two check nodes. The concept of irregular LDPC codes was originally introduced within M. Lugy, M. Mitzenmacher, A. Shokrollahi, D. Spielman and V. Stemann, "Practical loss-resilient codes," *IEEE Trans. Inform. Theory*, Vol. 47, pp. 569–584, February 2001.

In general, with a graph of an LDPC code, the parameters of an LDPC code can be defined by a degree of distribution, as described within M. Lugy, et al. (referenced above) and also within T. J. Richardson and R. L. Urbanke, "The capacity of low-density parity-check code under message-passing decoding," *IEEE Trans. Inform. Theory*, Vol. 47, pp. 599–618, February 2001. This distribution may be described as follows:

Let $\lambda_i$ represent the fraction of edges emanating from variable nodes of degree i and let $\rho_i$ represent the fraction of edges emanating from check nodes of degree i. Then, a degree distribution pair $(\lambda,\rho)$ is defined as follows:

$$\lambda(x) = \sum_{i=2}^{M_v} \lambda_i x^{i-1} \text{ and } \rho(x) = \sum_{i=2}^{M_c} \rho_i x^{i-1},$$

where $M_v$ and $M_c$ represent the maximal degrees for variable nodes and check nodes, respectively.

From certain perspectives, the invention involves combining modulation coding with LDPC coding. In addition, the invention is operable to employ variable signal modulation encoding (e.g., either one or both of variable constellation shape and/or mapping) in doing so. Up to now, there have been some attempts to combine modulation encoding with LDPC coding, yet they are all limited to employing only a single mapping of the symbols generated thereby. Some of the possible approaches to combine modulation coding and LDPC coding are described below.

Figure 17A:
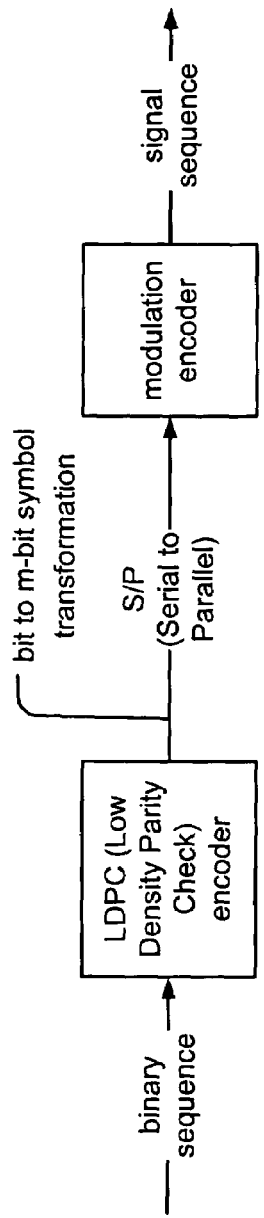
FIG. 17A is a diagram illustrating an embodiment of direct combining of LDPC (Low Density Parity Check) coding and modulation encoding.

FIG. 17A is a diagram illustrating an embodiment of direct combining of LDPC (Low Density Parity Check) coding and modulation encoding. A binary sequence (e.g., a bit stream) is provided to an LDPC (Low Density Parity Check) encoder. The LDPC encoder introduces a degree of redundancy (or parity) within the bit sequence provided thereto. These LDPC coded bits are then provided to a S/P (Serial to Parallel) path such that the output symbols may be provided to a modulation encoder. This S/P path performs the bit to m-bit symbol transformation. The modulation encoder outputs a signal sequence that includes symbols (composed of LDPC coded bits) that correspond to a modulation having a constellation and a mapping.

Figure 17B:
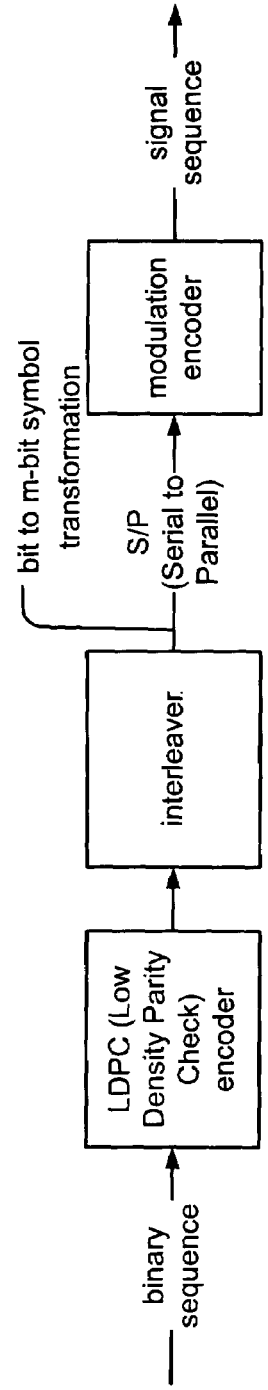
FIG. 17B is a diagram illustrating an embodiment of BICM (Bit Interleaved Coded Modulation) that is employed in conjunction with LDPC (Low Density Parity Check) coding and modulation encoding.

FIG. 17B is a diagram illustrating an embodiment of BICM (Bit Interleaved Coded Modulation) that is employed in conjunction with LDPC (Low Density Parity Check) coding and modulation encoding. This embodiment is similar to the embodiment described above that performs direct combining of LDPC coding and modulation encoding, with the exception that an interleaver is interposed between the LDPC encoder and the modulation encoder.

A binary sequence (e.g., a bit stream) is provided to an LDPC encoder. The LDPC encoder introduces a degree of redundancy (or parity) within the bit sequence provided thereto. These LDPC coded bits are then provided to an interleaver to generate a degree of randomness within the LDPC coded bits thereby (hopefully) making that LDPC coded bit sequence to be more robust to interference, noise, and other deleterious effects. This LDPC coded bit sequence that has been interleaved is then provided to a S/P (Serial to Parallel) path such that the output symbols may be provided to a modulation encoder. Again, this S/P path performs the bit to m-bit symbol transformation. The modulation encoder outputs a signal sequence that includes symbols (composed of the interleaved LDPC coded bits) that correspond to a modulation having a constellation and a mapping.

Figure 17C:
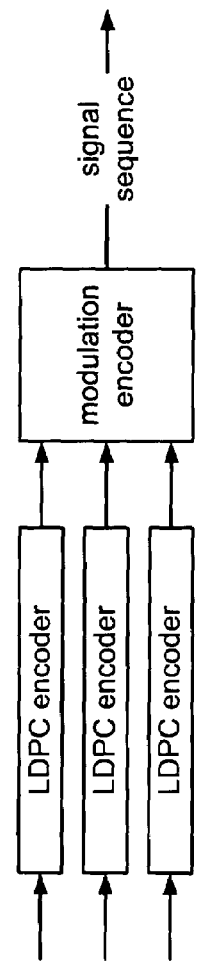
FIG. 17C is a diagram illustrating an embodiment of multilevel coded modulation encoding.

FIG. 17C is a diagram illustrating an embodiment of multilevel coded modulation encoding. Rather than require a S/P (Serial to Parallel) path between a single LDPC encoder and a modulation encoder, this embodiment shows a plurality of LDPC encoders operating in parallel such that the outputs of each of the LDPC encoder is already within parallel format (thereby obviating the need for the S/P (Serial to Parallel) path employed within the embodiments described above). The outputs of these LDPC encoders are provided to a modulation encoder. The modulation encoder outputs a signal sequence that includes symbols (composed of the LDPC coded bits provided by the various LDPC encoders) that correspond to a modulation having a constellation and a mapping.

All 3 of these embodiments, described above that perform the combination of LDPC coding and modulation encoding, typically operate using a single code rate and also use a single modulation (constellation and mapping) to map the binary bits to a given constellation. That is to say, they all typically employ a single code rate and a single modulation (having a single constellation type and a single mapping) for that single constellation. This approach inherently limits the maximal performance that may be achieved using these approaches. In contradistinction, the invention is operable to operate on LDPC coded signals having a code rate and/or a modulation (constellation and mapping) that may vary as frequently as on a symbol by symbol basis. To illustrate further the single modulation approach of these 3 embodiments, a specific implementation that performs such a single mapping is described below.

Figure 18A:
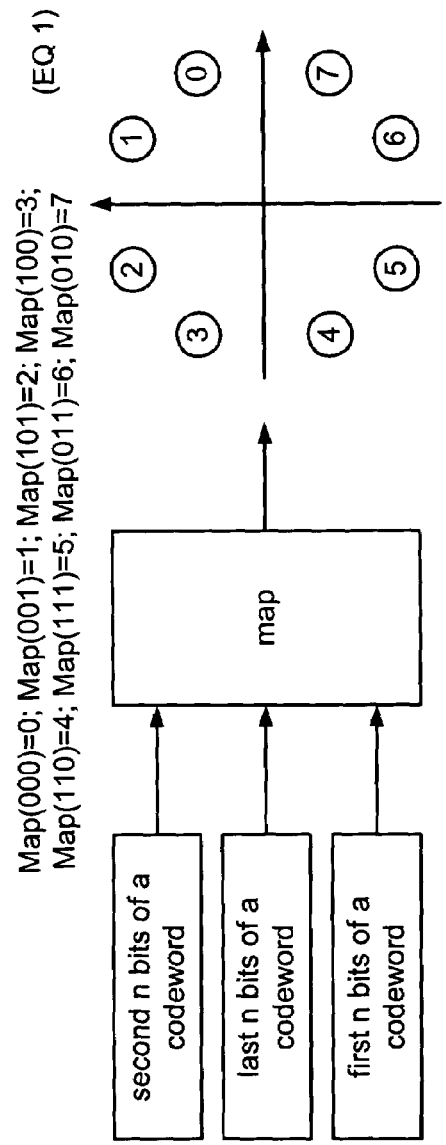
FIG. 18A is a diagram illustrating an embodiment of the HNS (Hughes Network System) proposal to the DVB (Digital Video Broadcasting Project) standard.

FIG. 18A is a diagram illustrating an embodiment of the HNS (Hughes Network System) proposal to the DVB (Digital Video Broadcasting Project) standard. The HNS proposal to the DVB standard is described in more detail within Hughes Network Systems, "Description LDPC and BCH Encoders," Proposal for DVB-S2.

The HNS proposal to DVB standard employs a rate 2/3 8 PSK (8 Phase Shift Key) modulation with LDPC code that is constructed as follows. The LDPC code used in the proposal is a rate 2/3 code with block length 2n, where the final n bits are redundancy (or parity) bits. Three (3) different LDPC encoders are employed. A first LDPC encoder employs the $2^{nd}$ n bits of a codeword. A second LDPC encoder employs the last n bits of a codeword, and a third LDPC encoder employs the $1^{st}$ n bits of a codeword. The LDPC coded bits from these 3 LDPC encoders are provided to a map (that may be viewed as being a modulation encoder). The bits provided thereto are grouped into 8 PSK symbols (including 3 bits each) and mapped according to the 8 PSK modulation shown (having an 8 PSK shaped constellation and a corresponding mapping). The mapping is also shown within the diagram. As some examples, the mapping of the symbol 0 (0=000 in binary) is mapped to the constellation point indicated by 0, and the mapping of the symbol 1 (1=001 in binary) is mapped to the constellation point indicated by 1, the mapping of the symbol 5 (5=101 in binary) is mapped to the constellation point indicated by 2, and the mapping of the symbol 4 (4=100 in binary) is mapped to the constellation point indicated by 3.

The mapping is shown as:

Map(000)=0; Map(001)=1; Map(101)=2; Map(100)
=3; Map(110)=4; Map(111)=5; Map(011)=6;
Map(010)=7. (EQ 1)

When iteratively decoding LDPC codes, the HNS proposal to the DVB standard works well for binary input sequences generated using a PN (Pseudo-Noise) sequence. However, if an input sequence is not a PN sequence, the decoding may not converge with the same SNR (Signal to Noise Ratio) and the same number of iterations used for the PN sequence. In addition, some of the deficiencies of this approach may be even clearer when considering the following two different LDPC codes.

One of the LDPC codes is denoted by $C_1$, and it has a degree of distribution as follows:

$\lambda_2=0.2, \lambda_3=0.54, \lambda_4=\lambda_5=\ldots=\lambda_{12}=0, \lambda_{13}=0.26$, and
$\rho_{10}=1$.

The other LDPC code is denoted by $C_2$, and it has a degree of distribution as follows:

$\lambda_2=0.2, \lambda_3=0.5, \lambda_4=\lambda_5=\ldots=\lambda_8=0, \lambda_9=0.3$, and
$\rho_{10}=1$.

Using the theory of density evolution introduced by T. J. Richardson and R. L. Urbanke (also referenced above), it can show that $C_2$ has better performance than $C_1$. In fact, the inventors have found that a binary LDPC code $C_2$ with a block length of 43200 out performs the binary LDPC code $C_1$ with the block length of 64800 presented in the HNS proposal to the DVB standard, where the number of iteration is the same.

However, the inventors have also found that when these two codes are combined directly to modulation encoding and also using the mapping that is shown in the diagram for the HNS proposal to the DVB standard, then the code modulation with LDPC code $C_1$ is better than the LDPC code $C_2$.

Figure 18B:
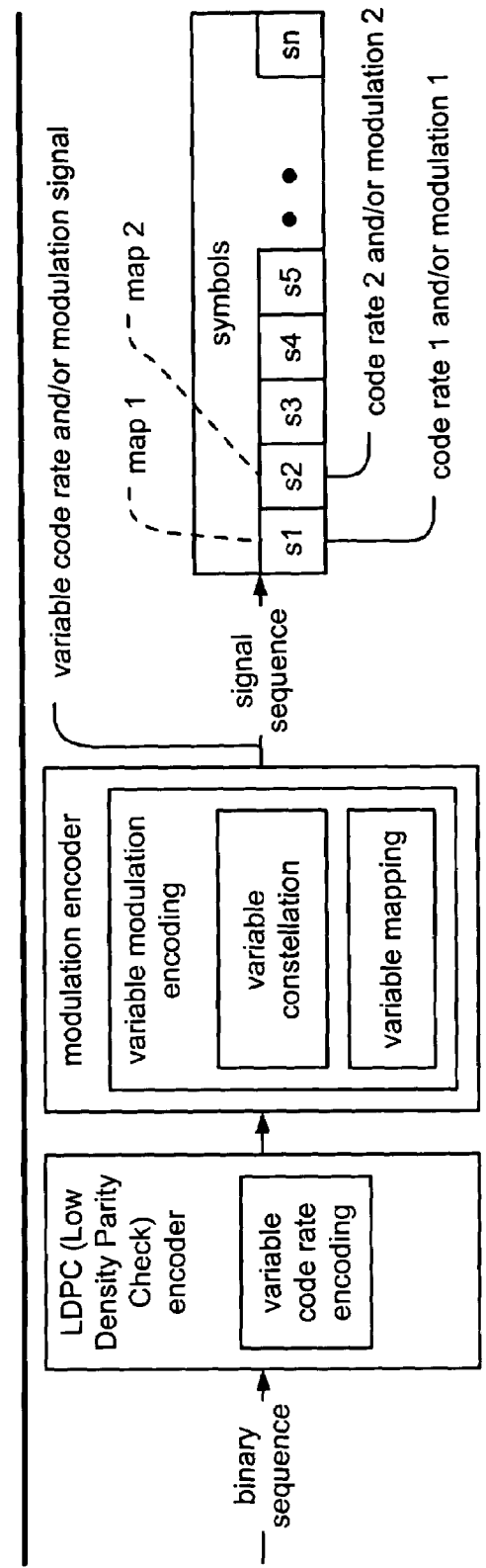
FIG. 18B is a diagram illustrating an embodiment of LDPC (Low Density Parity Check) coded modulation signal encoding that may be performed according to the invention.

FIG. 18B is a diagram illustrating an embodiment of LDPC (Low Density Parity Check) coded modulation signal encoding that may be performed according to the invention. This diagram shows a very generalized embodiment of the invention in which combined LDPC coding and modulation encoding may be combined to generate a signal sequence. In addition, this embodiment shows how an LDPC variable code rate and/or modulation signal may be generated.

An LDPC encoder receives a binary sequence. The LDPC encoder is operable to encode various symbols such that they may be encoded according to different code rates; different encoded symbols generated by the LDPC encoder may have different numbers of information bits and/or redundancy (or parity) bits. As an example, a first symbol may be encoded according to a code rate of 2/3 (e.g., 2 information bits generating a 3 bit encoded symbol), and a first symbol may be encoded according to a code rate of 3/4 (e.g., 2 information bits generating a 4 bit encoded symbol).

These LDPC encoded symbols output from the LDPC encoder are then passed to a modulation encoder that maps these LDPC encoded symbols to an appropriate modulation (constellation and mapping). The modulation encoder is operable to perform variable modulation encoding such that they may be modulation encoded according to different modulations (e.g., different constellation shapes and/or mappings); different modulation encoded symbols mapped by the modulation encoder may be mapped to different constellation and/or to the different mappings within 1 or more constellations.

These LDPC encoded signals that have now been modulation encoded are output from the modulation encoder as a signal sequence that includes a number of symbols generated from combined LDPC encoding and modulation encoding. As an example of the variability of the code rate and/or modulation of these symbols, a first symbol may have a code rate 1 and a modulation 1, and a second symbol may have a code rate 2 and a modulation 2. Alternatively, a first symbol may be mapped according to a map 1, and a second symbol may be mapped according to a map 2. Clearly, a wide variety of signal types may be generated such that any 1 or more of the code rate, constellation type, or mapping of the various symbols of the signal sequence may vary as frequently as on a symbol by symbol basis.

It is also noted, however, that this embodiment is still operable to generate a signal sequence such that each of the symbols have a common code rate and a common modulation (e.g., are mapped to a common constellation having a singular mapping). However, it is shown and described below that employing a variable modulation signal within a communication system can provide for improved performance. In addition, employing a variable code rate signal within a communication system can also provide for improved performance.

Some of the various aspects of the invention of variable modulation within combined LDPC coding and modulation coding systems may be better understood by considering using an irregular LDPC code. Every variable node of such an irregular LDPC code may have a different degree. Stated another way, every variable node may have a different number of edges emanating from it. All the edges emanating from the variable node are connected to check nodes. By the nature of the BP (Belief Propagation) decoding approach, the variable node gets all of the information from its connected check nodes. Therefore, the variable node with higher degree is more protected.

To combine a binary block code (one type being an LDPC code) with modulation coding, a S/P (Serial to Parallel) path or map may be used. In this way, one modulation symbol of the generated signal may contain more than one bit. As some examples, a QPSK (Quadrature Phase Shift Key) signal uses 2 bits per symbol, a 8 PSK (8 Phase Shift Key) signal uses 3 bits per symbol, a 16 QAM (16 Quadrature Amplitude Modulation) signal uses 4 bits per symbol, and so on for even other types of modulations. Clearly, even higher order modulations may also be employed without departing from the scope and spirit of the invention.

In general, a signal may contain a plurality of bits, that may be represented as $(b_{l-1}, \ldots, b_1, b_0)$. These 1 bits may have distinct degrees in an LDPC code. On the other hand, different maps may be implemented to handle the different bits in different manners. Employing different mappings for various symbols of a signal sequence is an example of a variable modulation signal where the constellation shape is held the same for all of the symbols of the signal sequence, yet the mapping of the various symbols is variable as frequently as on a symbol by symbol basis.

As an example, Gray maps of an 8 PSK signal constellation may be considered. In the following, only 12 different Gray maps are studied. However, the other Gray maps are equivalent to these illustrated maps when undergoing some rotation around the origin of the I,Q axes.

FIG. 19A, FIG. 19B, FIG. 20A, FIG. 20B, FIG. 21A, and FIG. 21B are diagrams illustrating various embodiments of mappings that may be employed according to the invention. These diagrams all show the 12 different Gray maps that are studied. The mapping of the symbols to the corresponding constellation points within the 8 PSK shaped constellations is shown next to the corresponding constellation point.

Some examples are provided with respect to this diagram, and analogous mapping is performed according to the designations provided in the other diagrams indicated above.

1. mapping symbol 0 (0=000 in binary) to the constellation point 0,
2. mapping symbol 1 (0=001 in binary) to the constellation point 1,
3. mapping symbol 3 (3=011 in binary) to the constellation point 2,
4. mapping symbol 2 (2=010 in binary) to the constellation point 3,
5. mapping symbol 6 (6=110 in binary) to the constellation point 4,
6. mapping symbol 7 (7=111 in binary) to the constellation point 5,
7. mapping symbol 5 (5=101 in binary) to the constellation point 6, and
8. mapping symbol 4 (4=100 in binary) to the constellation point 7.

Again, the mappings according to the FIG. 19A, FIG. 19B, FIG. 20A, FIG. 20B, FIG. 21A, and FIG. 21B may be viewed as undergoing analogous mapping (with appropriate mapping indicated).

The operation of such coding may be described when considering a map, indicated as $Map_i$, and the two symbols $(a_2, a_1, a_0)$ and $(b_2, b_1, b_0)$. If $a_2=b_2$ and $a_1=b_1$, but $a_0 \neq b_0$ and also if $Map_i(a_2, a_1, a_0)$ and $Map_i(b_2, b_1, b_0)$ are two consecutive numbers, then the map may be characterized as having I weak point at the LSB (Least Significant Bit). Similarly, a weak point at the MSB (Most Significant Bit) and a weak point at the ISB (Inside Significant Bit) may be defined. For example, a weak point at the MSB may be defined as follows: if $a_2 \neq b_2$ and $a_1=b_1$, but $a_0=b_0$, and also if $Map_i(a_2, a_1, a_0)$ and $Map_i(b_2, b_1, b_0)$ are two consecutive numbers. Also, a weak point at the ISB may be defined as follows: if $a_2=b_2$ and $a_1 \neq b_1$, but $a_0=b_0$, and also if $Map_i(a_2,a_1,a_0)$ and $Map_i(b_2,b_1,b_0)$ are two consecutive numbers.

Within these definitions, a table of the weak points for each of the MSB, ISB, and LSB of the 12 different Gray maps may be generated as shown in the following diagram.

FIG. 21C is a diagram illustrating a table indicating the relationship between the variable map number and the number of weak points for the MSB (Most Significant Bit), ISB (Inside Significant Bit), and LSB (Least Significant Bit), respectively, according to one embodiment of the invention. The variable map number is referenced with respect to the 17A, FIG. 17B, FIG. 18A, FIG. 18B, FIG. 19A, and FIG. 19B described above.

The variable modulation characteristics of the invention may also be applied and further explored when considering the LDPC coded modulation used in the HNS proposal to the DVB standard. That particular LDPC code has 64800 variable nodes with 4320 degree 13 nodes broken down as follows: 38880 degree 3 nodes, 21599 degree 2 nodes, and 1 degree 1 node. The S/P (Serial to Parallel) map of the HNS proposal to the DVB standard is similar to the $Map_4$ that is described above (within the upper left hand corner of FIG. 18A). From the table indicating the relationship between the variable map number and the number of weak points for the MSB, ISB, and LSB, it can be seen that the signal map is always weaker at the LSB for this particular map.

In fact, this particular map will still provide a relatively high degree of performance to the first 4320 symbols since the LSB of these symbols are degree 13 nodes, which are therefore strongly protected by the corresponding check nodes. However, the remaining 17280 symbols (which include a full 80% of all of the symbols) have both MSB and LSB of only degree 3.

Obviously, the LSB bit is much less protected. Therefore, when the information data is a PN (Pseudo-Noise) sequence, which has 1s and 0s evenly distributed in the block, the code behaves sufficiently well. Otherwise, it behaves much worse. In an effort to overcome this weakness, one aspect of the invention involves employing the novel solution of using more than one signal map. This may be viewed as a variable modulation type coding where the constellation is fixed, and the mapping is varied for the symbols of the signal sequence.

Figure 22:
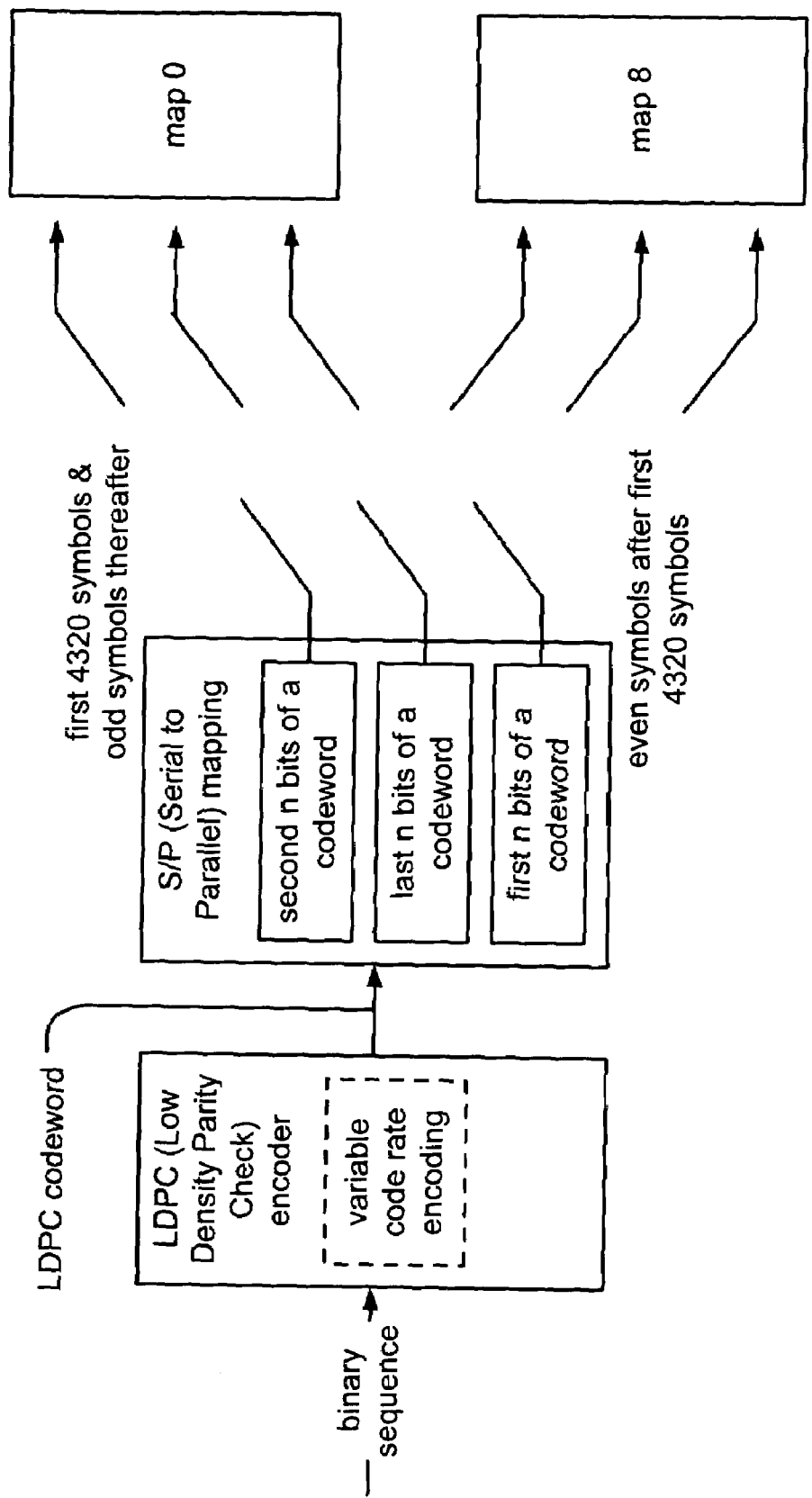
FIG. 22 is a diagram illustrating an embodiment of a variable signal mapping LDPC (Low Density Parity Check) coded modulation system that is built according to the invention.

FIG. 22 is a diagram illustrating an embodiment of a variable signal mapping LDPC (Low Density Parity Check) coded modulation system that is built according to the invention. This embodiment shows how 2 separate mappings are employed to map the various symbols that are to be symbol mapped. This embodiment generates an LDPC variable modulation signal whose mapping may vary as frequently as on a symbol by symbol basis; the constellation shape of this embodiment stays fixed, but the mapping varies for different symbols. By using the mapping described above with respect to the LDPC code of the HNS proposal to the DVB standard, a new coded modulation may be found in accordance with the invention that performs well for both PN and non-PN sequences. Moreover, the performance of the new system is also improved.

An LDPC encoder encodes a binary sequence to generate LDPC codewords such that each codeword includes a plurality of LDPC coded bits. In some embodiments, this LDPC encoding may be performed using variable code rate encoding in accordance with the invention. Subsequently, an S/P (Serial to Parallel) mapping operates on the LDPC codeword. The individual bits of the LDPC codeword are appropriately grouped and mapped into 3 separate paths that cooperatively form 3 bit symbols. More specifically in this embodiment, the $2^{nd}$ n bits of the codeword are passed through one path, the last n bits of the codeword are passed through another path, and the $1^{st}$ n bits of the codeword are passed through yet another path. Bits selected from these 3 paths are combined together to form 3 bit symbols that subsequently undergo modulation encoding.

This embodiment differs from any of the other embodiments described above that perform combined LDPC encoding and modulation encoding in the fact that the LDPC coded bits are modulation encoded according to 2 separate modulations. These 2 modulations both employ a commonly shaped constellation, yet each of the modulations has a different mapping. Referring to this diagram, the output encoded bits from the various encoders that form the bits of the symbol to be modulation encoded are appropriately provided to 1 of the 2 separate maps shown; these 2 maps may functionally be viewed as being 2 separate modulation encoders. The encoded bits may alternatively be provided to the map 1 and the map 2 to perform the modulation encoding. This providing of the LDPC coded bits to the appropriate modulation encoders may be viewed as being performed according to a predetermined cycle.

More specifically in this embodiment, the predetermined cycle is performed as follows: the first 4320 symbols and the odd symbols generated thereafter are provided to a map 0, and the even symbols after the first 4320 symbols are provided to a map 1. The use of these 2 separate mappings (e.g., thereby generating a variable mapped signal) for the symbols generated using the LDPC coding provides for a significant improvement in performance vs. employing only a single mapping.

Figure 23:
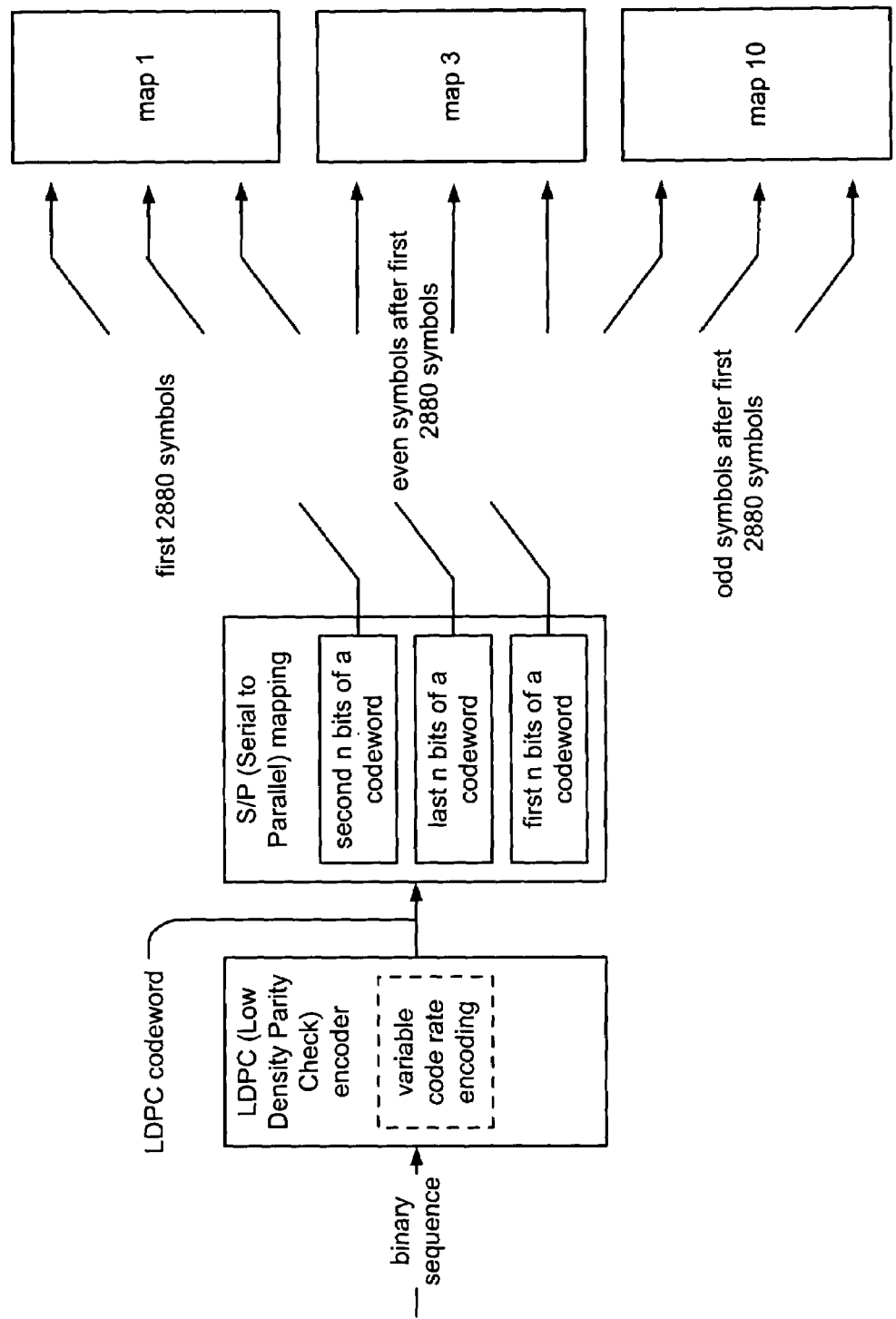
FIG. 23 is a diagram illustrating another embodiment of a variable signal mapping LDPC (Low Density Parity Check) coded modulation system (shown as using code C_2) that is built according to the invention.

FIG. 23 is a diagram illustrating another embodiment of a variable signal mapping LDPC (Low Density Parity Check) coded modulation system (shown as using code C_2) that is built according to the invention. This embodiment is somewhat similar to the 2 separate mapping embodiment described above, except that 3 separate mappings are employed. Again, this embodiment is operable to generate an LDPC variable modulation signal. The varying modulation includes employing a commonly shaped constellation having 3 separate mappings. The modulation (more specifically the mapping) of the signal sequence generated by this embodiment may again vary as frequently as on a symbol by symbol basis.

As with the embodiment described above, an LDPC encoder encodes a binary sequence to generate LDPC codewords such that each codeword includes a plurality of LDPC coded bits. Again, in some embodiments, this LDPC encoding may be performed using variable code rate encoding in accordance with the invention. Subsequently, an S/P (Serial to Parallel) mapping operates on the LDPC codeword. The individual bits of the LDPC codeword are appropriately grouped and mapped into 3 separate paths that cooperatively form 3 bit symbols. More specifically in this embodiment, the $2^{nd}$ n bits of the codeword are passed through one path, the last n bits of the codeword are passed through another path, and the $1^{st}$ n bits of the codeword are passed through yet another path. Bits selected from these 3 paths are combined together to form 3 bit symbols that subsequently undergo modulation encoding.

This embodiment differs from any of the other embodiments described above that perform combined LDPC encoding and modulation encoding in the fact that the LDPC coded bits are modulation encoded according to 3 separate modulations. These 3 modulations both employ a commonly shaped constellation, yet each of the modulations has a different mapping. Referring to this diagram, the output encoded bits from the various encoders that form the bits of the symbol to be modulation encoded are appropriately provided to 1 of the 3 separate maps shown; these 3 maps may functionally be viewed as being 3 separate modulation encoders. Again, this providing of the LDPC coded bits to the appropriate modulation encoders may be viewed as being performed according to a predetermined cycle.

More specifically in this embodiment, the predetermined cycle is performed as follows: the first 2880 symbols and the odd symbols generated thereafter are provided to a map 1, the even symbols after the first 2880 symbols are provided to a map 3, and the odd symbols after the first 2880 symbols are provided to a map 10. The use of these 3 separate mappings (e.g., thereby generating a variable mapped signal) for the symbols generated using the LDPC coding provides for a significant improvement in performance vs. employing only a single mapping.

Figure 24:
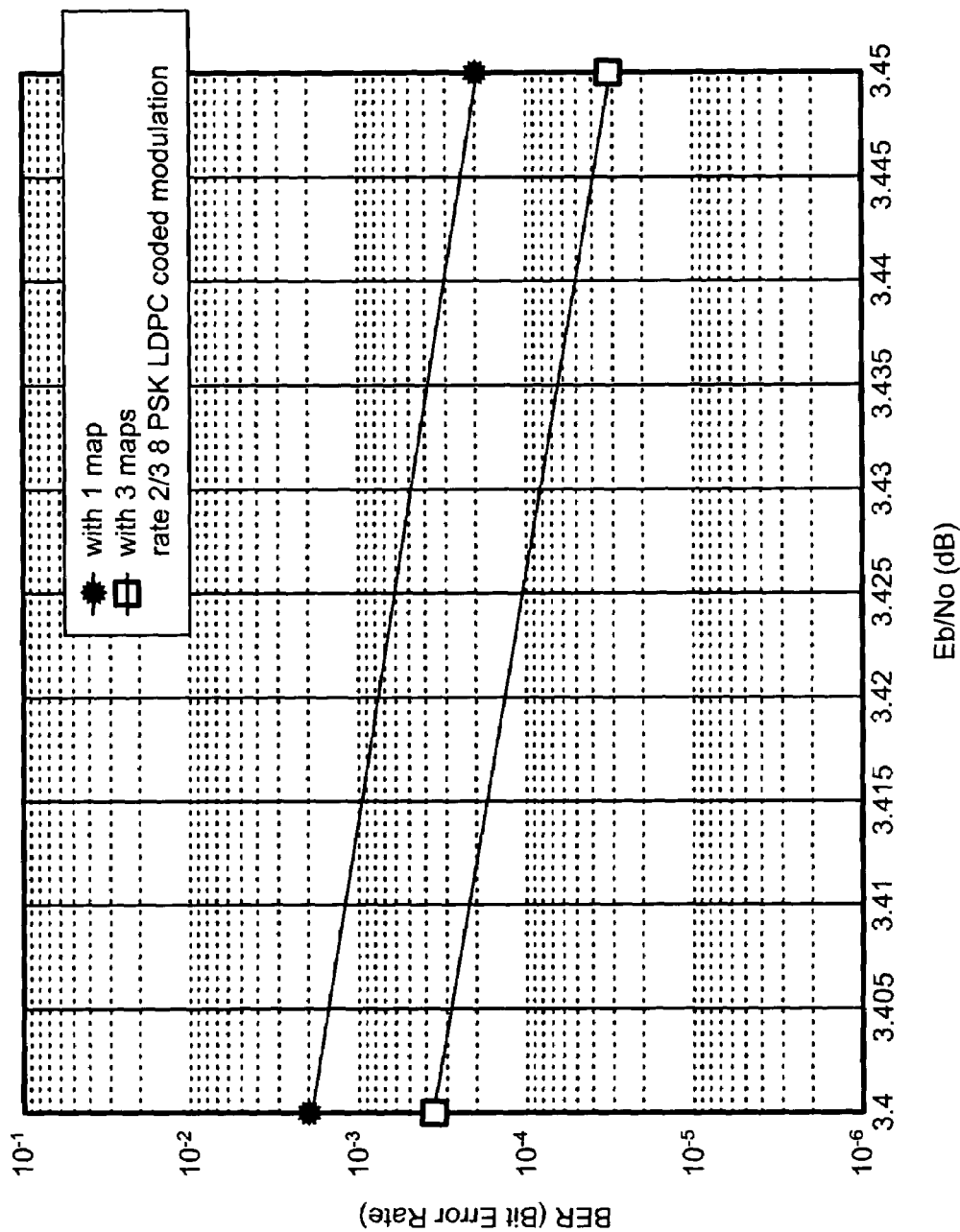
FIG. 24 is a diagram illustrating an embodiment of performance comparison of LDPC (Low Density Parity Check) coded modulation systems that employ a single map vs. multiple maps (shown as 1 map vs. 3 maps) respectively according to the invention.

FIG. 24 is a diagram illustrating an embodiment of performance comparison of LDPC (Low Density Parity Check) coded modulation systems that employ a single map vs. multiple maps (shown as 1 map vs. 3 maps) respectively according to the invention. This diagram shows the performance improvement achieved when employing an LDPC variable modulation signal. This LDPC variable modulation signal is a signal whose mapping varies as frequently as on a symbol by symbol basis. The symbols are modulation encoding according to 3 separate modulations that each have a commonly shaped constellation yet have 3 separate mappings. The LDPC code $C_2$ is employed within this illustrative example. The mapping $Map_0$ is employed as it provides the best performance from among the available mappings.

These performance curves, as well as many others described within this specification, are described in the context of BER (Bit Error Rate) versus $E_b/N_o$ (ratio of energy per bit $E_b$ to the Spectral Noise Density $N_o$). This term $E_b/N_o$ is the measure of SNR (Signal to Noise Ratio) for a digital communication system. When looking at these performance curves, the BER may be determined for any given $E_b/N_o$ (or SNR).

Within this particular performance curve diagram, for example, when operating at an $E_b/N_o$ of approximately 3.425 dB (decibels), the BER of LDPC coded modulation with a single mapping is approximately $6\times10^{-3}$. However, when operating at an $E_b/N_o$ of approximately 3.425 dB, the BER of LDPC coded modulation with a 2 separate mappings is approximately $1\times10^{-4}$. This is a very significant reduction in BER when operating at a comparable SNR. Moreover, by using the 3 maps described in the embodiment above (where n=14400), and when operating at virtually any BER, there is a gain of at least 0.04 dB gain in terms of $E_b/N_o$.

While several of the various embodiments of the invention have been shown to include 8 PSK types mapping within the multiple mapping embodiments, it is noted that any type of modulation encoding may be employed without departing from the scope and spirit of the invention. For example, 2 or 3 (or generically, n) mappings of 16 QAM may alternatively be implemented. There may be some embodiments where a mixture of mappings is employed. For example, one of the mappings may perform 16 QAM mapping whereas another of the mappings may perform 16 APSK (16 Asymmetric Phase Shift Keying) mapping within a single device. Such an embodiment would generate an LDPC variable modulation signal whose constellation shape as well as mapping may vary as frequently as on a symbol by symbol basis.

In even other alternative embodiment, other combinations may be performed including an 8 PSK mapping performed in one mapping, and QPSK mapping performed in another mapping. Clearly, a wide variety of combinations of modulations (e.g., combinations of constellation types and alternatives of mappings for those constellations) may be implemented without departing from the scope and spirit of the invention.

In general, for any signal constellation, one can select many possible maps according to the weakness table and the block code employed to construct a variable signal mapping block coded modulation in accordance with the invention. This diagram illustrates a possible implementation for a m-bit constellation modulation. Moreover, it is also noted that the code can be any one of a variety of block codes.

Figure 25:
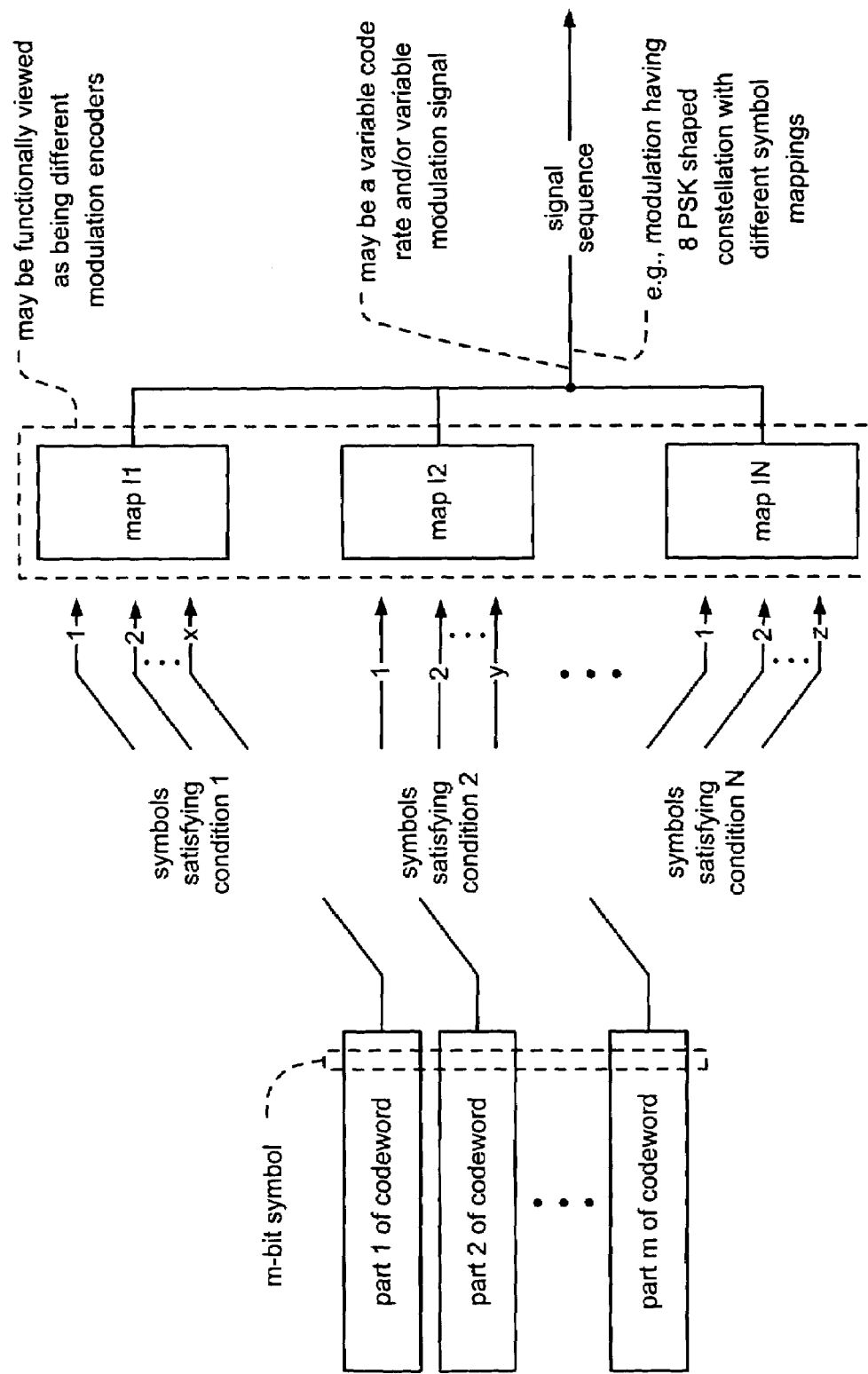
FIG. 25 is a diagram illustrating another embodiment of a variable signal mapping LDPC (Low Density Parity Check) coded modulation system that is built in accordance with invention.

FIG. 25 is a diagram illustrating another embodiment of a variable signal mapping LDPC (Low Density Parity Check) coded modulation system that is built in accordance with invention. This diagram shows a very generalized embodiment in which combined LDPC encoding and modulation encoding may be combined in which LDPC coded bits are grouped together and provided to an appropriate modulation encoder to generate an LDPC variable modulation signal.

In a very general illustration, S/P (Serial to Parallel) mapping is performed on an LDPC codeword. The individual bits of the LDPC codeword are appropriately grouped and mapped into a plurality of separate paths that cooperatively form symbols that may each have different number of bits. More specifically in this embodiment, a part 1 of the codeword is passed through a one path, a part 2 of the codeword is passed through another path, . . . , and a part m of the codeword is passed through yet another path. Bits selected from these various paths are combined together to form symbols that subsequently undergo modulation encoding.

Those symbols that satisfy a condition 1 are provided to a map I1. Similarly, those symbols that satisfy a condition 2 are provided to a map I2, and those symbols that satisfy a condition N are provided to a map IN. The various conditions employed to govern the direction of which mapping to which the symbols are provided may be selected by a designer implementing the invention. In addition, it is noted that the number of bits within the various symbols may be different. For example, the number of the symbols being provided to the map I1 is x; the number of the symbols being provided to the map I2 is y; and number of the symbols being provided to the map IN is z. This shows how different types of modulations may also be supported such that the various modulations operate on differently sized symbols.

As an example of how this may be implemented, symbols having x=3 bits may be provided to the map I1 for modulation encoding according to an 8 PSK shaped constellation having a particular mapping. Similarly, symbols having y=2 bits may be provided to the map I2 for modulation encoding according to a QPSK shaped constellation having a particular mapping. Also, symbols having z=4 bits may be provided to the map IN for modulation encoding according to a 16 QAM shaped constellation having a particular mapping.

Many particular aspects of the possible ways to perform encoding of LDPC signals have been described above. Some of these embodiments include combining LDPC encoding and modulation encoding. In addition, several of these embodiments described how to generate LDPC variable code rate signals using an LDPC encoder that supports variable code rate encoding. Alternatively, 2 or more different LDPC encoders could be implemented in parallel, and the encoded output bits could be selected appropriately from the 2 or more LDPC encoders to generate an LDPC variable code rate signal sequence having symbols whose code rate could vary as frequently as on a symbol by symbol basis.

However, other aspects of the invention may also be found within the decoding functionality and methods that may be performed on LDPC coded signals. More specifically, other aspects of the invention may be found within devices or methods that perform updating of a bit metric that is employed within the iterative decoding processing of LDPC decoding. In addition, this LDPC decoding may also be implemented to accommodate decoding processing of a signal that has been encoded using variable signal modulation (variable constellation and/or mapping), as has also been described herein. That is to say, this updating of the bit metric in accordance with the LDPC decoding may be applied to decoding of LDPC variable code rate and/or modulation signals.

Figure 26:
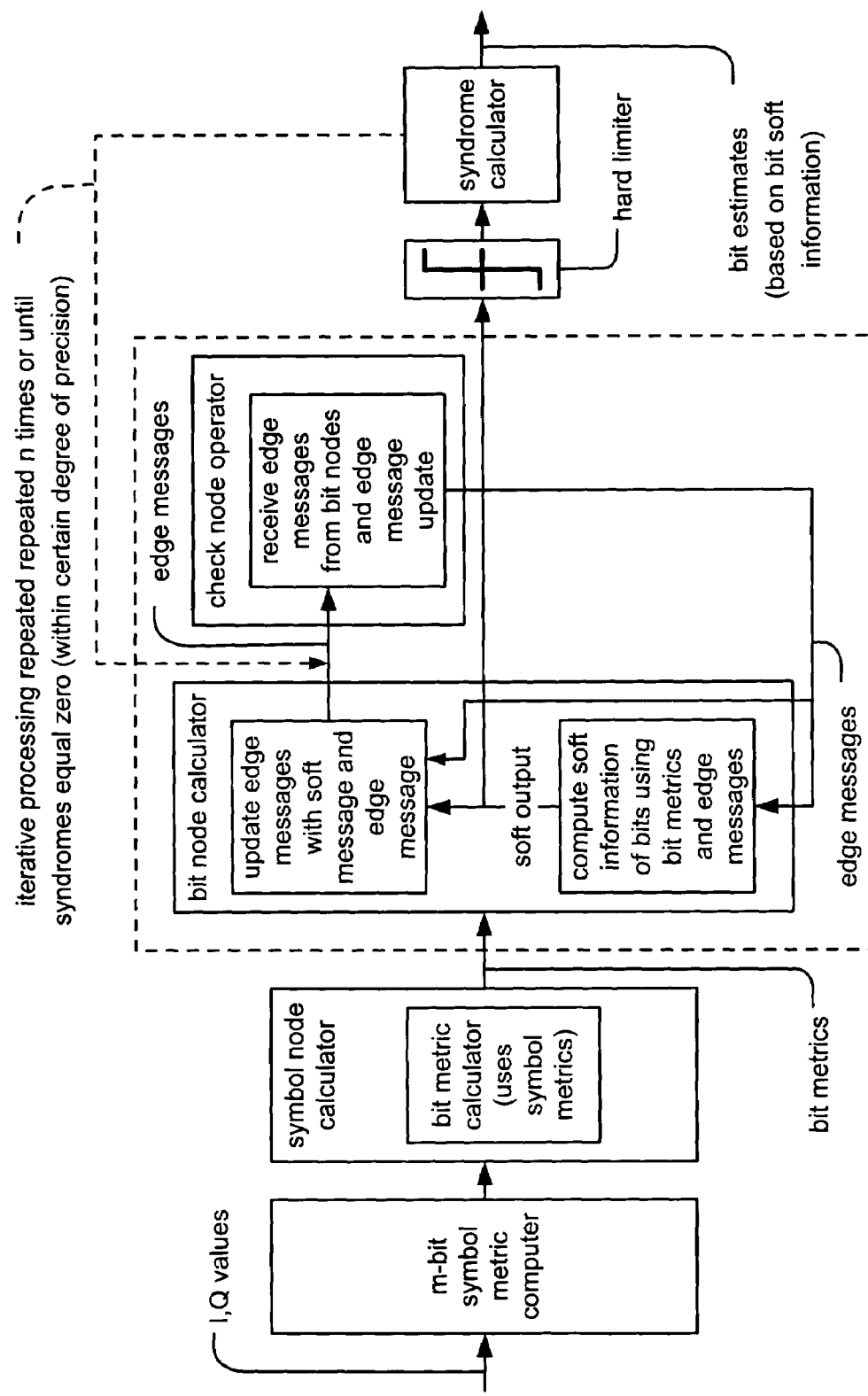
FIG. 26 is a diagram illustrating an embodiment of LDPC (Low Density Parity Check) coded modulation decoding functionality using bit metric according to the invention.

FIG. 26 is a diagram illustrating an embodiment of LDPC (Low Density Parity Check) coded modulation decoding functionality using bit metric according to the invention. To perform decoding of an LDPC coded modulation signal having an m-bit signal sequence, the functionality of this diagram may be employed. After receiving the I, Q (In-phase, Quadrature) values of a signal at the symbol nodes, an m-bit symbol metric computer functional block calculates the corresponding symbol metrics. At the symbol nodes, these symbol metrics are then passed to a symbol node calculator functional block that uses these received symbol metrics to calculate the bit metrics corresponding to those symbols. These bit metrics are then passed to the bit nodes connected to the symbol nodes.

Thereafter, at the bit nodes, a bit node calculator functional block operates to compute the corresponding soft messages of the bits. Then, in accordance with iterative decoding processing, the bit node calculator functional block receives the edge messages from a check node operator functional block and updates the edge messages with the bit metrics received from the symbol node calculator functional block. These edge messages, after being updated, are then passed to the check node operator functional block.

At the check nodes, the check node operator functional block then receives these edge messages sent from the bit nodes (from the bit node calculator functional block) and updates them accordingly. These updated edge messages are then passed back to the bit nodes (e.g., to the bit node calculator functional block) where the soft information of the bits is calculated using the bit metrics and the current iteration values of the edge messages. Thereafter, using this just calculated soft information of the bits (shown as the soft message), the bit node calculator functional block updates the edge messages using the previous values of the edge messages (from the just previous iteration) and the just calculated soft message. The iterative processing continues between the bit nodes and the check nodes according to the LDPC code bipartite graph that was employed to encode the signal that is being decoded.

These iterative decoding processing steps, performed by the bit node calculator functional block and the check node operator functional block, are repeated a predetermined number of iterations (e.g., repeated n times, where n is selectable). Alternatively, these iterative decoding processing steps are repeated until the syndromes of the LDPC code are all equal to zero (within a certain degree of precision).

Soft output information is generated within the bit node calculator functional block during each of the decoding iterations. In this embodiment, this soft output may be provided to a hard limiter where hard decisions may be made, and that hard information may be provided to a syndrome calculator to determined whether the syndromes of the LDPC code are all equal to zero (within a certain degree of precision). When thy are not, the iterative decoding processing continues again by appropriately updating and passing the edge messages between the bit node calculator functional block and the check node operator functional block.

After all of these iterative decoding processing steps have been performed, then the best estimates of the bits are output based on the bit soft information. In the approach of this embodiment, the bit metric values that are calculated by the symbol node calculator functional block are fixed values and used repeatedly in updating the bit node values.

Figure 27:
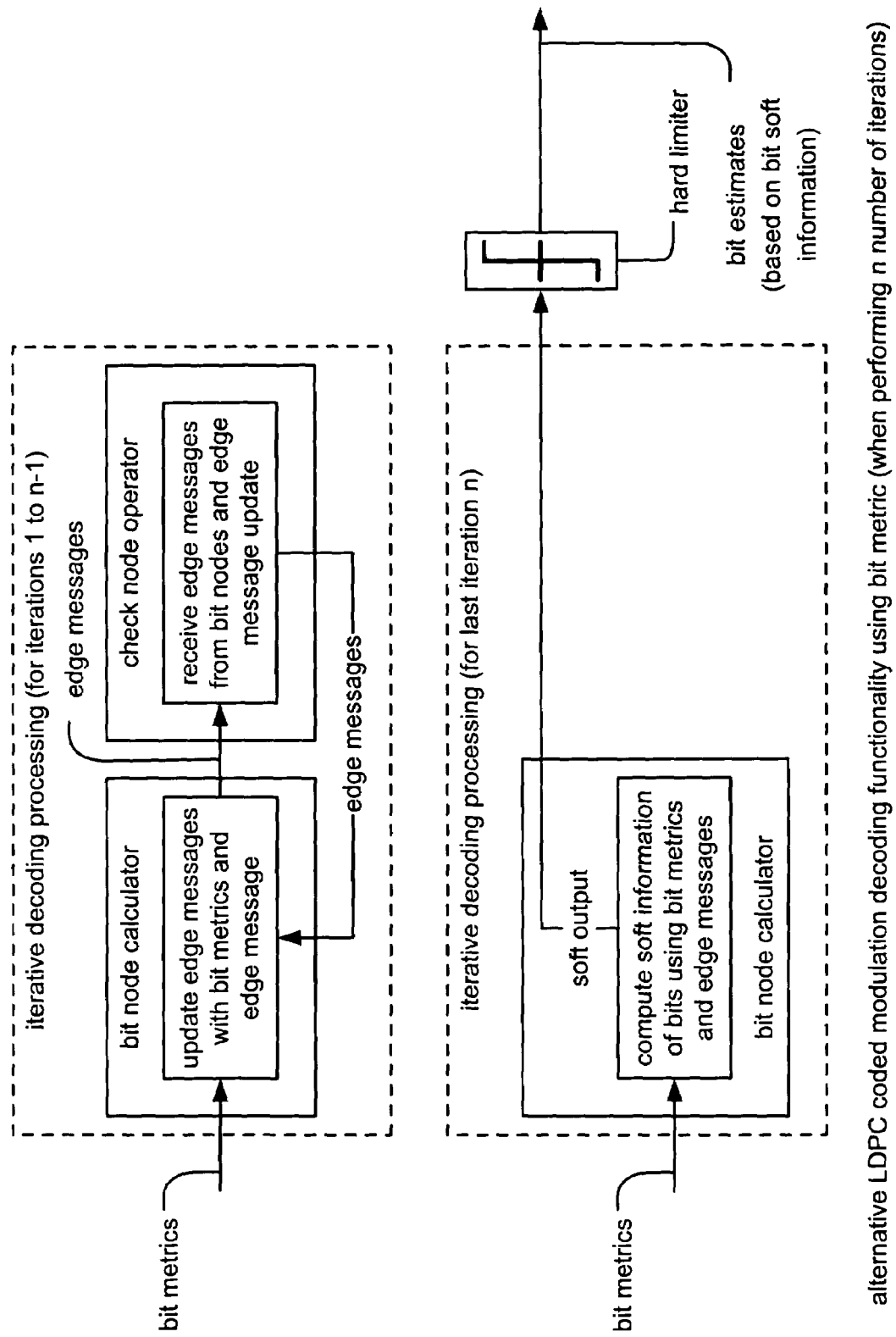
FIG. 27 is a diagram illustrating an alternative embodiment of LDPC coded modulation decoding functionality using bit metric according to the invention (when performing n number of iterations).

FIG. 27 is a diagram illustrating an alternative embodiment of LDPC coded modulation decoding functionality using bit metric according to the invention (when performing n number of iterations). This embodiment shows how the iterative decoding processing may be performed when a predetermined number of decoding iterations, shown as n, is performed. If the number of decoding iterations is known beforehand, as in a predetermined number of decoding iterations embodiment, then the bit node calculator functional block may perform the updating of its corresponding edge messages using the bit metrics themselves (and not the soft information of the bits as shown in the previous embodiment and described above). This processing may be performed in all but the last decoding iteration (e.g., for iterations 1 through n−1). However, during the last iteration, the bit node calculator functional block calculated the soft information of the bits (shown as soft output). The soft output is then provided to a hard limiter where hard decisions may be made of the bits. The syndromes need not be calculated in this embodiment since only a predetermined number of decoding iterations are being performed.

Figure 28:
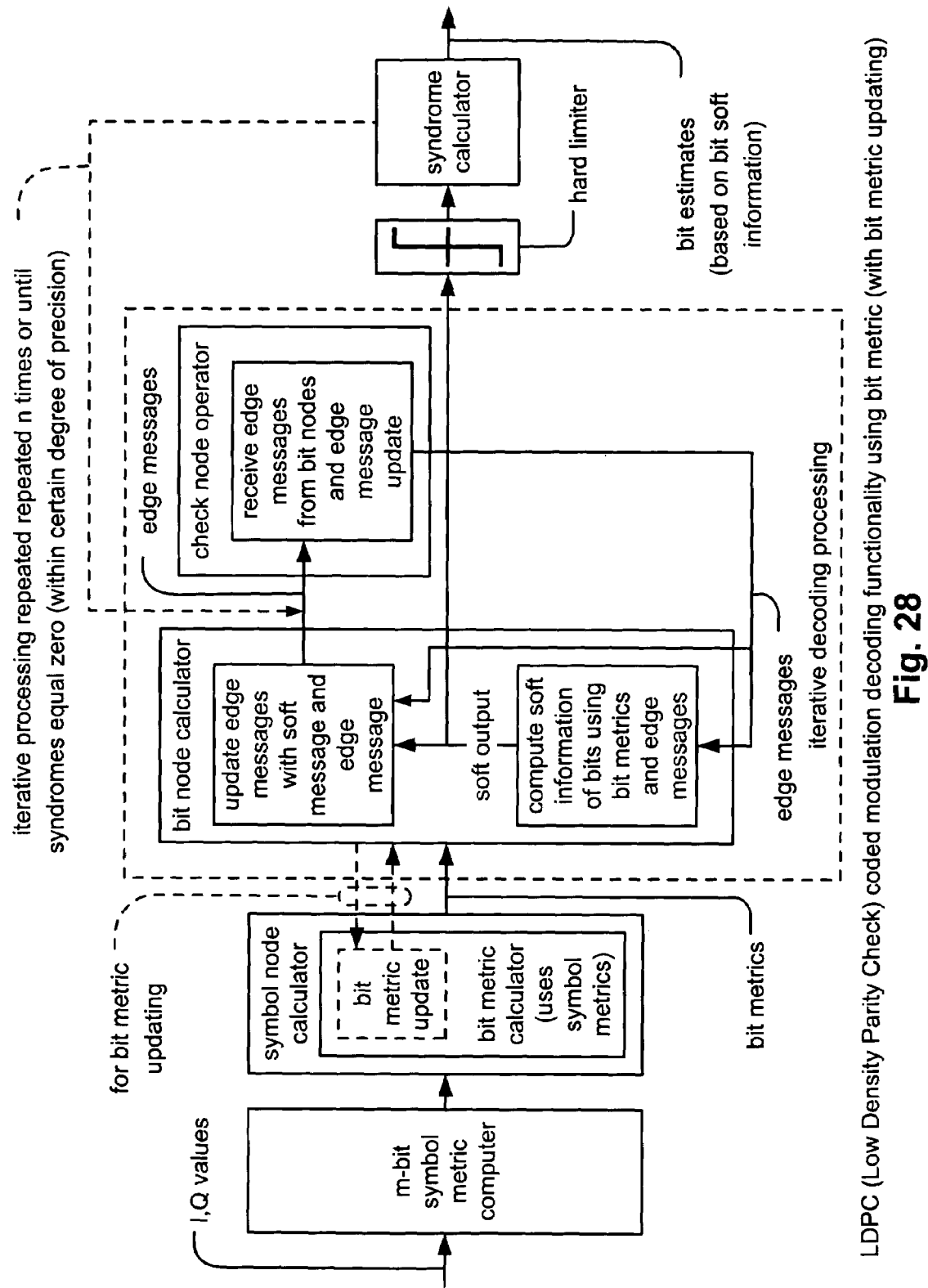
FIG. 28 is a diagram illustrating an alternative embodiment of LDPC (Low Density Parity Check) coded modulation decoding functionality using bit metric (with bit metric updating) according to the invention.

FIG. 28 is a diagram illustrating an alternative embodiment of LDPC (Low Density Parity Check) coded modulation decoding functionality using bit metric (with bit metric updating) according to the invention. To perform decoding of an LDPC coded modulation signal having an m-bit signal sequence, the functionality of this diagram may be employed. After receiving the I, Q (In-phase, Quadrature) values of a signal at the symbol nodes, an m-bit symbol metric computer functional block calculates the corresponding symbol metrics. At the symbol nodes, these symbol metrics are then passed to a symbol node calculator functional block that uses these received symbol metrics to calculate the bit metrics corresponding to those symbols. These bit metrics are then passed to the bit nodes connected to the symbol nodes. The symbol node calculator functional block is also operable to perform bit metric updating during subsequent decoding iterations.

Thereafter, at the bit nodes, a bit node calculator functional block operates to compute the corresponding soft messages of the bits. Then, in accordance with iterative decoding processing, the bit node calculator functional block receives the edge messages from a check node operator functional block and updates the edge messages with the bit metrics received from the symbol node calculator functional block. This updating of the edge messages may be performed using the updated bit metrics during subsequent iterations. These edge messages, after being updated, are then passed to the check node operator functional block.

At the check nodes, the check node operator functional block then receives these edge messages sent from the bit nodes (from the bit node calculator functional block) and updates them accordingly. These updated edge messages are then passed back to the bit nodes (e.g., to the bit node calculator functional block) where the soft information of the bits is calculated using the bit metrics and the current iteration values of the edge messages. Thereafter, using this just calculated soft information of the bits (shown as the soft message), the bit node calculator functional block updates the edge messages using the previous values of the edge messages (from the just previous iteration) and the just calculated soft message. At the same time, as the just calculated soft information of the bits (shown as the soft message) has been calculated, this information may be passed back to the symbol nodes (e.g., to the symbol node calculator functional block) for updating of the bit metrics employed within subsequent decoding iterations. The iterative processing continues between the bit nodes and the check nodes according to the LDPC code bipartite graph that was employed to encode the signal that is being decoded (by also employing the updated bit metrics during subsequent decoding iterations).

These iterative decoding processing steps, performed by the bit node calculator functional block and the check node operator functional block, are repeated a predetermined number of iterations (e.g., repeated n times, where n is selectable). Alternatively, these iterative decoding processing steps are repeated until the syndromes of the LDPC code are all equal to zero (within a certain degree of precision).

Soft output information is generated within the bit node calculator functional block during each of the decoding iterations. In this embodiment, this soft output may be provided to a hard limiter where hard decisions may be made, and that hard information may be provided to a syndrome calculator to determined whether the syndromes of the LDPC code are all equal to zero (within a certain degree of precision). When thy are not, the iterative decoding processing continues again by appropriately updating and passing the edge messages between the bit node calculator functional block and the check node operator functional block.

After all of these iterative decoding processing steps have been performed, then the best estimates of the bits are output based on the bit soft information. In the approach of this embodiment, the bit metric values that are calculated by the symbol node calculator functional block are fixed values and used repeatedly in updating the bit node values.

FIG. 29 is a diagram illustrating an alternative embodiment of LDPC coded modulation decoding functionality using bit metric (with bit metric updating) according to the invention (when performing n number of iterations). This embodiment shows how the iterative decoding processing may be performed when a predetermined number of decoding iterations, shown as n, is performed (again, when employing bit metric updating). If the number of decoding iterations is known beforehand, as in a predetermined number of decoding iterations embodiment, then the bit node calculator functional block may perform the updating of its corresponding edge messages using the bit metrics/updated bit metrics themselves (and not the soft information of the bits as shown in the previous embodiment and described above). This processing may be performed in all but the last decoding iteration (e.g., for iterations 1 through n−1). However, during the last iteration, the bit node calculator functional block calculated the soft information of the bits (shown as soft output). The soft output is then provided to a hard limiter where hard decisions may be made of the bits. The syndromes need not be calculated in this embodiment since only a predetermined number of decoding iterations are being performed.

Figure 30A:
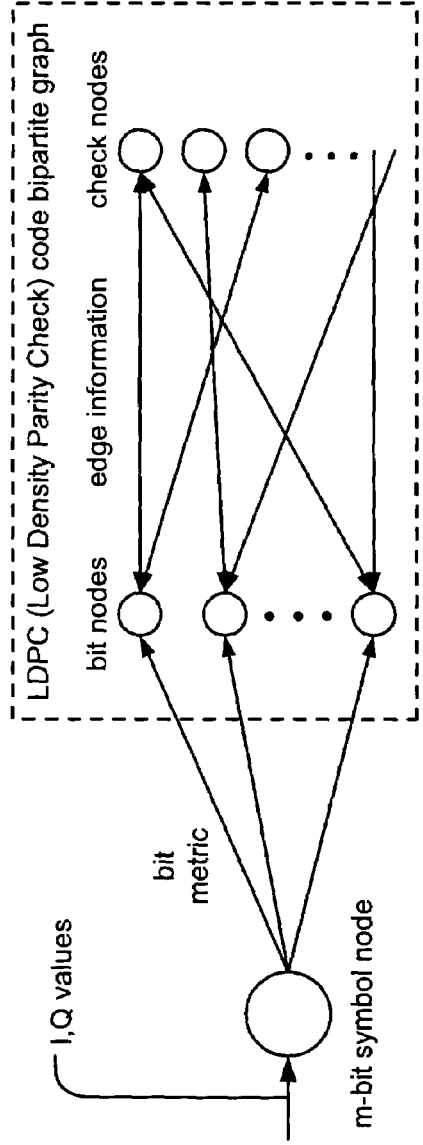
FIG. 30A is a diagram illustrating bit decoding using bit metric (shown with respect to an LDPC (Low Density Parity Check) code bipartite graph) according to the invention.

FIG. 30A is a diagram illustrating bit decoding using bit metric (shown with respect to an LDPC (Low Density Parity Check) code bipartite graph) according to the invention. Generally speaking, after receiving I, Q values of a signal at a symbol nodes, the m-bit symbol metrics are computed. Then, at the symbol nodes, the symbol metric is used to calculate the bit metric. The bit metric is then passed to the bit nodes connected to the symbol nodes. At the bit nodes, the soft messages of the bits are computed, and they are used to update the edge message sent from the check nodes with the bit metric. These edge messages are then passed to the check nodes. At the check nodes, updating of the edge messages sent from the bit nodes is performed, and these values are pass back the bit nodes.

As also described above with respect to the corresponding functionality embodiment, after all of these iterative decoding processing steps have been performed, then the best estimates/hard decisions of the bits are output based on the bit soft information. In the approach of this embodiment, the bit metric values that are calculated by the symbol node calculator functional block are fixed values and used repeatedly in updating the bit node values.

Figure 30B:
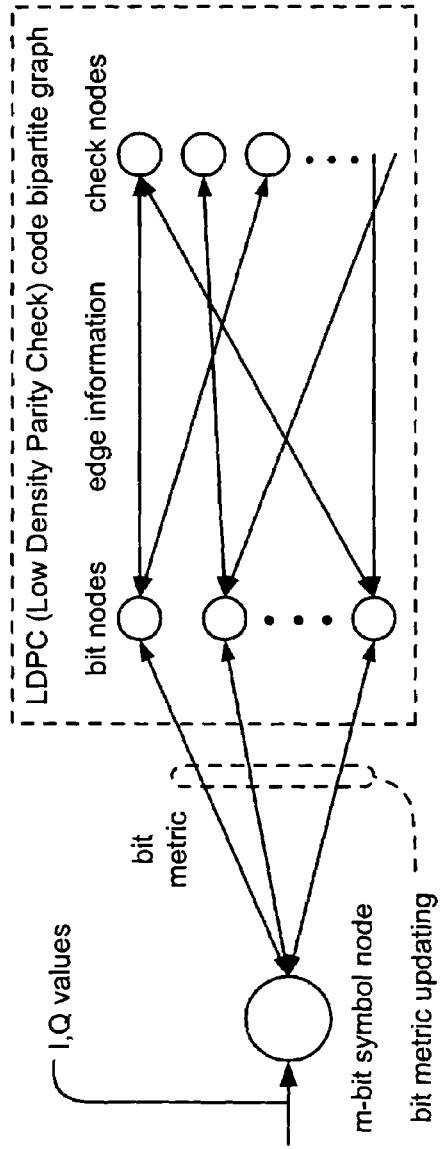
FIG. 30B is a diagram illustrating bit decoding using bit metric updating (shown with respect to an LDPC (Low Density Parity Check) code bipartite graph) according to the invention.

FIG. 30B is a diagram illustrating bit decoding using bit metric updating (shown with respect to an LDPC (Low Density Parity Check) code bipartite graph) according to the invention. With respect to this LDPC code bipartite graph that performs bit metric updating, the decoding processing may be performed as follows:

After receiving the I, Q value of the signal at the symbol nodes, the m-bit symbol metrics are computed. Then, at the symbol nodes, the symbol metrics are used to calculate the bit metrics. These values are then passed to the bit nodes connected to the symbol nodes. At the bit nodes, the edge message sent from the check nodes are updated with the bit metrics, and these edge messages are passed to the check nodes. In addition, at the same time the soft bit information is updated and passed back to the symbol nodes. At the symbol nodes, the bit metrics are updated with the soft bit information sent from the bit nodes, and these values are passed back to the variable nodes. At the check nodes, the edge information sent from the bit nodes is updated, and this information is passed back to the bit nodes.

As also described above with respect to the corresponding functionality embodiment, after all of these iterative decoding processing steps have been performed, then the best estimates/hard decisions of the bits are output based on the bit soft information. Again, it is shown in this embodiment that the bit metric values are not fixed; they are updated for use within subsequent decoding iterations. This is again in contradistinction to the embodiment described above where the bit metric values that are calculated only once and remain fixed values for all of the decoding iterations.

The LDPC decoding that is performed in accordance with the invention to include bit metric updating may also be described when considering the m parts of the bit sequence from an LDPC codeword. This may be viewed as being the m parts of the bit sequence from an LDPC codeword generated by the 3 mapping embodiment described above. The m parts of the bit sequence, divided from an LDPC codeword, may be represented as follows:

$b_{i,0} b_{i,1}, \ldots, b_{i,n-1}$ for $i=0, \ldots, m-1$.

After receiving the I,Q (In-phase, Quadrature) of the symbol, the logarithmic values of the symbol metric can be computed. As one example of how to calculate symbol metrics, specifically for an AWGN (Additive White Gaussian Noise) channel, the values of the symbol metric may be computed by determining the Euclidian distances from each of the corresponding constellation points and the I,Q value of the received symbol (appropriately scaled by the SNR (Signal to Noise Ratio)). Looking at an 8 PSK (8 Phase Shift Key) symbol received from an AWGN channel, the corresponding 8 symbol metrics may be calculated such that each of the symbol metrics in indexed according to the corresponding constellation points of the 8 PSK shaped constellation by which the 8 PSK symbol was generated.

Where $I_{rx}$ and $Q_{rx}$ are the I ,Q of the received symbol, then the symbol metrics corresponding to the constellation points of 0 (0=000 binary) and 1 (1=001 binary), may be calculated as follows:

$$S(000) = \frac{1}{2\sigma^2}[(I_{rx} - I_{coeff(000)})^2 + (Q_{rx} - Q_{coeff(000)})^2]$$

where $I_{coeff(000)}$ and $Q_{coeff(000)}$ are the values of the I, Q coefficients corresponding to the constellation point mapped according to 0 (1=000 binary).

$$S(001) = \frac{1}{2\sigma^2}[(I_{rx} - I_{coeff(001)})^2 + (Q_{rx} - Q_{coeff(001)})^2]$$

where $I_{coeff(001)}$ and $Q_{coeff(001)}$ are the values of the I,Q coefficients corresponding to the constellation point mapped according to 1 (1=001 binary). The other symbol metrics are calculated in a similar manner. Again, this is just one example of how symbol metrics may be calculated for one type of communication channel, specifically, an AWGN communication channel whose received symbol has an 8 PSK modulation.

Other types of communication channels must have their respective symbol metrics calculated appropriately. For example, a fading type communication channel must carefully the phase of the received symbols when calculating its corresponding symbol metrics. Clearly, each of the various types of communication systems must consider the appropriate operational parameters of the communication channel when calculating the symbol metrics included therein.

Oftentimes logarithmic processing is performed in LDPC decoding systems thereby simplifying the calculations (e.g., in the logarithmic domain: multiplications may be performed using addition, and division may be performed using subtraction). There are $2^m$ symbol metrics that may be represented as follows:

$$sMetric_j(x_{m-1}x_{m-2} \ldots x).$$

Moreover, this decoding functionality may be more fully understood by letting $l_{i,j}(x)$ denote the logarithm of the probability of the bit $b_{i,j}=x$, where x=0,1. The initial values for $l_{i,j}(0)$ and for $l_{i,j}(1)$ are the same.

For perhaps a clearer example illustration, the special case where x=3 is considered. After the first iteration, this values given from the LDPC decoder. Then, the bit metric for every bit is computed as follows:

$$bmetric(b_{0,j} = x) = \quad \quad (EQ\ 2)$$
$$\log\left(\sum_{y_1=0}^{1}\sum_{y_2=0}^{1} \exp[Metric_j(y_2y_1x) + l_{1,j}(y_1) + l_{2,j}(y_2)]\right)$$

$$bmetric(b_{1,j} = x) =$$
$$\log\left(\sum_{y_0=0}^{1}\sum_{y_2=0}^{1} \exp[Metric_j(y_2xy_0) + l_{0,j}(y_0) + l_{2,j}(y_2)]\right)$$

$$bmetric(b_{2,j} = x) =$$
$$\log\left(\sum_{y_0=0}^{1}\sum_{y_1=0}^{1} \exp[Metric_j(xy_1y_0) + l_{0,j}(y_0) + l_{1,j}(y_1)]\right)$$

This EQ 2 may be calculated using a variety of different approaches including min* processing or max* processing. As one example of how to implement the EQ 2, min* processing may be implemented as follows:

$$bmetric(b_{0,j} = x) =$$
$$\min^* \left\{(Metric_j(y_2y_1x) + l_{1,j}(y_1) + l_{2,j}(y_2)) \;\middle|\; \begin{array}{l} y_1 = 0, 1 \\ y_2 = 0, 1 \end{array}\right\}$$
$$bmetric(b_{1,j} = x) =$$
$$\min^* \left\{(Metric_j(y_2xy_0) + l_{0,j}(y_0) + l_{2,j}(y_2)) \;\middle|\; \begin{array}{l} y_1 = 0, 1 \\ y_2 = 0, 1 \end{array}\right\}$$
$$bmetric(b_{2,j} = x) = \min^* \left\{(Metric_j(xy_1y_0) + l_{0,j}(y_0) + l_{1,j}(y_1)) \;\middle|\; \begin{array}{l} y_1 = 0, 1 \\ y_2 = 0, 1 \end{array}\right\}$$

The min* processing, when operating on inputs A and B, may be expressed as follows:

$$\min^*(A,B)=\min(A,B)-\ln(1+e^{-|A-B|})$$

Again, this processing that is performed using the min* processing may alternatively be performed using max* processing. The max* processing, when operating on inputs A and B, may be expressed as follows:

$$\max^*(A,B)=\max(A,B)+\ln(1+e^{-|A-B|})$$

Moreover, when multiple min* operations are to be performed on multiple values (e.g., more than 2), the min* processing may be expressed as follows:

$$\min^*(x_1, \ldots ,x_N)=\min^*(\min^*(x_1, \ldots ,x_{N-1}),x_N)$$

Moreover, for more simplistic approach, including some approximation, straight-forward min or max processing may be performed that does not include the logarithmic corrections factors associated with min* and max* processing.

Using this bit metric computation, the LDPC decoding processing may be performed iteratively.

Figure 31:
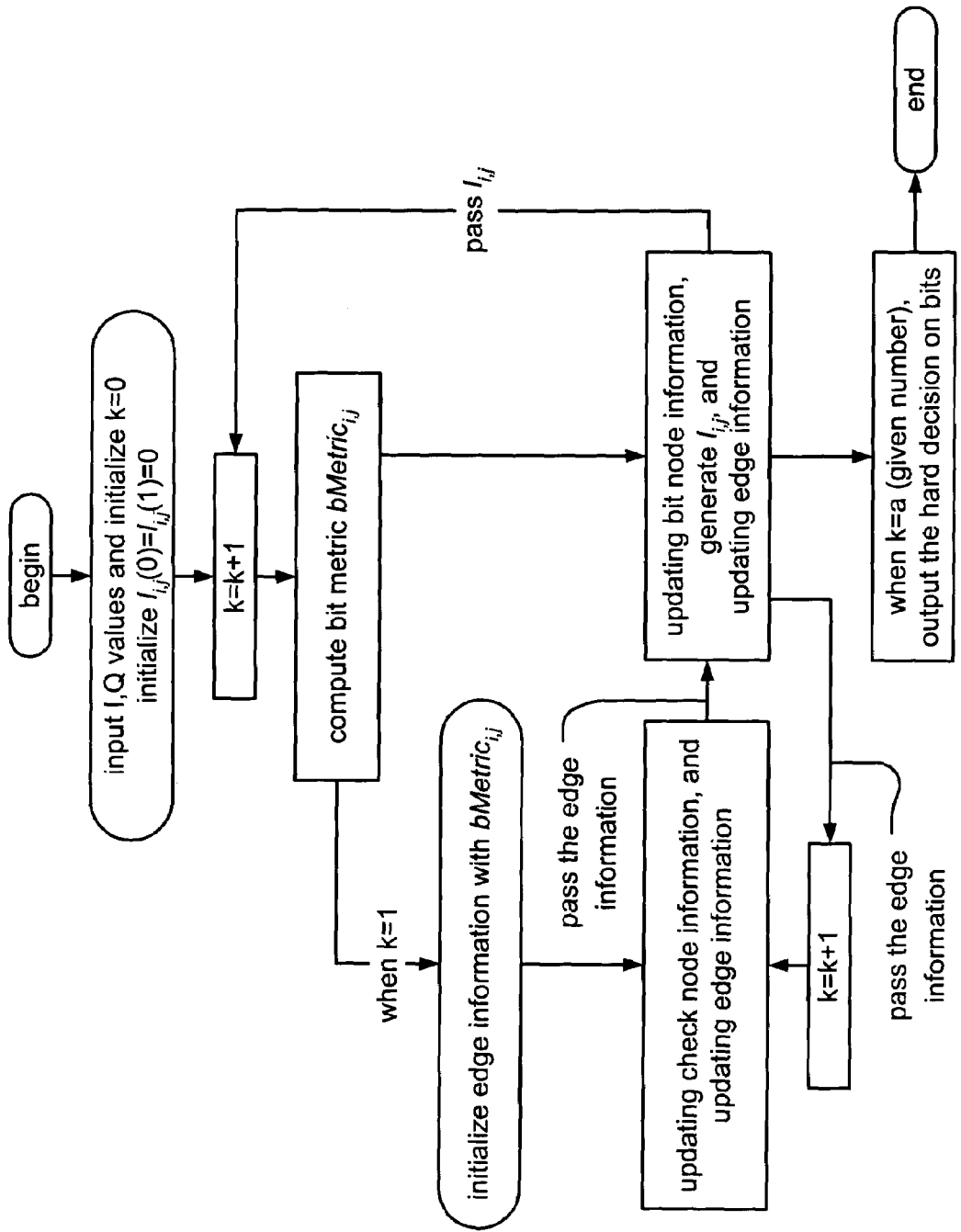
FIG. 31 is a flowchart illustrating an embodiment of decoding an LDPC (Low Density Parity Check) coded modulation signal with metric updating according to the invention.

FIG. 31 is a flowchart illustrating an embodiment of decoding an LDPC (Low Density Parity Check) coded modulation signal with metric updating according to the invention.

Initially, the I,Q (In-phase, Quadrature) values are input and initialized for the first iteration, k=1 (where k is the counter), to the values of $l_{i,j}(0)=l_{i,j}(1)=0$. As a reminder, $l_{i,j}(x)$ denotes the logarithm of the probability of the bit $b_{i,j}$=x, where x=0,1. The iterative counter is then incremented, k←k+1.

The bit metric, $bMetric_{i,j}$ is then computed. When the value of the iterative counter is 1, e.g., when k=1, then the decoding method continues by initializing the initial edge information with the bit metric, $bMetric_{i,j}$. Then, the decoding method continues by updating the check node information and updating the edge information.

The edge information is then passed, and the decoding method continues by updating the corresponding bit node information, generating the values for $l_{i,j}$ for subsequent iterations, and updating the edge information again. These calculated values for $l_{i,j}$ are then passed, and the decoding method returns back to the block where the iterative counter is incremented, $k \leftarrow k+1$. In addition, the edge information is passed and the method goes to a block where the iterative counter is incremented, $k \leftarrow k+1$, whose output is then provided to the updating the check node information, and updating the edge information block.

When the iterative counter reaches a certain number (e.g., when $k=\alpha$, where $\alpha$ is programmable, or when the iterative decoding method converges on a solution to within a tolerable degree of precision), then the decoding method outputs a hard decision based on the soft bit metric decisions that have been made.

Figure 32:
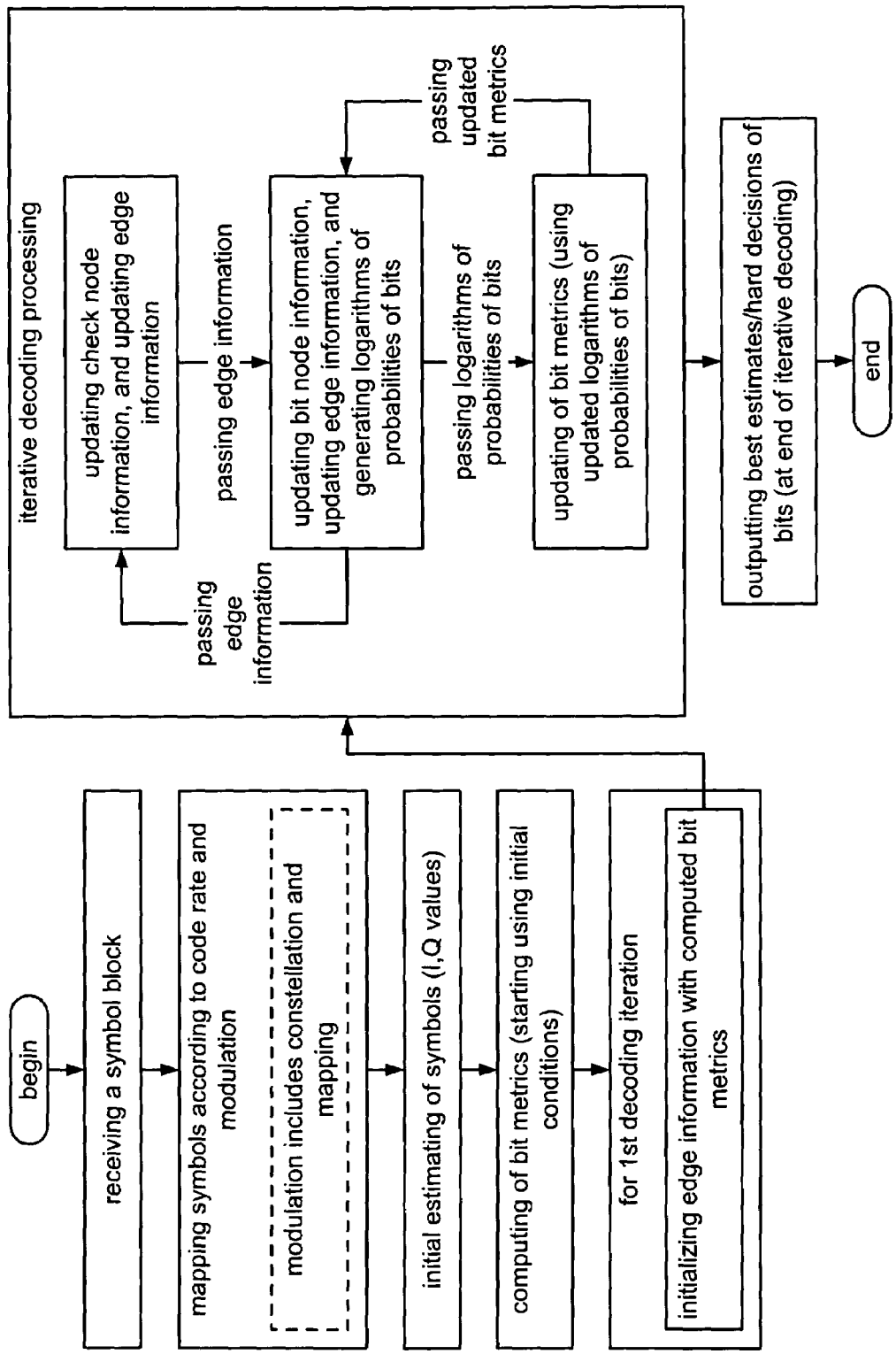
FIG. 32 is a flowchart illustrating an embodiment of a method for decoding of an LDPC coded modulation signal with update metric according to the invention.

FIG. 32 is a flowchart illustrating an embodiment of a method for decoding of an LDPC coded modulation signal with update metric according to the invention. The method begins by receiving a symbol block. This may be viewed as receiving a symbol block of a signal sequence. The method then continues to perform decoding processing of the symbol block by first mapping the symbols of the symbol block to the appropriate code rate and modulation for which the symbols of the symbol block were generated. For example, this involves employing the appropriate modulation to perform symbol mapping of the symbols of the symbol block. It is again noted that the modulation includes both a constellation and a mapping to that constellation. This ensures that each symbol of the symbol block is mapped according to the modulation that corresponds to those symbols. Also, by employing the appropriate code rate for each symbol of the symbol block, the appropriate decoding of the symbols may be performed.

In addition, it is noted that the symbol block may include symbols from an LDPC variable code rate and modulation signal. Therefore, the mapping of the symbols according to the code rate and modulation ensures that subsequent decoding processing for the individual symbols of the symbol block is performed according to the code rate and modulation that corresponds to each symbol. In some embodiments, this may be viewed as associating each of the symbols of the symbol block to its corresponding RC (Rate Control), and the RC corresponding to each symbol includes information corresponding to the code rate and modulation of that symbol.

Once the symbols of the symbol block have been mapped according the appropriate code rate and modulation, and once the symbols are mapped according to modulation (constellation and mapping), then the method continues by initial estimating the I, Q (In-phase, Quadrature) values of the symbols of the symbol block.

Using these initial I, Q values, the method continues by computing the bit metrics. For the first decoding iteration, the method continues by initializing the edge information using the initially computed bit metrics.

The method then continues by performing iterative processing. The iterative decoding processing continues by updating the check node information and updating the edge information. The edge information is then passed to continue with the iterative decoding processing. The iterative decoding processing then uses this updated edge information to continue with updating the bit node information, updating the edge information, and also generating logarithms of probabilities of bits. The iterative decoding processing continues by performing the operations of he updating the check node information and updating edge information block and the decoding bit node information, updating edge information, and generating logarithms of probabilities of bits blocks by passing the appropriately updated edge information between these blocks.

From the decoding bits, updating edge information, and generating logarithms of probabilities of bits block, the method then passes the logarithms of the probabilities of bits to a block that continues by updating the bit metrics (using updated logarithms of probabilities of bits). The now updated values of the bit metrics are then passed to the block that performs the operations of updating the bit node information, updating the edge information, and generating initial logarithms of probabilities of bits.

Once the iterations of the iterative decoding processing have been performed after a predetermined number of iterations, or after a solution has been converged upon, then the method proceeds by outputting best estimates/hard decisions of bits (at end of iterative decoding). The number of decoding iterations may be selected or adaptive, depending on how a designer wishes to implement the various decoding aspects of the invention.

Figure 33:
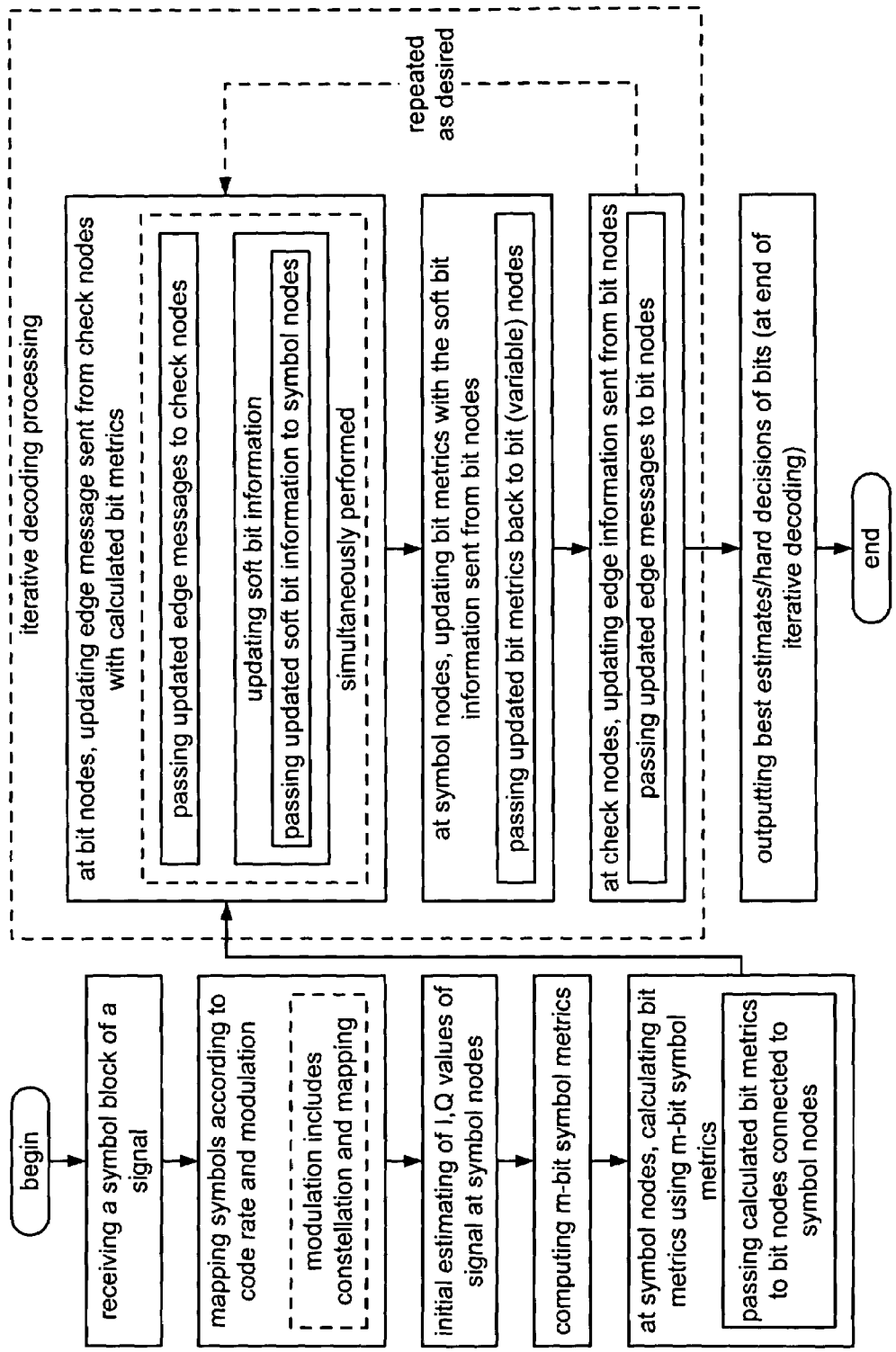
FIG. 33 is a flowchart illustrating another embodiment of a method for decoding of an LDPC coded modulation signal with update metric according to the invention.

FIG. 33 is a flowchart illustrating another embodiment of a method for decoding of an LDPC coded modulation signal with update metric according to the invention. The operational steps performed within this embodiment may be directly referenced to the LDPC code bipartite graph described above with respect to FIG. 26B.

The method begins by receiving a symbol block of a signal; this signal may be viewed as being an LDPC coded signal. The signal may be an LDPC coded modulation signal or even an LDPC variable code rate and/or modulation signal as well without departing from the scope and spirit of the invention.

The method then continues by mapping the symbols of the symbol block according to the code rates and modulations corresponding thereto. Again, each modulation that corresponds to a given symbol includes a constellation and a corresponding mapping for that constellation.

The method then continues by performing the initial estimating of I, Q values of signal at the symbol nodes. The method then continues by computing the m-bit symbol metrics at the m-bit symbol node.

Then, at the symbol nodes, the method continues by calculating the bit metrics using the m-bit symbol metrics. After these bit metrics have been calculated, then the method continues by passing the calculated bit metrics to the bit nodes that are connected to the symbol nodes.

The iterative decoding processing is now described below.

At the bit nodes, the method continues by updating the edge messages that are sent from the check nodes with the calculated bit metrics. In addition, the method also performs passing of the updated edge messages to the check nodes. Moreover, the method simultaneously performs updating of the soft bit information and passing of the updated soft bit information back to the symbol nodes.

Then, at the symbol nodes, the method then continues by updating the bit metrics with the soft bit information that is sent from bit nodes. The method also continues by passing the updated bit metrics back to the bit (e.g., variable) nodes.

Then, at the check nodes, the method continues by updating the edge information that is sent from the bit nodes. The method also performs passing of the updated edge messages to the bit nodes.

The steps of the iterative decoding processing are repeated as desired. For example, these iterative decoding operational steps may be repeated a given number of times or until after the syndromes of the LDPC code are all zero (within a sufficient degree of precision). Then, the method outputs the bit information. That is to say, as with the embodiments described above, once the iterations of the iterative decoding processing have been performed after a predetermined number of iterations, or after a solution has been converged upon, then the method proceeds by outputting best estimates/hard decisions of bits (at end of iterative decoding). The number of decoding iterations may be selected or adaptive, depending on how a designer wishes to implement the various decoding aspects of the invention.

The following 3 Figures show the improvement provided by the invention by using the update metric approach when decoding LDPC coded signals. Some of these performance graphs also show embodiments that include decoding an LDPC variable modulation signal (these embodiments employ a fixed constellation shape having variable mappings) as described herein. As with the performance diagram described above with respect to FIG. 22, these various performance diagrams are described in the context of BER (Bit Error Rate) versus $E_b/N_o$ (ratio of energy per bit $E_b$ to the Spectral Noise Density $N_o$). This term $E_b/N_o$ is the measure of SNR (Signal to Noise Ratio) for a digital communication system. When looking at these performance curves, the BER may be determined for any given $E_b/N_o$ (or SNR).

Figure 34:
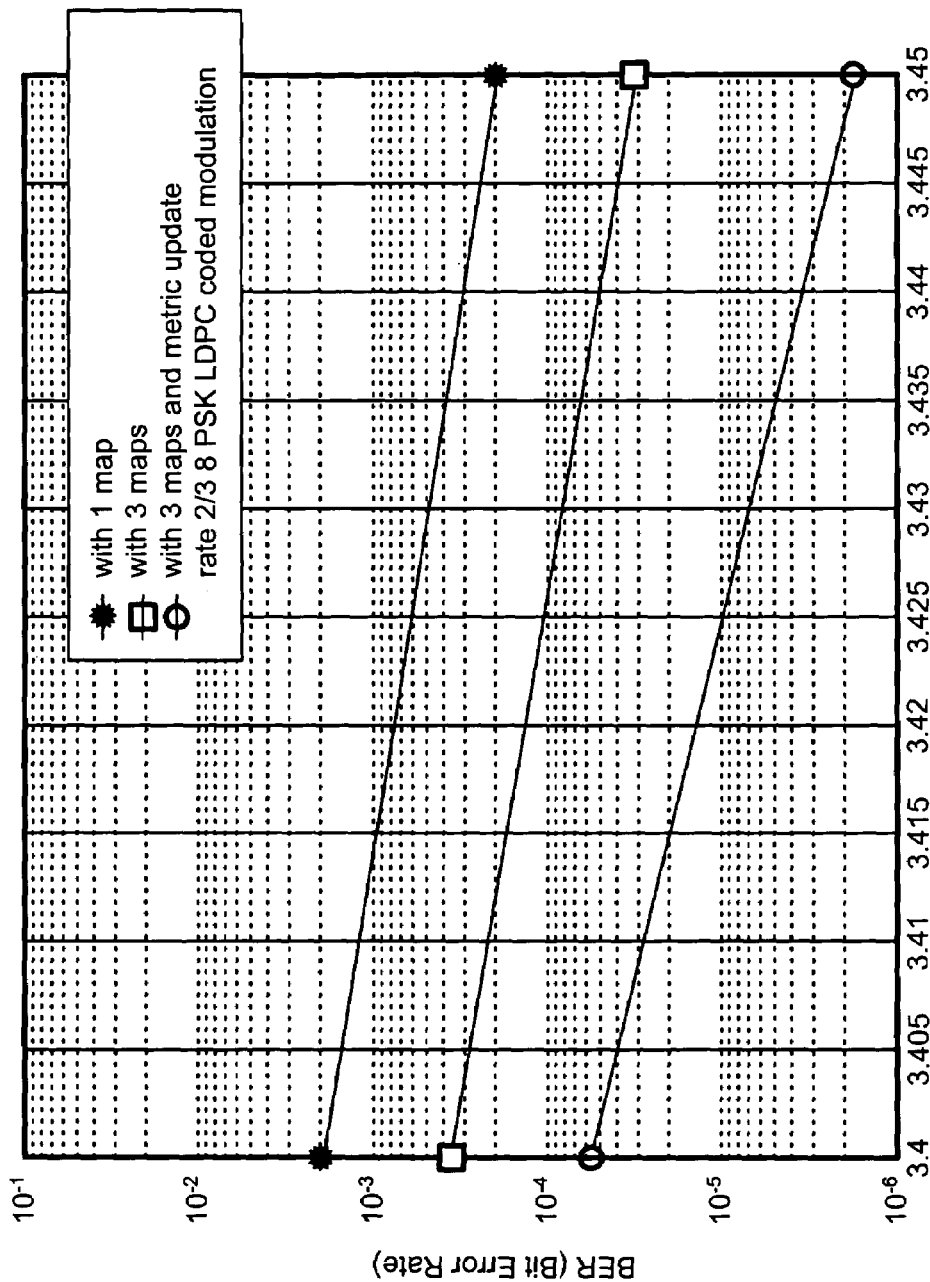
FIG. 34 is a diagram illustrating an embodiment of performance comparison of LDPC (Low Density Parity Check) coded modulation decoding processing for differently mapped signals (1 of which performs metric updating) (shown as using code C_2) according to the invention.

FIG. 34 is a diagram illustrating an embodiment of performance comparison of LDPC (Low Density Parity Check) coded modulation decoding processing for differently mapped signals (1 of which performs metric updating) (shown as using code C_2) according to the invention. This embodiment is shown for LDPC coded modulation signals that have been LDPC encoded to have a code rate of 2/3 and have been modulation encoded using 8 PSK (8 Phase Shift Key) modulation.

As can be seen within the performance diagram, for a variety of values of $E_b/N_o$ (or SNR), the BER that may be achieved when employing LDPC variable modulation signals (specifically, variable mapping signals), may be nearly an order of magnitude lower. For example, an LDPC coded modulation signal that employs a single map has a BER that varies between approximately $2\times10^{-3}$ and $2\times10^{-4}$ over the $E_b/N_o$ (or SNR) range between approximately 3.4 dB and 3.45 dB. This may be contrasted to the significantly reduced BER that may be achieved over the comparable range when employing a LDPC variable modulation signal (specifically, a variable mapping signal). For example, an LDPC coded modulation signal that employs 3 maps has a BER that varies between approximately $3.5\times10^{-4}$ and $3\times10^{-5}$ over the $E_b/N_o$ (or SNR) range between approximately 3.4 dB and 3.45 dB.

However, even improved performance may be achieved when employing LDPC variable modulation signals that are also decoded using bit metric updating in accordance with the invention. As a specific example, an LDPC coded modulation signal that employs 3 maps, and that is decoded using metric updating as described herein, has a BER that varies between approximately $5.5\times10^{-5}$ and $1.75\times10^{-6}$ over the $E_b/N_o$ (or SNR) range between approximately 3.4 dB and 3.45 dB.

Clearly, a very significant improvement in performance may be achieved using multiple maps when generating an LDPC coded modulation signal. Moreover, even greater improvement in performance may be achieved when performing metric updating during the decoding of the LDPC signal.

Figure 35:
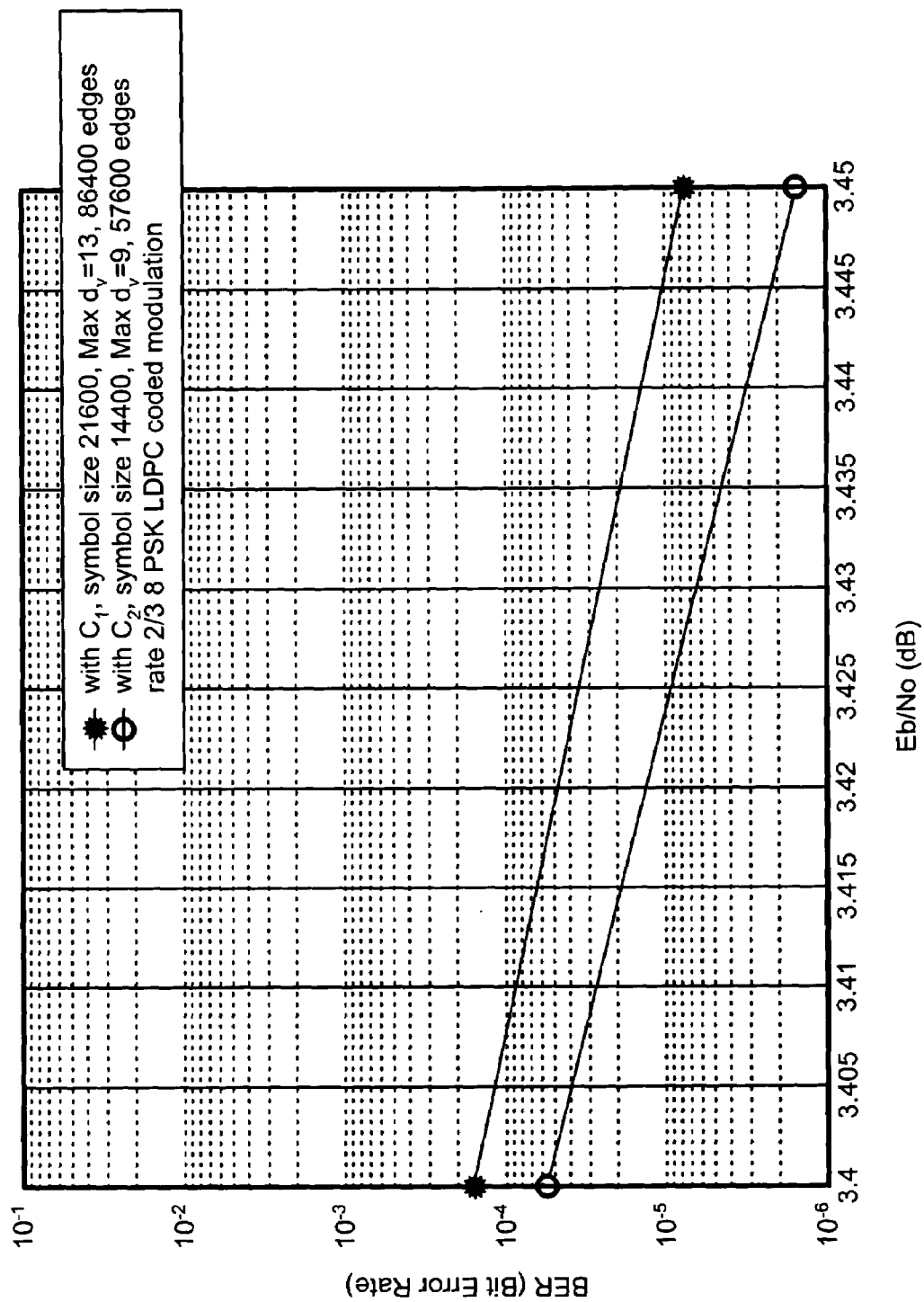
FIG. 35 is a diagram illustrating an embodiment of performance of LDPC coded modulation decoding of different symbol size (1. block with 21600 symbols, 3 bits per symbol and 2. block with 14400 symbols, 3 bits per symbol) according to the invention.

FIG. 35 is a diagram illustrating an embodiment of performance of LDPC coded modulation decoding of different symbol size (1. block with 21600 symbols, 3 bits per symbol and 2. block with 14400 symbols, 3 bits per symbol) according to the invention. Again, this embodiment is shown for LDPC coded modulation signals that have been LDPC encoded to have a code rate of 2/3 and have been modulation encoded using 8 PSK (8 Phase Shift Key) modulation.

This performance diagram shows the various codes C_1 (shown as 1. block with 21600 symbols, 3 bits per symbol) and C_2 (shown as 2. block with 14400 symbols, 3 bits per symbol). As a reminder, a parity check matrix of an LDPC code given as $H=(h_{i,j})_{M\times N}$ has $d_v$ 1's in every column of the matrix and $d_c$ 1's in every row of the matrix.

The C_1 code corresponds to a signal having symbol size of 21600 and a max $d_v=13$ with 86400 edges. The C_2 code corresponds to a signal having symbol size of 14400 and a max $d_v=9$ with 57600 edges.

This performance comparison shows empirically that the coded modulation with C_1 does in fact perform better than the code modulation with C_2, as described briefly above. The use of combining LDPC coding with modulation coding to generate LDPC variable modulation signals clearly provides for a significant improvement in performance within a communication system. In addition, when performing metric updating in accordance with the invention, an even greater improvement in performance may be achieved.

FIG. 36 is a diagram illustrating an embodiment of performance comparison of bit decoding vs. bit decoding with metric updating of LDPC (Low Density Parity Check) coded modulation signals according to the invention.

Two different decoding approaches are compared when decoding LDPC coded modulation signals. Within this comparison, the block size of the LDPC code is 14400, and the signal is a code rate 2/3 8 PSK (8 Phase Shift Key) LDPC coded modulation signal.

As some example, the worst performing performance curve corresponds to performing bit decoding only (with no bit metric updating); when operating at an $E_b/N_o$ of approximately 3.5 dB (decibels), the BER of the bit decoding only approach is approximately $2.5\times10^{-6}$.

The much better performance curve corresponds to performing bit decoding in accompany with bit metric updating; for this decoding approach, when operating at an $E_b/N_o$ of approximately 3.5 dB, the BER of the bit decoding approach (that also included metric updating) decreases significantly even to be below approximately $2\times10^{-7}$.

An improvement of over an order of magnitude of performance may be achieved when performing LDPC decoding that includes metric updating in accordance with the invention as opposed to keeping the bit metric values constant during the iterative decoding processing of an LDPC coded modulation signal.

Various embodiments have been described herein. For example, a novel LDPC decoding approach has also been shown where the bit metrics employed within the iterative decoding processing are updated for use in subsequent decoding iterations. This LDPC decoding may be applied across a wide variety of LDPC coded signals. For example, this decoding processing is operable to decode an LDPC coded modulation signal. Moreover, the decoding processing is also operable to decode an LDPC variable code rate and/or variable modulation signal whose code rate and/or modulation (including constellation and mapping) may vary as frequently as on a symbol by symbol basis. In addition, the decoding processing may operate to decode an LDPC coded signal having a common code rate and modulation for all of the symbols contained therein. Any decoding approach of an LDPC coded signal may benefit from the update bit metric aspects of the invention when performing iterative decoding processing.

It is also noted that the methods described within the preceding figures may also be performed within any of the appropriate system and/or apparatus designs (communication systems, communication receivers, communication transceivers and/or functionality described therein) that are described above without departing from the scope and spirit of the invention.

In view of the above detailed description of the invention and associated drawings, other modifications and variations will now become apparent. It should also be apparent that such other modifications and variations may be effected without departing from the spirit and scope of the invention.

What is claimed is:

1. A decoding method that performs updating of a bit metric when decoding an LDPC (Low Density Parity Check) coded signal, the method comprising:

receiving a symbol block of the LDPC coded signal wherein the symbol block includes a plurality of symbols;

mapping a symbol of the plurality of symbols according to a code rate and modulation that corresponds to the symbol wherein the modulation includes a constellation and a mapping;

making initial estimates of I,Q (In-phase, Quadrature) values of the symbol at a plurality of symbol nodes that are connected to a plurality of bit nodes within an LDPC bipartite graph that includes a plurality of edges that connect a plurality of bit nodes to a plurality of check nodes;

computing a plurality of m-bit symbol metrics that correspond to the symbol wherein the symbol has m-bits;

with respect to the plurality of symbol nodes, calculating a plurality of bit metrics that corresponds to the m-bits of the symbol using the plurality of m-bit symbol metrics;

passing the plurality of bit metrics from the plurality of symbol nodes to the plurality of bit nodes connected thereto;

performing iterative decoding processing that includes:
with respect to the plurality of bit nodes:
updating edge messages received from the plurality of check nodes with the plurality of bit metrics;
simultaneously updating soft bit information corresponding to the m-bits of the symbol using the updated edge messages and passing the updated edge messages from the plurality of bit nodes to the plurality of check nodes;
with respect to the plurality of symbol nodes:
updating the plurality of bit metrics with the soft bit information sent from the plurality of bit nodes;
passing the updated plurality of bit metrics from the plurality of symbol nodes to the plurality of bit nodes;
with respect to the plurality of check nodes:
updating the edge information sent from the plurality of bit nodes to the plurality of check nodes;
passing the updated edge messages from the plurality of check nodes to the plurality of bit nodes; and
making hard decisions of the m-bits of the symbol using the latest updated soft bit information corresponding to the m-bits of the symbol.

2. The method of claim 1, wherein:
the LDPC coded signal is an LDPC variable modulation signal that includes a first LDPC coded modulation symbol and a second LDPC coded modulation symbol;
the first LDPC coded modulation symbol is modulation encoded according to a first modulation that includes a first constellation and a corresponding first mapping; and
the second LDPC coded modulation symbol is modulation encoded according to a second modulation that includes a second constellation and a corresponding second mapping.

3. The method of claim 2, wherein:
the first constellation is an 8 PSK (8 Phase Shift Key) shaped constellation;
the second constellation is the 8 PSK shaped constellation;
the first modulation includes the 8 PSK shaped constellation whose constellation points are mapped according to the corresponding first mapping; and
the second modulation includes the 8 PSK shaped constellation whose constellation points are mapped according to the corresponding second mapping.

4. The method of claim 1, wherein:
the LDPC coded signal is an LDPC variable code rate signal that includes a first LDPC coded symbol and a second LDPC coded symbol;
the first LDPC coded symbol is LDPC encoded according to a first code rate; and
the second LDPC coded symbol is LDPC encoded according to a second code rate.

5. The method of claim 1, wherein:
the method is performed within a decoder;
the decoder is implemented within a communication device; and
the communication device is implemented within at least one of a satellite communication system, an HDTV (High Definition Television) communication system, a cellular communication system, a microwave communication system, a point-to-point communication system, a uni-directional communication system, a bi-directional communication system, a one to many communication system, a fiber-optic communication system, a WLAN (Wireless Local Area Network) communication system, and a DSL (Digital Subscriber Line) communication system.

6. A decoding method that performs updating of a bit metric when decoding an LDPC (Low Density Parity Check) coded signal, the method comprising:

inputting I,Q (In-phase, Quadrature) values for a symbol of the LDPC coded signal;

initializing probabilities of bits of the symbol of the LDPC coded signal;

computing a first estimate of the bit metrics corresponding to the bits of the symbol of the LDPC coded signal;

computing a first estimate of edge information with the computed first estimate of the bit metrics wherein the edge information corresponds to a plurality of edges that communicatively couple a plurality of bit nodes to a plurality of check nodes within an LDPC bipartite graph that corresponds to an LDPC code;

updating check node information that corresponds to the plurality of check nodes using the first estimate of edge information;

updating the first estimate of edge information, using the updated check node information, thereby generating a second estimate of edge information;

updating bit node information that corresponds to the plurality of bit nodes using the second estimate of edge information;

updating the second estimate of edge information, using the updated bit node information, thereby generating a third estimate of edge information;

calculating a first soft estimate of the bits of the symbol of the LDPC coded signal using the first estimate of the bit metrics and the third estimate of edge information;

updating the third estimate of edge information using the first soft estimate of the bits of the symbol of the LDPC coded signal;

calculating probabilities of bits of the symbol of the LDPC coded signal using the first soft estimate of the bits of the symbol of the LDPC coded signal;

computing a second estimate of the bit metrics corresponding to the bits of the symbol of the LDPC coded signal using the probabilities of bits of the symbol of the LDPC coded signal;

calculating a second soft estimate of the bits of the symbol of the LDPC coded signal using the second estimate of the bit metrics; and making hard decisions of the bits of the symbol of the LDPC coded signal using the second soft estimate of the bits of the symbol of the LDPC coded signal.

7. The method of claim 6, wherein:
the LDPC coded signal is an LDPC variable modulation signal that includes a first LDPC coded modulation symbol and a second LDPC coded modulation symbol;
the first LDPC coded modulation symbol is modulation encoded according to a first modulation that includes a first constellation and a corresponding first mapping; and
the second LDPC coded modulation symbol is modulation encoded according to a second modulation that includes a second constellation and a corresponding second mapping.

8. The method of claim 7, wherein:
the first constellation is an 8 PSK (8 Phase Shift Key) shaped constellation;
the second constellation is the 8 PSK shaped constellation;
the first modulation includes the 8 PSK shaped constellation whose constellation points are mapped according to the corresponding first mapping; and
the second modulation includes the 8 PSK shaped constellation whose constellation points are mapped according to the corresponding second mapping.

9. The method of claim 6, wherein:
the LDPC coded signal is an LDPC variable code rate signal that includes a first LDPC coded symbol and a second LDPC coded symbol;
the first LDPC coded symbol is LDPC encoded according to a first code rate; and
the second LDPC coded symbol is LDPC encoded according to a second code rate.

10. The method of claim 6, wherein:
the method is performed within a decoder;
the decoder is implemented within a communication device; and the communication device is implemented within at least one of a satellite communication system, an HDTV (High Definition Television) communication system, a cellular communication system, a microwave communication system, a point-to-point communication system, a uni-directional communication system, a bi-directional communication system, a one to many communication system, a fiber-optic communication system, a WLAN (Wireless Local Area Network) communication system, and a DSL (Digital Subscriber Line) communication system.

11. A decoder that performs updating of a bit metric when decoding an LDPC (Low Density Parity Check) coded signal, the decoder comprising:
an m-bit symbol metric computer functional block that calculates a plurality of m-bit symbol metrics that correspond to a symbol of the LDPC coded signal wherein the symbol has m-bits;
a symbol node calculator functional block that calculates a plurality of bit metrics using the plurality of m-bit symbol metrics;
a bit node calculator functional block that computes soft messages corresponding to the m-bits of the symbol using the plurality of bit metrics;
a check node operator functional block that provides a plurality of edge messages to the bit node calculator functional block;
wherein the plurality of edge messages corresponds to a plurality of edges that communicatively couple a plurality of bit nodes to a plurality of check nodes within an LDPC bipartite graph that corresponds to an LDPC code by which the LDPC coded signal is generated;
wherein the bit node calculator functional block updates the plurality of edge messages provided from the check node operator functional block using the plurality of bit metrics calculated by the symbol node calculator functional block;
wherein the bit node calculator functional block provides the updated plurality of edge messages to the check node operator functional block while the bit node calculator functional block updates the soft messages corresponding to the m-bits of the symbol using the updated plurality of edge messages;
wherein the symbol node calculator functional block updates the plurality of bit metrics using the updated soft messages corresponding to the m-bits of the symbol; and
wherein the bit node calculator functional block and the check node operator functional block operate cooperatively to perform iterative decoding, by employing updated versions of the plurality of bit metrics, and output best estimates of the m-bits of the symbol of the LDPC coded signal using latest updated soft messages corresponding to the m-bits of the symbol of the LDPC coded signal.

12. The decoder of claim 11, wherein:
the LDPC coded signal is an LDPC variable modulation signal that includes a first LDPC coded modulation symbol and a second LDPC coded modulation symbol;
the first LDPC coded modulation symbol is modulation encoded according to a first modulation that includes a first constellation and a corresponding first mapping; and
the second LDPC coded modulation symbol is modulation encoded according to a second modulation that includes a second constellation and a corresponding second mapping.

13. The decoder of claim 11, wherein:
the first constellation is an 8 PSK (8 Phase Shift Key) shaped constellation;
the second constellation is the 8 PSK shaped constellation;
the first modulation includes the 8 PSK shaped constellation whose constellation points are mapped according to the corresponding first mapping; and
the second modulation includes the 8 PSK shaped constellation whose constellation points are mapped according to the corresponding second mapping.

14. The decoder of claim 11, wherein:
the LDPC coded signal is an LDPC variable code rate signal that includes a first LDPC coded symbol and a second LDPC coded symbol;
the first LDPC coded symbol is LDPC encoded according to a first code rate; and
the second LDPC coded symbol is LDPC encoded according to a second code rate.

15. The decoder of claim 11, wherein:
the decoder is implemented within a communication device; and
the communication device is implemented within at least one of a satellite communication system, an HDTV (High Definition Television) communication system, a cellular communication system, a microwave communication system, a point-to-point communication system, a uni-directional communication system, a bi-directional communication system, a one to many communication system, a fiber-optic communication system, a WLAN (Wireless Local Area Network) communication system, and a DSL (Digital Subscriber Line) communication system.

16. A decoder that performs updating of a bit metric when decoding an LDPC (Low Density Parity Check) coded signal, the decoder comprising:
a symbol node calculator functional block that calculates a plurality of bit metrics using a plurality of m-bit symbol metrics that correspond to a symbol of the LDPC coded signal wherein the symbol has m-bits;
a bit node calculator functional block that computes soft messages corresponding to the m-bits of the symbol using the plurality of bit metrics;
a check node operator functional block that provides a plurality of edge messages to the bit node calculator functional block;
wherein the plurality of edge messages corresponds to a plurality of edges that communicatively couple a plurality of bit nodes to a plurality of check nodes within an LDPC bipartite graph that corresponds to an LDPC code by which the LDPC coded signal is generated;
wherein the bit node calculator functional block updates the plurality of edge messages provided from the check node operator functional block using the plurality of bit metrics calculated by the symbol node calculator functional block;
wherein the bit node calculator functional block provides the updated plurality of edge messages to the check node operator functional block while the bit node calculator functional block updates the soft messages corresponding to the m-bits of the symbol using the updated plurality of edge messages;
wherein the symbol node calculator functional block updates the plurality of bit metrics using the updated soft messages corresponding to the m-bits of the symbol; and
wherein the bit node calculator functional block and the check node operator functional block operate cooperatively to perform iterative decoding, by employing updated versions of the plurality of bit metrics, and output best estimates of the m-bits of the symbol of the LDPC coded signal using latest updated soft messages corresponding to the m-bits of the symbol of the LDPC coded signal.

17. The decoder of claim 16, further comprising:
a m-bit symbol metric computer functional block that calculates the plurality of m-bit symbol metrics that correspond to the symbol of the LDPC coded signal.

18. The decoder of claim 16, wherein:
the LDPC coded signal is an LDPC variable modulation signal that includes a first LDPC coded modulation symbol and a second LDPC coded modulation symbol;
the first LDPC coded modulation symbol is modulation encoded according to a first modulation that includes a first constellation and a corresponding first mapping; and
the second LDPC coded modulation symbol is modulation encoded according to a second modulation that includes a second constellation and a corresponding second mapping.

19. The decoder of claim 16, wherein:
the first constellation is an 8 PSK (8 Phase Shift Key) shaped constellation;
the second constellation is the 8 PSK shaped constellation;
the first modulation includes the 8 PSK shaped constellation whose constellation points are mapped according to the corresponding first mapping; and
the second modulation includes the 8 PSK shaped constellation whose constellation points are mapped according to the corresponding second mapping.

20. The decoder of claim 16, wherein:
the LDPC coded signal is an LDPC variable code rate signal that includes a first LDPC coded symbol and a second LDPC coded symbol;
the first LDPC coded symbol is LDPC encoded according to a first code rate; and
the second LDPC coded symbol is LDPC encoded according to a second code rate.

21. The decoder of claim 16, wherein:
the decoder is implemented within a communication device; and
the communication device is implemented within at least one of a satellite communication system, an HDTV (High Definition Television) communication system, a cellular communication system, a microwave communication system, a point-to-point communication system, a uni-directional communication system, a bi-directional communication system, a one to many communication system, a fiber-optic communication system, a WLAN (Wireless Local Area Network) communication system, and a DSL (Digital Subscriber Line) communication system.

22. A decoder that performs updating of a bit metric when decoding an LDPC (Low Density Parity Check) coded signal, the decoder comprising:
a symbol node calculator functional block that calculates a plurality of bit metrics using a plurality of m-bit symbol metrics that corresponds to a symbol of the LDPC coded signal wherein the symbol has m-bits;
a bit node calculator functional block that computes soft messages corresponding to the m-bits of the symbol using the plurality of bit metrics;

a check node operator functional block that provides a plurality of edge messages to the bit node calculator functional block;

wherein the plurality of edge messages corresponds to a plurality of edges that communicatively couple a plurality of bit nodes to a plurality of check nodes within an LDPC bipartite graph that corresponds to an LDPC code by which the LDPC coded signal is generated;

wherein the bit node calculator functional block updates the plurality of edge messages provided from the check node operator functional block using the plurality of bit metrics calculated by the symbol node calculator functional block;

wherein the bit node calculator functional block provides the updated plurality of edge messages to the check node operator functional block while the bit node calculator functional block updates the soft messages corresponding to the m-bits of the symbol using the updated plurality of edge messages;

wherein the symbol node calculator functional block updates the plurality of bit metrics using the updated soft messages corresponding to the m-bits of the symbol;

wherein the bit node calculator functional block and the check node operator functional block operate cooperatively to perform iterative decoding, by employing updated versions of the plurality of bit metrics, and output best estimates of the m-bits of the symbol of the LDPC coded signal using latest updated soft messages corresponding to the m-bits of the symbol of the LDPC coded signal;

wherein the LDPC coded signal is an LDPC variable modulation signal that includes a first LDPC coded modulation symbol and a second LDPC coded modulation symbol;

wherein the first LDPC coded modulation symbol is modulation encoded according to a first modulation that includes a first constellation and a corresponding first mapping; and wherein the second LDPC coded modulation symbol is modulation encoded according to a second modulation that includes a second constellation and a corresponding second mapping.

23. The decoder of claim 22, further comprising:
an m-bit symbol metric computer functional block that calculates the plurality of m-bit symbol metrics that correspond to the symbol of the LDPC coded signal.

24. The decoder of claim 22, wherein:
the first constellation is an 8 PSK(8 Phase Shift Key) shaped constellation;
the second constellation is the 8 PSK shaped constellation;
the first modulation includes the 8 PSK shaped constellation whose constellation points are mapped according to the corresponding first mapping; and
the second modulation includes the 8 PSK shaped constellation whose constellation points are mapped according to the corresponding second mapping.

25. The decoder of claim 22, wherein:
the LDPC coded signal is also an LDPC variable code rate signal;
the first LDPC coded modulation symbol is LDPC encoded according to a first code rate; and
the second LDPC coded modulation symbol is LDPC encoded according to a second code rate.

26. The decoder of claim 22, wherein:
the decoder is implemented within a communication device; and
the communication device is implemented within at least one of a satellite communication system, an HDTV (High Definition Television) communication system, a cellular communication system, a microwave communication system, a point-to-point communication system, a uni-directional communication system, a bi-directional communication system, a one to many communication system, a fiber-optic communication system, a WLAN (Wireless Local Area Network) communication system, and a DSL (Digital Subscriber Line) communication system.

27. A decoder that performs updating of a bit metric when decoding an LDPC (Low Density Parity Check) coded signal, the decoder comprising:
a symbol node calculator functional block that calculates a plurality of bit metrics using a plurality of m-bit symbol metrics that correspond to a symbol of the LDPC coded signal wherein the symbol has m-bits;
a bit node calculator functional block that computes soft messages corresponding to the m-bits of the symbol using the plurality of bit metrics;
a check node operator functional block that provides a plurality of edge messages to the bit node calculator functional block;
wherein the plurality of edge messages corresponds to a plurality of edges that communicatively couple a plurality of bit nodes to a plurality of check nodes within an LDPC bipartite graph that corresponds to an LDPC code by which the LDPC coded signal is generated;
wherein the bit node calculator functional block updates the plurality of edge messages provided from the check node operator functional block using the plurality of bit metrics calculated by the symbol node calculator functional block;
wherein the bit node calculator functional block provides the updated plurality of edge messages to the check node operator functional block while the bit node calculator functional block updates the soft messages corresponding to the m-bits of the symbol using the updated plurality of edge messages;
wherein the symbol node calculator functional block updates the plurality of bit metrics using the updated soft messages corresponding to the m-bits of the symbol;
wherein the bit node calculator functional block and the check node operator functional block operate cooperatively to perform iterative decoding, by employing updated versions of the plurality of bit metrics, and output best estimates of the m-bits of the symbol of the LDPC coded signal using latest updated soft messages corresponding to the m-bits of the symbol of the LDPC coded signal;
wherein the LDPC coded signal is an LDPC variable code rate signal that includes a first LDPC coded symbol and a second LDPC coded symbol;
wherein the first LDPC coded symbol is LDPC encoded according to a first code rate; and
wherein the second LDPC coded symbol is LDPC encoded according to a second code rate.

28. The decoder of claim 27, further comprising:
an m-bit symbol metric computer functional block that calculates the plurality of m-bit symbol metrics that correspond to the symbol of the LDPC coded signal.

29. The decoder of claim 27, wherein:

the LDPC coded signal is also an LDPC variable modulation signal;

the first LDPC coded symbol is a first LDPC coded modulation symbol;

the second LDPC coded symbol is a second LDPC coded modulation symbol;

the first LDPC coded modulation symbol is modulation encoded according to a first modulation that includes a first constellation and a corresponding first mapping; and the second LDPC coded modulation symbol is modulation encoded according to a second modulation that includes a second constellation and a corresponding second mapping.

30. The decoder of claim 29, wherein:

the first constellation is an 8 PSK (8 Phase Shift Key) shaped constellation;

the second constellation is the 8 PSK shaped constellation;

the first modulation includes the 8 PSK shaped constellation whose constellation points are mapped according to the corresponding first mapping; and the second modulation includes the 8 PSK shaped constellation whose constellation points are mapped according to the corresponding second mapping.

31. The decoder of claim 27, wherein:

the decoder is implemented within a communication device; and the communication device is implemented within at least one of a satellite communication system, an HDTV (High Definition Television) communication system, a cellular communication system, a microwave communication system, a point-to-point communication system, a uni-directional communication system, a bi-directional communication system, a one to many communication system, a fiber-optic communication system, a WLAN (Wireless Local Area Network) communication system, and a DSL (Digital Subscriber Line) communication system.

* * * * *

UNITED STATES PATENT AND TRADEMARK OFFICE
CERTIFICATE OF CORRECTION

| | |
|---|---|
| PATENT NO. | : 7,216,283 B2 |
| APPLICATION NO. | : 10/669177 |
| DATED | : May 8, 2007 |
| INVENTOR(S) | : Ba-Zhong Shen et al. |

Page 1 of 1

It is certified that error appears in the above-identified patent and that said Letters Patent is hereby corrected as shown below:

Column 1, line 17: replace "now abandoned" with --now expired--

Column 1, line 28: replace "now abandoned" with --now expired--

Signed and Sealed this

Eighth Day of July, 2008

JON W. DUDAS
*Director of the United States Patent and Trademark Office*